US011889746B2

(12) United States Patent
Lim et al.

(10) Patent No.: US 11,889,746 B2
(45) Date of Patent: Jan. 30, 2024

(54) POLYMER, COATING COMPOSITION COMPRISING SAME, AND ORGANIC LIGHT EMITTING DEVICE USING SAME

(71) Applicant: LG Chem, Ltd., Seoul (KR)

(72) Inventors: Byeong Yun Lim, Daejeon (KR); Jaesoon Bae, Daejeon (KR); Jaechol Lee, Daejeon (KR); Yebyeol Kim, Daejeon (KR); Beomgoo Kang, Daejeon (KR)

(73) Assignee: LG Chem, Ltd.

( * ) Notice: Subject to any disclaimer, the term of this patent is extended or adjusted under 35 U.S.C. 154(b) by 158 days.

(21) Appl. No.: 17/613,300

(22) PCT Filed: Jun. 11, 2020

(86) PCT No.: PCT/KR2020/007582
§ 371 (c)(1),
(2) Date: Nov. 22, 2021

(87) PCT Pub. No.: WO2020/262855
PCT Pub. Date: Dec. 30, 2020

(65) Prior Publication Data
US 2022/0238808 A1    Jul. 28, 2022

(30) Foreign Application Priority Data
Jun. 28, 2019 (KR) .................. 10-2019-0077757

(51) Int. Cl.
*H10K 85/10* (2023.01)
*C08F 212/32* (2006.01)
(Continued)

(52) U.S. Cl.
CPC .......... *H10K 85/111* (2023.02); *C08F 212/32* (2013.01); *C09D 125/18* (2013.01);
(Continued)

(58) Field of Classification Search
CPC .... H10K 85/111; H10K 85/151; H10K 50/17; H10K 50/15; C08F 212/32;
(Continued)

(56) References Cited

U.S. PATENT DOCUMENTS 10,308,735 B2    6/2019  Tsuji et al.
2003/0164678 A1  9/2003  Shirota et al.
(Continued)

FOREIGN PATENT DOCUMENTS

CN    109328402 A    2/2019
JP    2004059743 A   2/2004
(Continued)

OTHER PUBLICATIONS

Cho, N. et al., "Novel organic sensitizers containing a bulky spirobifluorene unit for solar cell", Tetrahedron, May 18, 2009, pp. 6236-6243, vol. 65, No. 31, Elsevier Sience Publishers, Amsterdam, NL. XP002634165.
(Continued)

*Primary Examiner* — Shane Fang
(74) *Attorney, Agent, or Firm* — Lerner David LLP

(57) ABSTRACT

The present specification relates to a polymer including: a unit of the following Formula 1; and a unit of the following Formula 2, a coating composition including the same, and an organic light emitting device formed by using the same:
(Continued)

(52) U.S. Cl.
CPC ............ *H10K 85/151* (2023.02); *H10K 50/15* (2023.02); *H10K 50/17* (2023.02)

(58) Field of Classification Search
CPC .... C09D 125/18; C09D 165/00; C08G 61/12; C08G 2261/12; C08G 2261/1412; C08G 2261/1424; C08G 2261/148; C08G 2261/195; C08G 2261/3162; C08G 2261/76; C08G 2261/95; C08L 79/02; H01L 51/0039; H01L 51/0043; H01L 51/5056; H01L 51/5072; H01L 51/5088; H01L 51/5092; H01L 51/56
See application file for complete search history.

(56) References Cited

U.S. PATENT DOCUMENTS

| | | |
|---|---|---|
| 2006/0234059 A1 | 10/2006 | Cella et al. |
| 2007/0155928 A1 | 7/2007 | Koyama et al. |
| 2012/0313513 A1 | 12/2012 | Tanaka et al. |
| 2016/0181535 A1 | 6/2016 | Tsuji et al. |
| 2016/0225998 A1 | 8/2016 | Kato et al. |
| 2018/0145261 A1 | 5/2018 | Ha et al. |
| 2018/0212180 A1 | 7/2018 | Grigg et al. |
| 2019/0334106 A1 | 10/2019 | Sokolov et al. |
| 2020/0052220 A1 | 2/2020 | Lee et al. |

FOREIGN PATENT DOCUMENTS

| | | |
|---|---|---|
| KR | 20060121846 A | 11/2006 |
| KR | 20080005366 A | 1/2008 |
| KR | 20130008562 A | 1/2013 |
| KR | 20160074382 A | 6/2016 |
| KR | 20160093531 A | 8/2016 |
| KR | 20190020072 A | 2/2019 |
| TW | 201920103 A | 6/2019 |
| WO | 2017031622 A1 | 3/2017 |

OTHER PUBLICATIONS

Extended European Search Report including Written Opinion for Application No. 20831199.3 dated Jun. 23, 2022, pp. 1-6.
Search Report dated Apr. 1, 2022 from the Office Action for Taiwanese Application No. 109120535 dated Apr. 11, 2022, 1 page. [See p. 1, categorizing the cited references].
International Search Report for PCTKR2020007582 dated Sep. 23, 2020, 3 pgs.
Park, J et al., "Facile Photo-Crosslinking of Azide-Containing Hole Transporting Polymers for Highly Effi cient, Solution Processed, Multilayer Organic Light Emitting Devices", "Advanced Functional Materials Journal", Oct. 2014, pp. 7588-7596, vol. 24, WILEY-VCH Verlag Gmbh & Co., Weinheim, Germany.

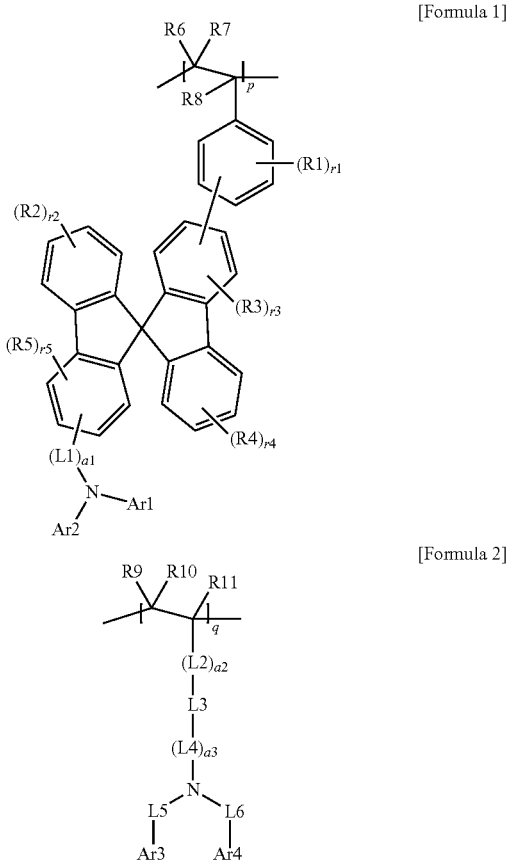

[Formula 1]

[Formula 2]

wherein L1 to L6, a1 to a3, Ar1 to Ar4, R1 to R11, r1 to r5, p, and q are described herein.

17 Claims, 5 Drawing Sheets

(51) Int. Cl.
*C09D 125/18* (2006.01)
*H10K 50/15* (2023.01)
*H10K 50/17* (2023.01)

[FIG. 1]
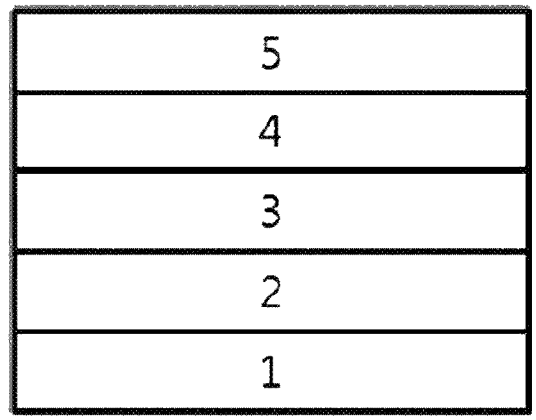
[FIG. 2]
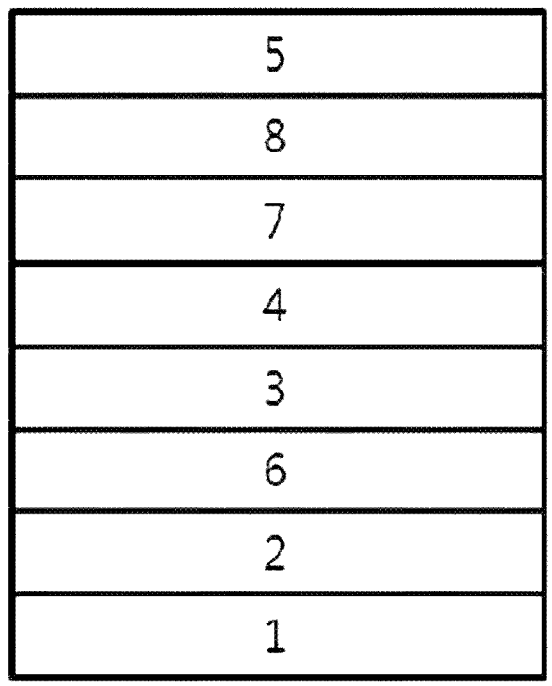

[FIG. 3]
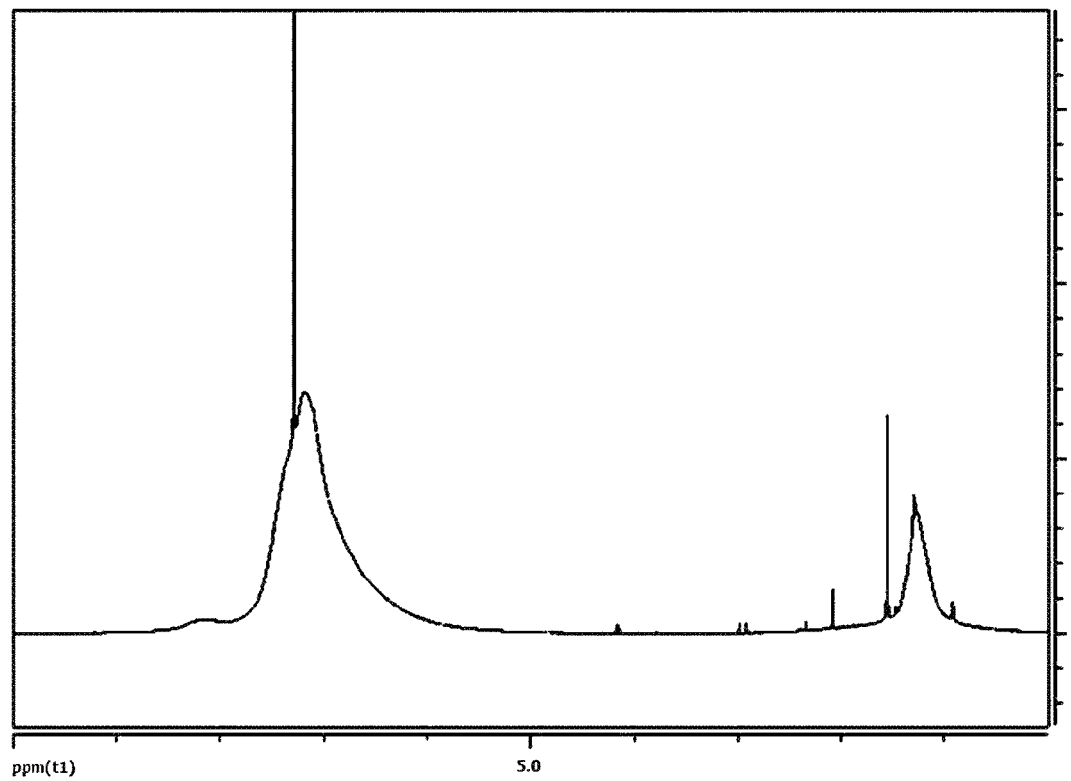
[FIG. 4]
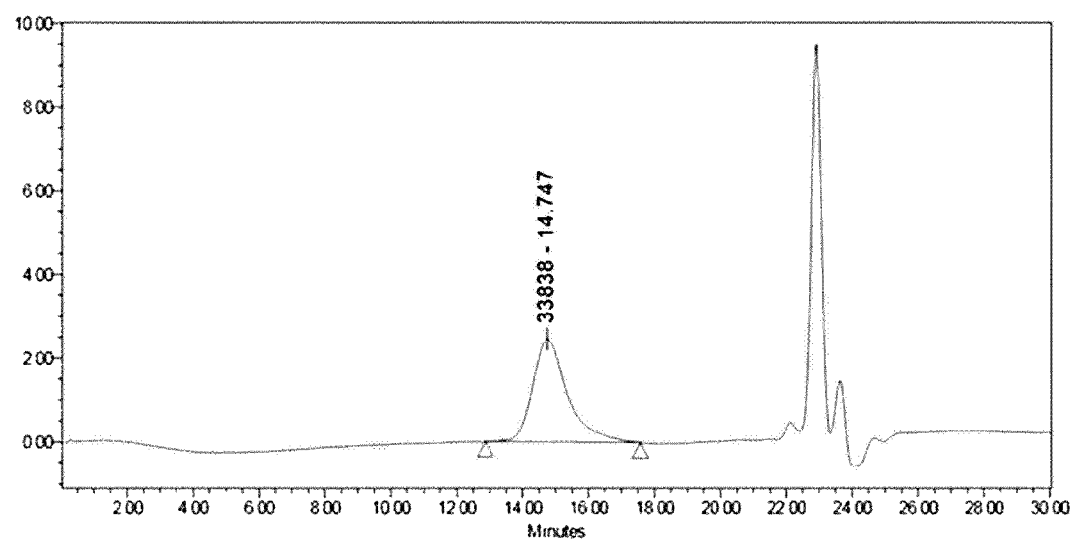

[FIG. 5]
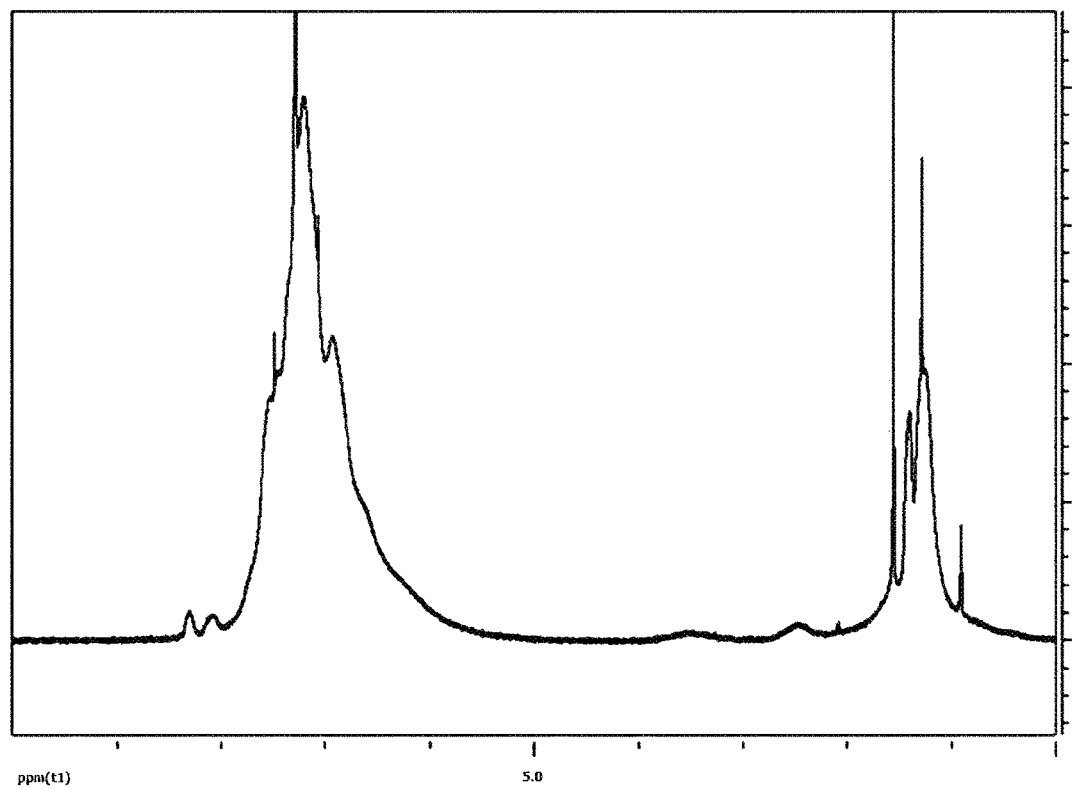
[FIG. 6]
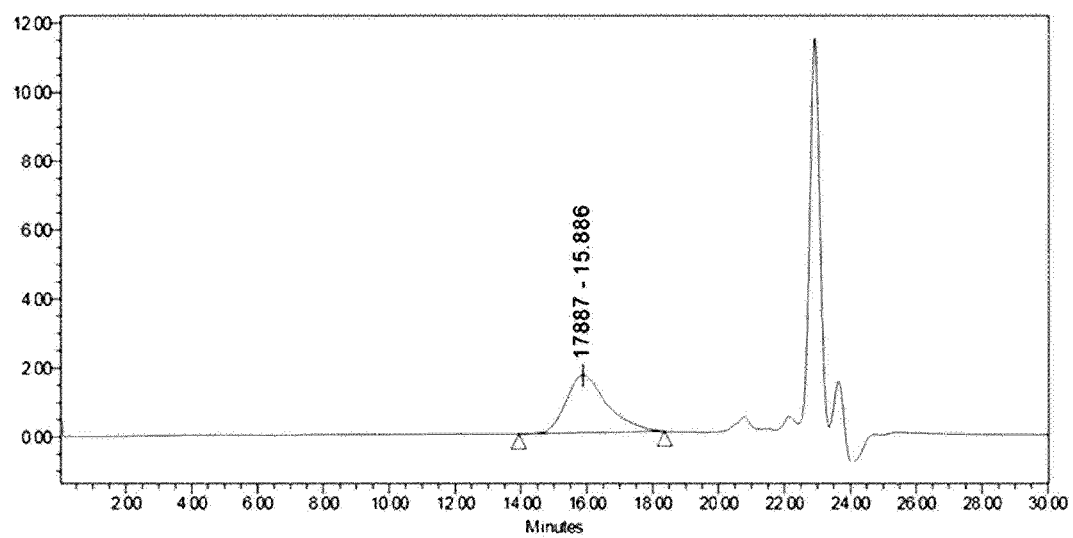

[FIG. 7]
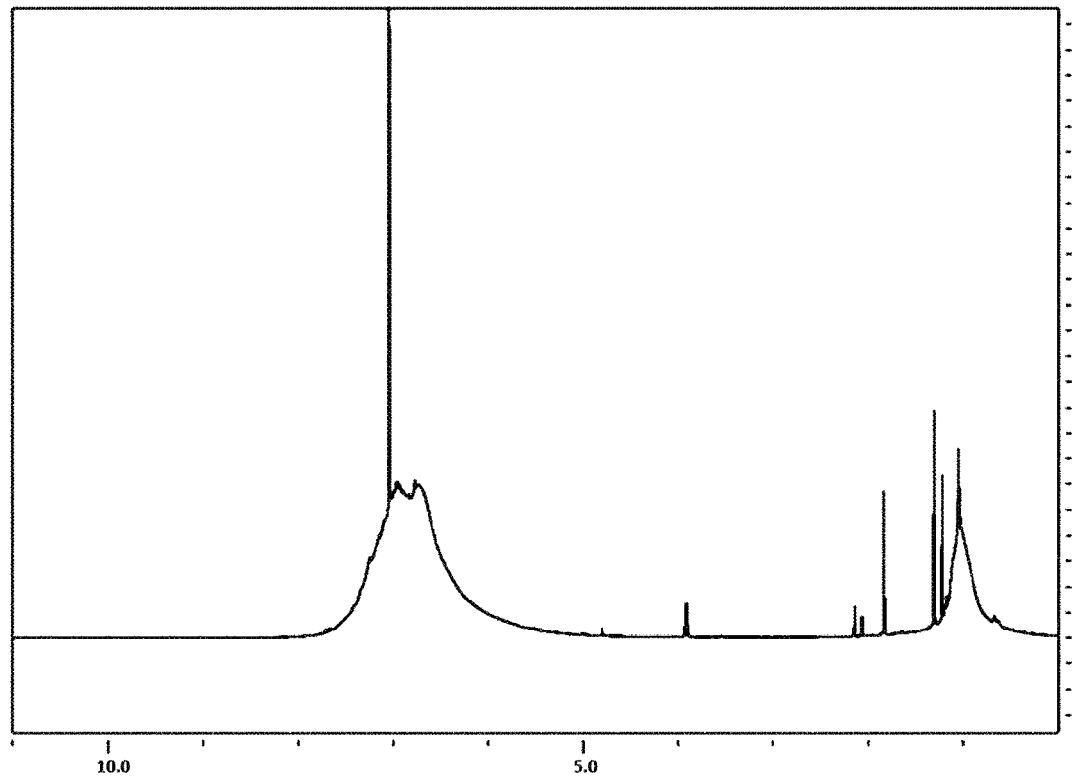
[FIG. 8]
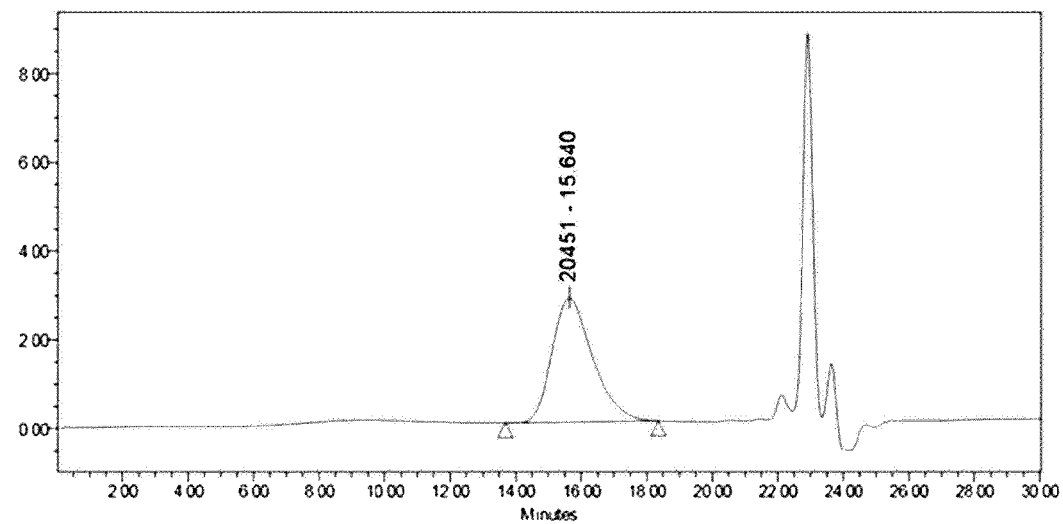

[FIG. 9]
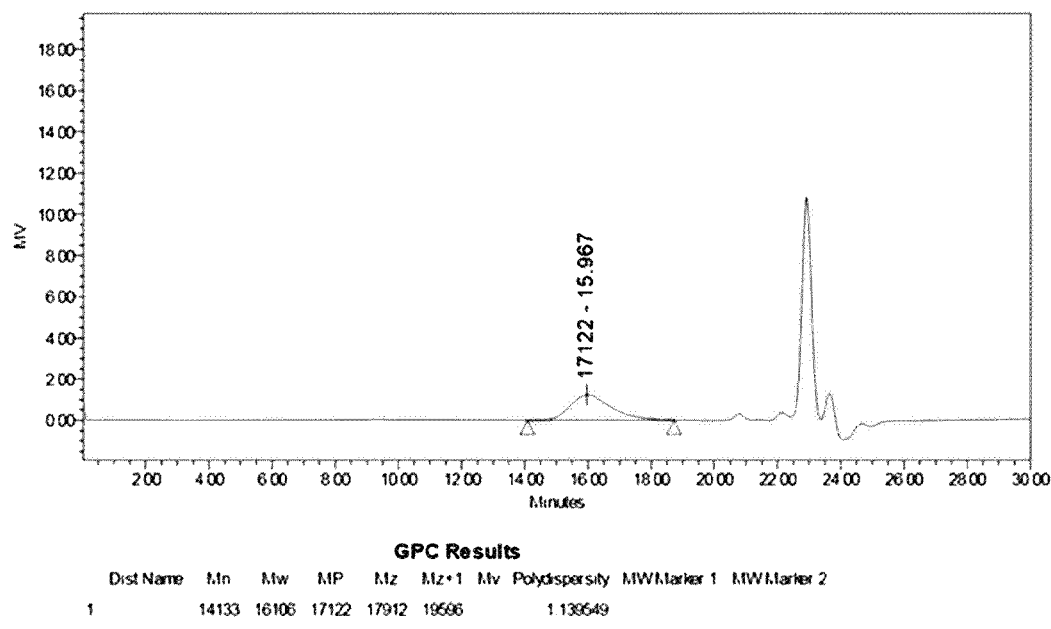

POLYMER, COATING COMPOSITION COMPRISING SAME, AND ORGANIC LIGHT EMITTING DEVICE USING SAME

CROSS-REFERENCE TO RELATED APPLICATIONS

The present application is a national stage entry under 35 U.S.C. § 371 of International Application No. PCT/KR2020/007582 filed on Jun. 11, 2020, which claims priority from Korean Patent Application No. 10-2019-0077757 filed on Jun. 28, 2019, all the disclosures of which are incorporated herein by reference.

TECHNICAL FIELD

The present specification relates to a polymer, a coating composition including the same, and an organic light emitting device formed by using the same.

BACKGROUND ART

An organic light emission phenomenon is one of the examples in which an electric current is converted into visible rays through an internal process of a specific organic molecule. The principle of the organic light emission phenomenon is as follows. When an organic material layer is disposed between an anode and a cathode, if an electric current is applied between the two electrodes, electrons and holes are injected into the organic material layer from the cathode and the anode, respectively. The electrons and the holes which are injected into the organic material layer are recombined to form an exciton, and the exciton falls down again to the ground state to emit light. An organic electroluminescent device using this principle may be generally composed of a cathode, an anode, and an organic material layer disposed therebetween, for example, an organic material layer including a hole injection layer, a hole transport layer, a light emitting layer, an electron transport layer, and an electron injection layer.

A material used in the organic light emitting device is mostly a pure organic material or a complex compound where an organic material and metal form a complex, and may be classified into a hole injection material, a hole transport material, a light emitting material, an electron transport material, an electron injection material, and the like according to the use thereof. Herein, an organic material having a p-type property, that is, an organic material, which is easily oxidized and has an electrochemically stable state during oxidation, is usually used as the hole injection material or the hole transport material. Meanwhile, an organic material having an n-type property, that is, an organic material, which is easily reduced and has an electrochemically stable state during reduction, is usually used as the electron injection material or the electron transport material. As the light emitting material, a material having both p-type and n-type properties, that is, a material having a stable form in both oxidation and reduction states is preferred, and a material having high light emitting efficiency for converting an exciton into light when the exciton is formed is preferred.

In addition to those mentioned above, it is preferred that the material used in the organic light emitting device additionally has the following properties.

First, it is preferred that the material used in the organic light emitting device has excellent thermal stability. This is because joule heating occurs due to the movement of electric charges in the organic light emitting device. Currently, since N,N"-di(1-naphthyl)-N,N"-diphenyl-(1,1"-biphenyl)-4,4"-diamine (NPB) typically used as a hole transport layer material has a glass transition temperature value of 100° C. or less, there is a problem in that it is difficult to use the material in an organic light emitting device requiring a high electric current.

Second, in order to obtain a high-efficiency organic light emitting device which is capable of being driven at low voltage, holes or electrons injected into the organic light emitting device need to be smoothly transferred to a light emitting layer, and simultaneously, the injected holes and electrons need to be prevented from being released out of the light emitting layer. For this purpose, a material used in the organic light emitting device needs to have an appropriate band gap and an appropriate highest occupied molecular orbital (HOMO) or lowest unoccupied molecular orbital (LUMO) energy level. Since poly(3,4-ethylenediocythiophene) doped: poly(styrenesulfonic acid) (PEDOT:PSS) currently used as a hole transport material in an organic light emitting device to be manufactured by a solution application method has a lower LUMO energy level than the LUMO energy level of an organic material used as a light emitting layer material, it is difficult to manufacture an organic light emitting device having high efficiency and a long service life.

In addition, the material used in the organic light emitting device needs to have excellent chemical stability, excellent charge mobility, excellent interface characteristics with electrodes or adjacent layers, and the like. That is, the material used in the organic light emitting device needs to be minimally deformed by moisture or oxygen. Further, the material used in the organic light emitting device needs to have appropriate hole or electron mobility so as to make a balance between densities of holes and electrons in a light emitting layer of the organic light emitting device, thereby maximally forming excitons. Moreover, the material used in the organic light emitting device needs to improve the interface with an electrode including a metal or a metal oxide for the stability of the device.

In addition to those mentioned above, a material used in an organic light emitting device for a solution process needs to additionally have the following properties.

First, the material used in the organic light emitting device needs to form a storable homogenous solution. Since a commercialized material for a deposition process has good crystallinity so that the material is not dissolved well in a solution or the crystals thereof are easily formed even though the material forms a solution, it is highly likely that according to the storage period, the concentration gradient of the solution varies or a defective device is formed.

Second, layers where the solution process is performed need to have solvent and material resistance to other layers. For this purpose, a material capable of forming a polymer self-crosslinked on a substrate through a heat treatment or ultraviolet (UV) irradiation after a curing group is introduced and a solution is applied, like N4,N4"-di(naphthalen-1-yl)-N4,N4"-bis(4-vinylphenyl)biphenyl-4,4"-diamine (VNPB), or capable of forming a polymer having sufficient resistance in the next process is preferred, and a material capable of having solvent resistance itself, like hexaazatriphenylenehexacarbonitrile (HATCN), is also preferred.

Therefore, there is a need for developing an organic material having the aforementioned requirements in the art.

DETAILED DESCRIPTION OF THE INVENTION

Technical Problem

The present specification has been made in an effort to provide a polymer, a coating composition including the same, and an organic light emitting device formed by using the same.

Technical Solution

An exemplary embodiment of the present specification provides a polymer including: a first unit of the following Formula 1; and a second unit of the following Chemical Formula 2.

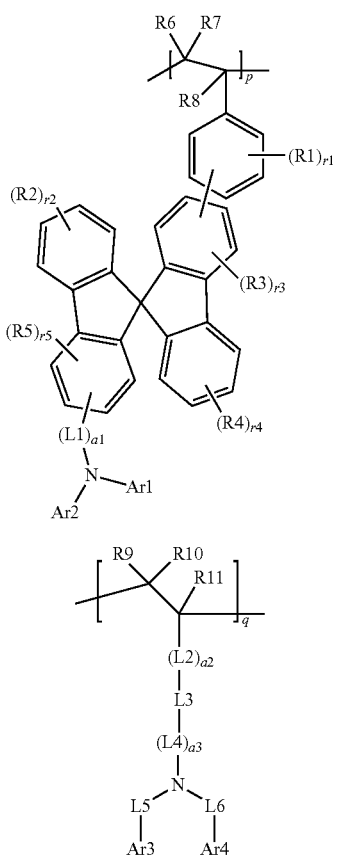

[Formula 1]

[Formula 2]

In Formulae 1 and 2,

L1, L2, and L4 to L6 are each independently a direct bond; —O—; a substituted or unsubstituted alkylene group; a substituted or unsubstituted arylene group; a substituted or unsubstituted divalent amine group; or a substituted or unsubstituted divalent heterocyclic group, L3 is a substituted or unsubstituted divalent carbazole group; a substituted or unsubstituted divalent fluorenyl group; or a substituted or unsubstituted phenylene group, a1, a2, and a3 are each an integer from 1 to 10, when a1 is 2 or higher, two or more L1's are the same as or different from each other, when a2 is 2 or higher, two or more L2's are the same as or different from each other, when a3 is 2 or higher, two or more L4's are the same as or different from each other, Ar1 to Ar4 are the same as or different from each other, and are each independently a substituted or unsubstituted alkyl group; a substituted or unsubstituted alkoxy group; a substituted or unsubstituted aryloxy group; an aryl group; or a substituted or unsubstituted heterocyclic group, R1 to R11 are the same as or different from each other, and are each independently hydrogen; deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group, r1, r2, and r4 are each an integer from 1 to 4, r3 and r5 are each an integer from 1 to 3, when r1 is 2 or higher, two or more R1's are the same as or different from each other, and when r2 is 2 or higher, two or more R2's are the same as or different from each other, when r3 is 2 or higher, two or more R3's are the same as or different from each other, when r4 is 2 or higher, two or more R4's are the same as or different from each other, when r5 is 2 or higher, two or more R5's are the same as or different from each other, p is a repeating number of the unit, and an integer from 1 to 100, and q is a repeating number of the unit, and an integer from 1 to 100.

Another exemplary embodiment of the present specification provides a coating composition including the polymer.

Still another exemplary embodiment of the present specification provides a method for preparing a polymer, the method including: dissolving a first monomer of the following Formula A, a second monomer of the following Formula B, and an initiator in a solvent, and then performing a living radical polymerization.

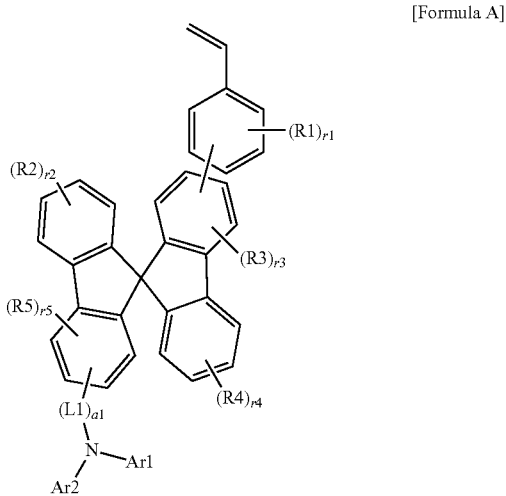

[Formula A]

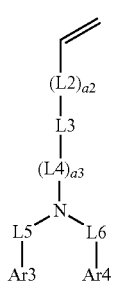

[Formula B]

in Formulae A and B,

L1, L2, and L4 to L6 are each independently a direct bond; —O—; a substituted or unsubstituted alkylene group; a substituted or unsubstituted arylene group; a substituted or unsubstituted divalent amine group; or a substituted or unsubstituted divalent heterocyclic group, L3 is a substituted or unsubstituted divalent carbazole group; a substituted or unsubstituted divalent fluorenyl group; or a substituted or unsubstituted phenylene group, a1, a2, and a3 are each an integer from 1 to 10, when a1 is 2 or higher, two or more L1's are the same as or different from each other, when a2 is 2 or higher, two or more L2's are the same as or different from each other, when a3 is 2 or higher, two or more L4's are the same as or different from each other, Ar1 to Ar4 are the same as or different from each other, and are each independently a substituted or unsubstituted alkyl group; a substituted or unsubstituted alkoxy group; a substituted or unsubstituted aryloxy group; a substituted or unsubstituted aryl group; or a substituted or unsubstituted heterocyclic group, R1 to R5 are the same as or different from each other, and are each independently hydrogen; deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group, r1, r2, and r4 are each an integer from 1 to 4, r3 and r5 are each an integer from 1 to 3, when r1 is 2 or higher, two or more R1's are the same as or different from each other, and when r2 is 2 or higher, two or more R2's are the same as or different from each other, when r3 is 2 or higher, two or more R3's are the same as or different from each other, when r4 is 2 or higher, two or more R4's are the same as or different from each other, when r5 is 2 or higher, two or more R5's are the same as or different from each other.

Yet another exemplary embodiment of the present specification provides an organic light emitting device including:
a first electrode;
a second electrode provided to face the first electrode; and
an organic material layer having one or more layers provided between the first electrode and the second electrode,
in which one or more layers of the organic material layer include the polymer.

Still yet another exemplary embodiment of the present specification provides a method for preparing an organic light emitting device, the method including: preparing a first electrode;

forming an organic material layer including a hole transport layer on the first electrode; and forming a second electrode on the organic material layer, in which the forming of the organic material layer includes forming the hole transport layer using the coating composition.

Advantageous Effects

In the polymer according to an exemplary embodiment of the present specification, a covalent bond between the first unit and the second unit is improved by co-polymerizing the first unit and the second unit. Accordingly, the case where the polymer according to an exemplary embodiment of the present specification is used as a material for an organic material layer of an organic light emitting device exhibits an effect of improving the light efficiency of the device as compared to the case of blending the first unit and the second unit.

Further, the polymer according to an exemplary embodiment of the present specification is used as a material for an organic material layer of an organic light emitting device, so that it is possible to lower a driving voltage of the organic light emitting device.

Furthermore, the polymer according to an exemplary embodiment of the present specification is used as a material for an organic material layer of an organic light emitting device, so that it is possible to improve service life characteristics of the device.

In addition, the polymer according to an exemplary embodiment of the present specification is used as a material for an organic material layer of an organic light emitting device, so that it is possible to have excellent solubility to a solvent to be used by increasing the degree of freedom of the molecule when the organic material layer is prepared.

BRIEF DESCRIPTION OF DRAWINGS

FIGS. 1 and 2 illustrate an example of an organic light emitting device according to an exemplary embodiment of the present specification.

FIG. 3 is a view illustrating NMR measurement results of Polymer 1.

FIG. 4 is a view illustrating GPC measurement results of Polymer 1.

FIG. 5 is a view illustrating NMR measurement results of Polymer 3.

FIG. 6 is a view illustrating GPC measurement results of Polymer 3.

FIG. 7 is a view illustrating NMR measurement results of Polymer 4.

FIG. 8 is a view illustrating GPC measurement results of Polymer 4.

FIG. 9 is a view illustrating GPC measurement results of Polymer 5.

EXPLANATION OF REFERENCE NUMERALS AND SYMBOLS

1: Substrate
2: Positive electrode
3: Hole transport layer
4: Light emitting layer
5: Negative electrode
6: Hole injection layer
7: Electron transport layer
8: Electron injection layer

BEST MODE

Hereinafter, the present specification will be described in more detail.

The present specification provides a polymer including: a first unit of the following Formula 1; and a second unit of the following Formula 2.

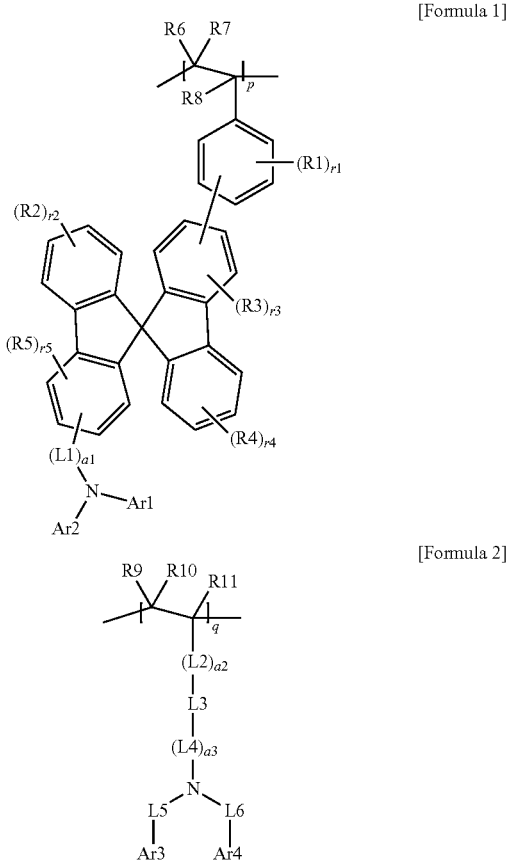

[Formula 1]

[Formula 2]

in Formulae 1 and 2,

L1, L2, and L4 to L6 are each independently a direct bond; —O—; a substituted or unsubstituted alkylene group; a substituted or unsubstituted arylene group; a substituted or unsubstituted divalent amine group; or a substituted or unsubstituted divalent heterocyclic group, L3 is a substituted or unsubstituted divalent carbazole group; a substituted or unsubstituted divalent fluorenyl group; or a substituted or unsubstituted phenylene group, a1, a2, and a3 are each an integer from 1 to 10, when a1 is 2 or higher, two or more L1's are the same as or different from each other, when a2 is 2 or higher, two or more L2's are the same as or different from each other, when a3 is 2 or higher, two or more L4's are the same as or different from each other, Ar1 to Ar4 are the same as or different from each other, and are each independently a substituted or unsubstituted alkyl group; a substituted or unsubstituted alkoxy group; a substituted or unsubstituted aryloxy group; a substituted or unsubstituted aryl group; or a substituted or unsubstituted heterocyclic group, R1 to R11 are the same as or different from each other, and are each independently hydrogen; deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group, r1, r2, and r4 are each an integer from 1 to 4, r3 and r5 are each an integer from 1 to 3, when r1 is 2 or higher, two or more R1's are the same as or different from each other, and when r2 is 2 or higher, two or more R2's are the same as or different from each other, when r3 is 2 or higher, two or more R3's are the same as or different from each other, when r4 is 2 or higher, two or more R4's are the same as or different from each other, when r5 is 2 or higher, two or more R5's are the same as or different from each other, p is a repeating number of the unit, and an integer from 1 to 100, and q is a repeating number of the unit, and an integer from 1 to 100.

In an exemplary embodiment of the present specification, the polymer is a random polymer.

In an exemplary embodiment of the present specification, the polymer is prepared by co-polymerizing the first unit and the second unit, so that a covalent bond is formed between the first unit and the second unit. Accordingly, the case where the polymer according to an exemplary embodiment of the present specification is used as a material for an organic material layer of an organic light emitting device exhibits an effect of improving the light efficiency of the device as compared to the case of applying a material in which the first unit and the second unit are blended to the organic material layer.

In the present specification, the "unit" means a structure in which a monomer is included and repeated in a polymer, and a structure in which the monomer is bonded into the polymer by polymerization.

In the present specification, "including a unit" means that the unit is included in a main chain in a polymer.

In the present specification, the "monomer" means a monomer or a unit body which is a unit constituting the polymer.

In an exemplary embodiment of the present specification, the polymer has an excellent covalent bond between the first unit and the second unit. Specifically, in the polymer, the covalent bond between the first unit and the second unit is improved as compared to the case where the compound including the first unit and the compound including the second unit are blended.

Therefore, when the polymer is used in the organic material layer of the organic light emitting device, the manufactured organic material layer has excellent uniformity and surface characteristics, so that the performance and service life characteristics of the device may be improved.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a cyano group (—CN); a silyl group; a boron group; an alkyl group; a cycloalkyl group; an amine group; an aryl group; and a heterocyclic group, being substituted with a substituent to which two or more substituents among the exemplified substituents are linked, or having no substituent. For example, "the substituent to which two or more substituents are linked" may be a biphenyl group. That is, the biphenyl group may also be an aryl group, and may be interpreted as a substituent to which two phenyl groups are linked.

In the present specification, examples of a halogen group include fluorine (F), chlorine (Cl), bromine (Br) or iodine (I).

In the present specification, a silyl group may be represented by a formula of —SiY1Y2Y3, and Y1, Y2, and Y3 may be each hydrogen; a substituted or unsubstituted alkyl group; or a substituted or unsubstituted aryl group. Specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a boron group may be represented by a formula of —BY4Y5, and Y4 and Y5 may be each hydrogen; a substituted or unsubstituted alkyl group; or a substituted or unsubstituted aryl group. Specific examples of the boron group include a trimethylboron group, a triethylboron group, a t-butyldimethylboron group, a triphenylboron group, a phenylboron group, and the like, but are not limited thereto.

In the present specification, a nitroxy group may be represented by a formula of —ONY6Y7, and Y6 and Y7 may be each hydrogen; a substituted or unsubstituted alkyl group; or a substituted or unsubstituted aryl group.

In the present specification, the alkoxy group may be straight-chained, branched, or cyclic. The number of carbon atoms of the alkoxy group is not particularly limited, but is preferably 1 to 30. Specific examples thereof include methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, and the like, but are not limited thereto.

In the present specification, the alkyl group may be straight-chained or branched, and the number of carbon atoms thereof is not particularly limited, but is preferably 1 to 60. According to an exemplary embodiment, the number of carbon atoms of the alkyl group is 1 to 30. According to another exemplary embodiment, the number of carbon atoms of the alkyl group is 1 to 20. According to still another exemplary embodiment, the number of carbon atoms of the alkyl group is 1 to 10. Specific examples of the alkyl group include a methyl group, an ethyl group, a propyl group, an isopropyl group, a butyl group, an isobutyl group, a tert-butyl group, a pentyl group, a hexyl group, a heptyl group, an octyl group, and the like, but are not limited thereto.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to still another exemplary embodiment, the number of carbon atoms of the cycloalkyl group is 3 to 6. Specific examples thereof include a cyclopropyl group, a cyclobutyl group, a cyclopentyl group, a cyclohexyl group, a cycloheptyl group, a cyclooctyl group, and the like, but are not limited thereto.

In the present specification, an amine group may be selected from the group consisting of —NH$_2$; an alkylamine group; an arylalkylamine group; an arylamine group; an arylheteroarylamine group; an alkylheteroarylamine group; and a heteroarylamine group, and is not limited thereto. The number of carbon atoms of the amine group is not particularly limited, but is preferably 1 to 60.

In the present specification, the number of carbon atoms of an alkylamine group is not particularly limited, but may be 1 to 40, and may be 1 to 20 according to an exemplary embodiment. Specific examples of the alkylamine group include a methylamine group, a dimethylamine group, an ethylamine group, a diethylamine group, and the like, but are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group including the two or more aryl groups may include a monocyclic aryl group, a polycyclic aryl group, or both a monocyclic aryl group and a polycyclic aryl group.

Specific examples of the arylamine group include a phenylamine group, a naphthylamine group, a biphenylamine group, an anthracenylamine group, a diphenylamine group, a phenylnaphthylamine group, a biphenylphenylamine group, a dibiphenylamine group, a fluorenylphenylamine group, and the like, but are not limited thereto.

In the present specification, examples of the heteroarylamine group include a substituted or unsubstituted monoheteroarylamine group, a substituted or unsubstituted diheteroarylamine group, or a substituted or unsubstituted triheteroarylamine group. The heteroaryl group in the heteroarylamine group may be a monocyclic heteroaryl group or a polycyclic heteroaryl group. The heteroarylamine group including two or more heteroaryl groups may include a monocyclic heteroaryl group, a polycyclic heteroaryl group, or both a monocyclic heteroaryl group and a polycyclic heteroaryl group.

In the present specification, an arylalkyl group means an alkyl group substituted with an aryl group.

In the present specification, an arylheteroarylamine group means an amine group substituted with an aryl group and a heteroaryl group.

In the present specification, an arylalkylamine group means an amine group substituted with an aryl group and an alkyl group.

In the present specification, an alkylheteroarylamine group means an amine group substituted with an alkyl group and a heteroaryl group.

In the present specification, an aryl group is not particularly limited, but has preferably 6 to 60 carbon atoms, and may be a monocyclic aryl group or a polycyclic aryl group.

According to an exemplary embodiment, the number of carbon atoms of the aryl group is 6 to 30. According to an exemplary embodiment, the number of carbon atoms of the aryl group is 6 to 20. Examples of a monocyclic aryl group as the aryl group include a phenyl group, a biphenyl group, a terphenyl group, and the like, but are not limited thereto. Examples of the polycyclic aryl group include a naphthyl group, an anthracenyl group, a phenanthrenyl group, a pyrenyl group, a perylenyl group, a triphenyl group, a chrysenyl group, a fluorenyl group, and the like, but are not limited thereto.

In the present specification, a fluorenyl group may be substituted, and two substituents may be bonded to each other to form a spiro structure.

When the fluorenyl group is substituted, the substituent may be a spirofluorenyl group such as

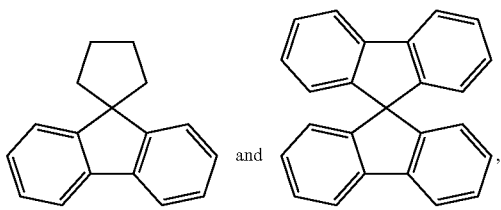

and a fluorenyl group such as

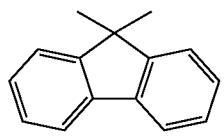

(a 9,9-dimethylfluorenyl group) and

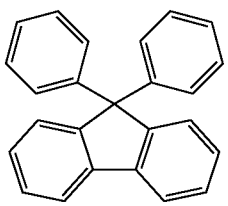 [SMILES: c1ccc(C2(c3ccccc3)c3ccccc3-c3ccccc32)cc1]

(a 9,9-diphenylfluorenyl group), and in this case, the structure may be substituted with an additional substituent. However, the structure of the substituted fluorenyl group is not limited thereto.

In the present specification, a heterocyclic group includes one or more atoms other than carbon, that is, one or more heteroatoms, and specifically, the heteroatom may include one or more atoms selected from the group consisting of O, N, Se, S, and the like. The number of carbon atoms thereof is not particularly limited, but is preferably 2 to 30, and the heterocyclic group may be monocyclic or polycyclic. Examples of the heterocyclic group include a thiophene group, a furan group, a pyrrole group, an imidazole group, a thiazole group, an oxazole group, an oxadiazole group, a pyridine group, a bipyridine group, a pyrimidine group, a triazine group, a triazole group, an acridine group, a pyridazine group, a pyrazine group, a quinoline group, a quinazoline group, a quinoxaline group, a phthalazine group, a pyridopyrimidine group, a pyridopyrazine group, a pyrazinopyrazine group, an isoquinoline group, an indole group, a carbazole group, a benzoxazole group, a benzimidazole group, a benzothiazole group, a benzocarbazole group, a benzothiophene group, a dibenzothiophene group, a benzofuran group, a phenanthridine group, a phenanthroline group, an isoxazole group, a thiadiazole group, a phenothiazine group, a dibenzofuran group, and the like, but are not limited thereto.

In the present specification, a heteroaryl group may be selected from the examples of the heterocyclic group except for an aromatic heteroaryl group, but is not limited thereto.

In the present specification, the aryl group in the aryloxy group is the same as the above-described examples of the aryl group. Specific examples of the aryloxy group include a phenoxy group, benzyloxy, p-methylbenzyloxy, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, but are not limited thereto.

In the present specification, an alkylene group means a group having two bonding positions in an alkyl group, that is, a divalent group. The above-described description on the alkyl group may be applied to the alkylene group, except for a divalent alkylene group.

In the present specification, an arylene group means a group having two bonding positions in an aryl group, that is, a divalent group. The above-described description on the aryl group may be applied to the arylene group, except that the arylene groups are each a divalent group.

In the present specification, a divalent heterocyclic group means that there are two bonding positions in a heterocyclic group, that is, a divalent group. The above-described description on the heterocyclic group may be applied, except that the heterocyclic groups are each a divalent group.

In the present specification, a divalent carbazole group means that there are two bonding positions in a carbazole group.

In the present specification, a divalent fluorenyl group means that there are two bonding positions in a fluorenyl group.

In the present specification, a phenylene group means that there are two bonding positions in a phenyl group.

In an exemplary embodiment of the present specification, the first unit is the following Formula 1-1.

[Formula 1-1]

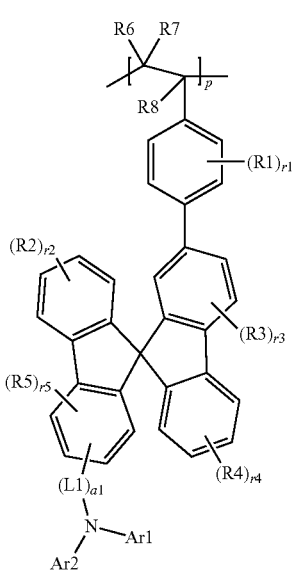

In Formula 1-1, the definitions of R1 to R8, r1 to r5, a1, L1, Ar1, Ar2, and p are the same as those defined in Formula 1.

In an exemplary embodiment of the present specification, the first unit is the following Formula 1-2.

[Formula 1-2]

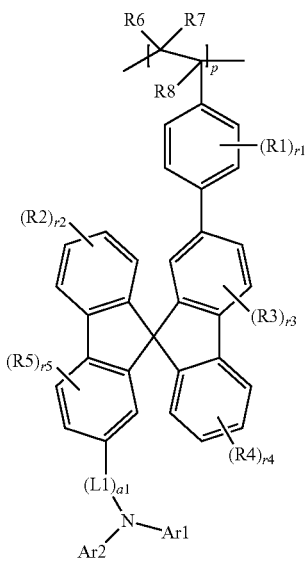

In Formula 1-2, the definitions of R1 to R8, r1 to r5, a1, L1, Ar1, Ar2 and p are the same as those defined in Formula 1.

In an exemplary embodiment of the present specification, the second unit is any one of the following Formulae 2-1 to 2-4.

[Formula 2-1]

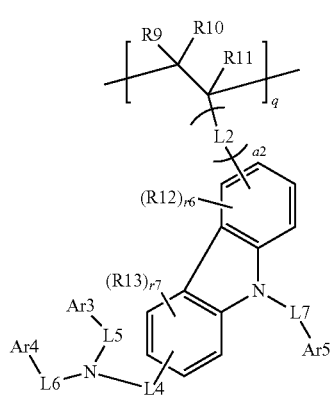

[Formula 2-2]

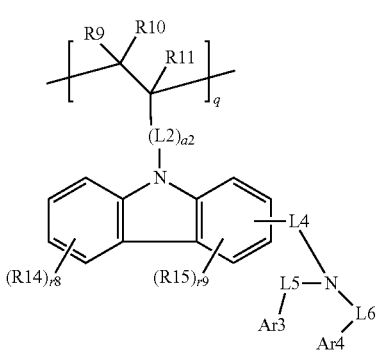

[Formula 2-3]

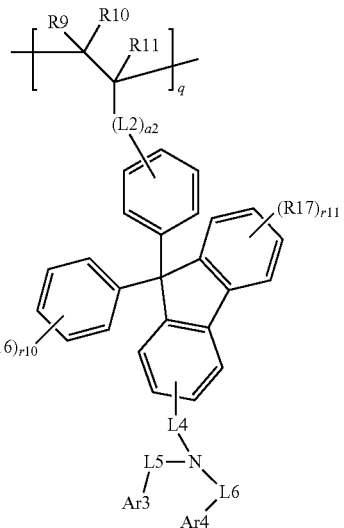

[Formula 2-4]

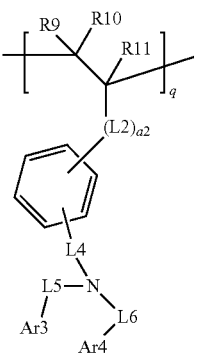

In Formulae 2-1 to 2-4,

L2, L4 to L6, a2, Ar3, Ar4, R9 to R11, and q are the same as those defined in Formula 2, L7 is a direct bond; a substituted or unsubstituted arylene group; a substituted or unsubstituted divalent amine group; or a substituted or unsubstituted divalent heterocyclic group, Ar5 is a substituted or unsubstituted alkyl group; a substituted or unsubstituted alkoxy group; a substituted or unsubstituted aryloxy group; a substituted or unsubstituted aryl group; or a substituted or unsubstituted heterocyclic group, R12 to R17 are the same as or different from each other, and are each independently hydrogen; deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group, r6, r7, and r9 are each an integer from 1 to 3, r8 and r11 are each an integer from 1 to 4, r10 an integer from 1 to 5, when r6 is 2 or higher, two or more R12's are the same as or different from each other, when r7 is 2 or higher, two or more R13's are the same as or different from each other, when r8 is 2 or higher, two or more R14's are the same as or different from each other, when r9 is 2 or higher, two or more R15's are the same as or different from each other, when r10 is 2 or higher, two or more R16's are the same as or different from each other, and when r11 is 2 or higher, two or more R17's are the same as or different from each other.

In the present specification, the polymer is a random copolymer of the first unit and the second unit.

In an exemplary embodiment of the present specification, the polymer includes a unit of the following Formula 3-1.

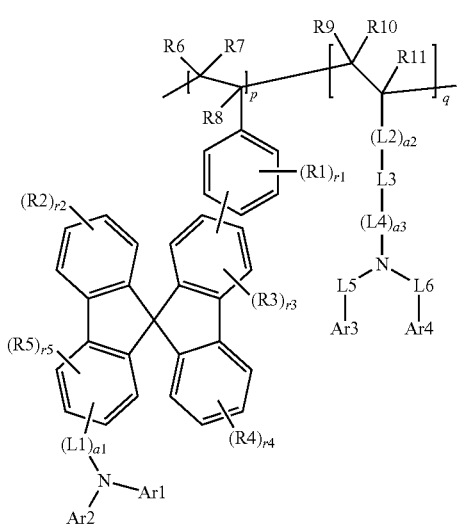

[Formula 3-1]

In Formula 3-1,

L1 to L6, a1 to a3, Ar1 to Ar4, R1 to R11, r1 to r5, p, and q are the same as those defined in Formulae 1 and 2.

In an exemplary embodiment of the present specification, the polymer includes a unit of any one of the following Formulae 3-2 to 3-5.

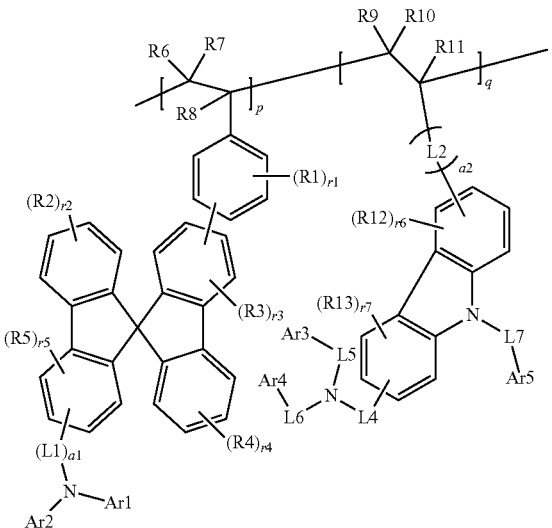

[Formula 3-2]

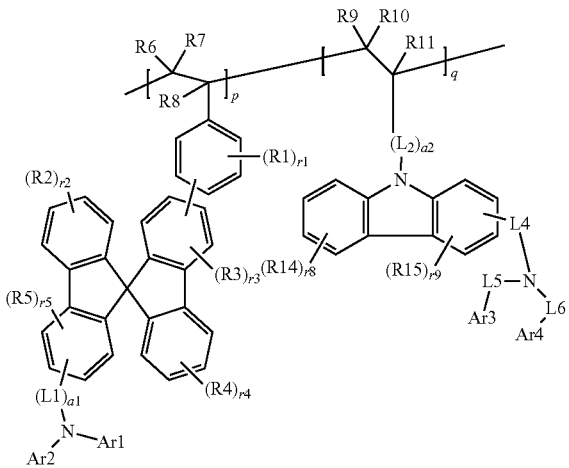

[Formula 3-3]

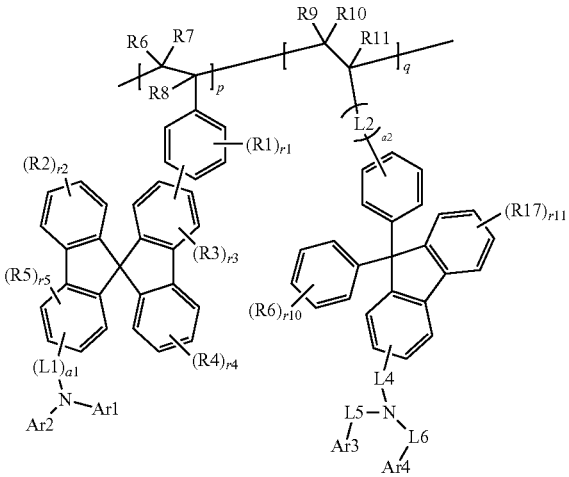

[Formula 3-4]

-continued

[Formula 3-5]

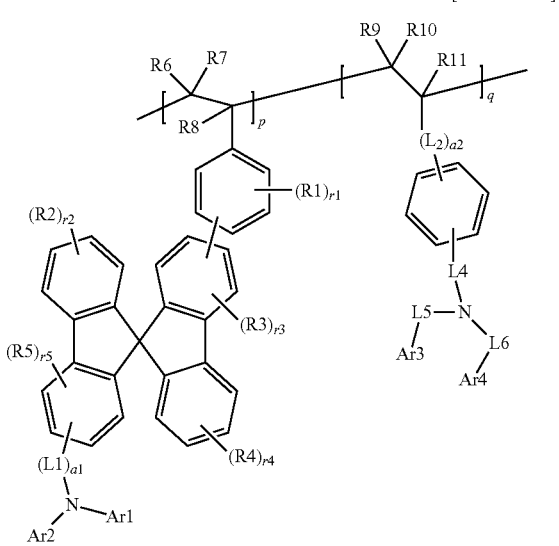

In Formulae 3-2 to 3-5,

L1, L2, L4 to L6, a1, a2, Ar1 to Ar4, R1 to R11, r1 to r5, p, and q are the same as those defined in Formulae 1 and 2, L7 is a direct bond; a substituted or unsubstituted arylene group; a substituted or unsubstituted divalent amine group; or a substituted or unsubstituted divalent heterocyclic group, Ar5 is a substituted or unsubstituted alkyl group; a substituted or unsubstituted alkoxy group; a substituted or unsubstituted aryloxy group; a substituted or unsubstituted aryl group; or a substituted or unsubstituted heterocyclic group, R12 to R17 are the same as or different from each other, and are each independently hydrogen; deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group, r6, r7, and r9 are each an integer from 1 to 3, r8 and r11 are each an integer from 1 to 4, r10 an integer from 1 to 5, when r6 is 2 or higher, two or more R12's are the same as or different from each other, when r7 is 2 or higher, two or more R13's are the same as or different from each other, when r8 is 2 or higher, two or more R14's are the same as or different from each other, when r9 is 2 or higher, two or more R15's are the same as or different from each other, when r10 is 2 or higher, two or more R16's are the same as or different from each other, and when r11 is 2 or higher, two or more R17's are the same as or different from each other.

In an exemplary embodiment of the present specification, R1 to R11 are the same as or different from each other, and are each independently hydrogen; deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group.

In an exemplary embodiment of the present specification, R1 to R11 are the same as or different from each other, and are each independently hydrogen; a substituted or unsubstituted alkyl group; a substituted or unsubstituted aryl group; or a substituted or unsubstituted heterocyclic group.

In an exemplary embodiment of the present specification, R1 to R11 are each hydrogen.

In an exemplary embodiment of the present specification, a1 is an integer from 1 to 10.

In an exemplary embodiment of the present specification, a1 is an integer from 1 to 3.

In an exemplary embodiment of the present specification, a1 is 1.

In an exemplary embodiment of the present specification, L1, L2, and L4 to L6 are the same as or different from each other, and are each independently a direct bond; —O—; a substituted or unsubstituted alkylene group; a substituted or unsubstituted arylene group; a substituted or unsubstituted divalent amine group; or a substituted or unsubstituted divalent heterocyclic group.

In an exemplary embodiment of the present specification, L1, L2, and L4 to L6 are the same as or different from each other, and are each independently a direct bond; —O—; a substituted or unsubstituted straight-chained or branched alkylene group; a substituted or unsubstituted arylene group; a substituted or unsubstituted divalent amine group; or a substituted or unsubstituted divalent heterocyclic group.

In an exemplary embodiment of the present specification, L1, L2, and L4 to L6 are the same as or different from each other, and are each independently a direct bond; —O—; a substituted or unsubstituted straight-chained or branched alkylene group; or a substituted or unsubstituted arylene group.

In an exemplary embodiment of the present specification, L1 is a direct bond; —O—; a substituted or unsubstituted straight-chained or branched alkylene group; a substituted or unsubstituted arylene group; a substituted or unsubstituted divalent amine group; or a substituted or unsubstituted divalent heterocyclic group.

In an exemplary embodiment of the present specification, L1 is a substituted or unsubstituted arylene group.

In an exemplary embodiment of the present specification, L1 is a substituted or unsubstituted arylene group having 6 to 30 carbon atoms.

In an exemplary embodiment of the present specification, L1 is a phenylene group.

In an exemplary embodiment of the present specification, An to Ar4 are the same as or different from each other, and are each independently a substituted or unsubstituted alkyl group; a substituted or unsubstituted alkoxy group; a substituted or unsubstituted aryloxy group; a substituted or unsubstituted aryl group; or a substituted or unsubstituted heterocyclic group.

In an exemplary embodiment of the present specification, An to Ar4 are the same as or different from each other, and are each independently a substituted or unsubstituted aryl group.

In an exemplary embodiment of the present specification, An and Ar2 are the same as or different from each other, and are each independently a substituted or unsubstituted phenyl group; a substituted or unsubstituted biphenyl group; or a substituted or unsubstituted fluorenyl group.

In an exemplary embodiment of the present specification, An and Ar2 are the same as or different from each other, and each independently a biphenyl group; or a fluorenyl group which is substituted with a methyl group.

In an exemplary embodiment of the present specification, An and Ar2 are the same as or different from each other, and are each independently a biphenyl group; a spirofluorenyl group; a 9,9-diphenylfluorenyl group; or a 9,9-dimethylfluorenyl group.

In an exemplary embodiment of the present specification, a2 is an integer from 1 to 10.

In an exemplary embodiment of the present specification, a2 is an integer from 1 to 3.

In an exemplary embodiment of the present specification, L2 is a direct bond; —O—; a substituted or unsubstituted straight-chained or branched alkylene group; a substituted or unsubstituted arylene group; a substituted or unsubstituted divalent amine group; or a substituted or unsubstituted divalent heterocyclic group.

In an exemplary embodiment of the present specification, L2 is —O—; a substituted or unsubstituted straight-chained or branched alkylene group; a substituted or unsubstituted arylene group; or a substituted or unsubstituted divalent amine group.

In an exemplary embodiment of the present specification, L2 is —O—; a substituted or unsubstituted straight-chained or branched alkylene group; or a substituted or unsubstituted arylene group.

In an exemplary embodiment of the present specification, a2 is 1 or 3.

In an exemplary embodiment of the present specification, a2 is 1, and L2 is a substituted or unsubstituted arylene group.

In an exemplary embodiment of the present specification, a2 is 1, and L2 is a substituted or unsubstituted phenylene group.

In an exemplary embodiment of the present specification, a2 is 1, and L2 is a phenylene group.

In an exemplary embodiment of the present specification, a2 is 4, and L2 is each —O—; a substituted or unsubstituted straight-chained or branched alkylene group; or a substituted or unsubstituted arylene group.

In an exemplary embodiment of the present specification, a2 is 4, and L2 is each —O—; a substituted or unsubstituted phenylene group; or a substituted or unsubstituted butylene group.

In an exemplary embodiment of the present specification, a2 is 4, and L2 is each —O—; a phenylene group; or a butylene group.

When a2 is 4, and L2 includes a straight-chained or branched alkylene group, the solubility to a solvent to be used may be excellent by increasing the degree of freedom of the molecule during the preparation of the organic material layer compared to that in the case of containing a ring structure such as an adamantylene group.

In an exemplary embodiment of the present specification, a3 is an integer from 1 to 10.

In an exemplary embodiment of the present specification, a3 is an integer from 1 to 4.

In an exemplary embodiment of the present specification, a3 is 1.

In an exemplary embodiment of the present specification, L4 is a direct bond; —O—; a substituted or unsubstituted alkylene group; a substituted or unsubstituted arylene group; or a substituted or unsubstituted divalent heterocyclic group.

In an exemplary embodiment of the present specification, L4 is a direct bond; or a substituted or unsubstituted arylene group.

In an exemplary embodiment of the present specification, L4 is a direct bond; or a substituted or unsubstituted arylene group having 6 to 30 carbon atoms.

In an exemplary embodiment of the present specification, L4 is a phenylene group.

In an exemplary embodiment of the present specification, L4 is a direct bond.

In an exemplary embodiment of the present specification, L5 and L6 are the same as or different from each other, and are each independently a direct bond; —O—; a substituted or unsubstituted alkylene group; a substituted or unsubstituted arylene group; or a substituted or unsubstituted divalent heterocyclic group.

In an exemplary embodiment of the present specification, L5 and L6 are the same as or different from each other, and are each independently a direct bond; or a substituted or unsubstituted arylene group.

In an exemplary embodiment of the present specification, L5 and L6 are the same as or different from each other, and are each independently a direct bond; or a substituted or unsubstituted arylene group having 6 to 30 carbon atoms.

In an exemplary embodiment of the present specification, L5 and L6 are the same as or different from each other, and are each independently a direct bond; or a phenylene group.

In an exemplary embodiment of the present specification, Ar3 and Ar4 are the same as or different from each other, and are each independently a substituted or unsubstituted phenyl group; a substituted or unsubstituted biphenyl group; or a substituted or unsubstituted fluorenyl group.

In an exemplary embodiment of the present specification, Ar3 and Ar4 are the same as or different from each other, and are each independently a phenyl group; a biphenyl group; or a fluorenyl group which is substituted with a methyl group.

In an exemplary embodiment of the present specification, Ar3 and Ar4 are the same as or different from each other, and are each independently a phenyl group; a biphenyl group; a spirobifluorenyl group; a 9,9-diphenylfluorenyl group; or a 9,9-dimethylfluorenyl group.

In an exemplary embodiment of the present specification, L7 is a direct bond; a substituted or unsubstituted arylene group; a substituted or unsubstituted divalent amine group; or a substituted or unsubstituted divalent heterocyclic group.

In an exemplary embodiment of the present specification, L7 is a direct bond.

In an exemplary embodiment of the present specification, Ar5 is a substituted or unsubstituted alkyl group; a substituted or unsubstituted alkoxy group; a substituted or unsubstituted aryloxy group; a substituted or unsubstituted aryl group; or a substituted or unsubstituted heterocyclic group.

In an exemplary embodiment of the present specification, Ar5 is a substituted or unsubstituted aryl group.

In an exemplary embodiment of the present specification, Ar5 is a substituted or unsubstituted aryl group having 6 to 30 carbon atoms.

In an exemplary embodiment of the present specification, Ar5 is a phenyl group.

In an exemplary embodiment of the present specification, R12 to R17 are the same as or different from each other, are each independently hydrogen; deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group.

In an exemplary embodiment of the present specification, R12 to R15 and R17 are each hydrogen.

In an exemplary embodiment of the present specification, R16 is a substituted or unsubstituted alkyl group.

In an exemplary embodiment of the present specification, R16 is a substituted or unsubstituted branched alkyl group.

In an exemplary embodiment of the present specification, R16 is a substituted or unsubstituted branched alkyl group having 1 to 10 carbon atoms.

In an exemplary embodiment of the present specification, the terminal group of the polymer may be determined by the materials used during the polymerization known in the art, and for example, a part of the structure of an initiator may be used.

In an exemplary embodiment of the present specification, the terminal group of the polymer is a substituted or unsubstituted alkyl group; a substituted or unsubstituted aryl group; a substituted or unsubstituted alkoxy group; or a substituted or unsubstituted nitroxy group.

In an exemplary embodiment of the present specification, the terminal group of the polymer is an alkyl group which is unsubstituted or substituted with an aryl group; an aryl group which is unsubstituted or substituted with an alkyl group; an alkoxy group which is unsubstituted or substituted with an amine group; or a nitroxy group which is unsubstituted or substituted with one or more selected from the group consisting of an alkyl group, an aryl group, and an arylalkyl group.

In an exemplary embodiment of the present specification, the terminal group of the polymer may be represented by a formula of —ONY6Y7, and Y6 and Y7 may be each hydrogen; a substituted or unsubstituted alkyl group; a substituted or unsubstituted aryl group; or a substituted or unsubstituted arylalkyl group.

In an exemplary embodiment of the present specification, the polymer may include an additional comonomer in addition to the first unit of the Formula 1 and the second unit of the Formula 2. For example, the additional comonomer may include a comonomer of the following Formula D.

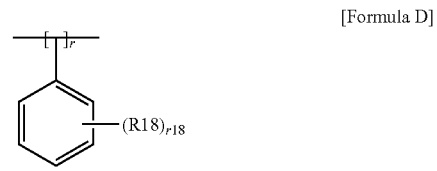

[Formula D]

In Formula D,

R18 is hydrogen or a substituted or unsubstituted aryl group.

In an exemplary embodiment of the present specification, R18 is hydrogen.

In Formula D, r18 is an integer from 1 to 100.

The content of the comonomer of the Formula D may have a ratio of 0.01 to 100 moles compared to 1 mole of the first unit of the Formula 1.

In an exemplary embodiment of the present specification, the polymer includes any one of the following structures.

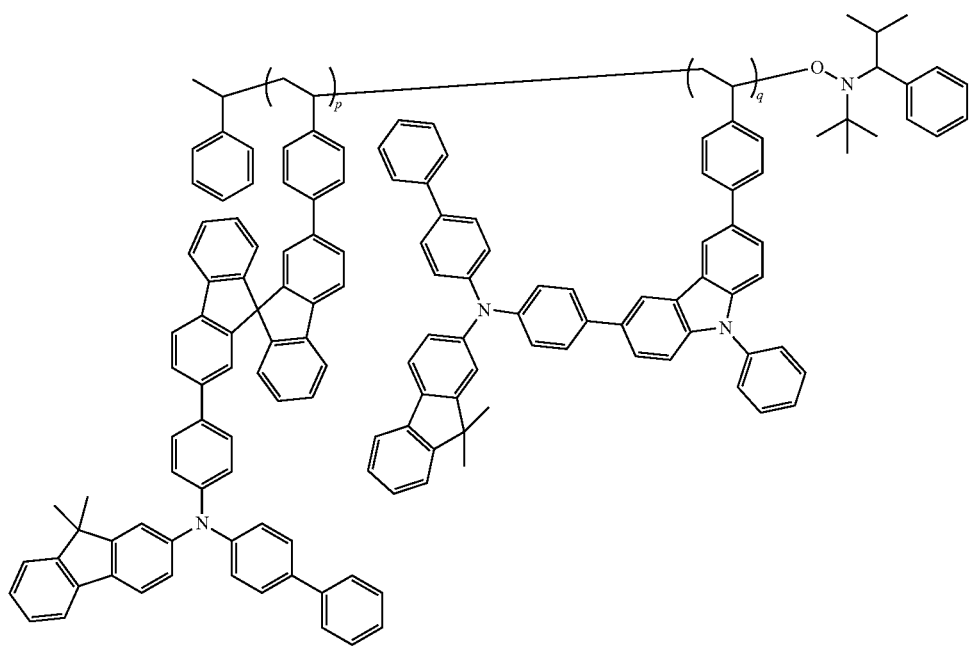

-continued
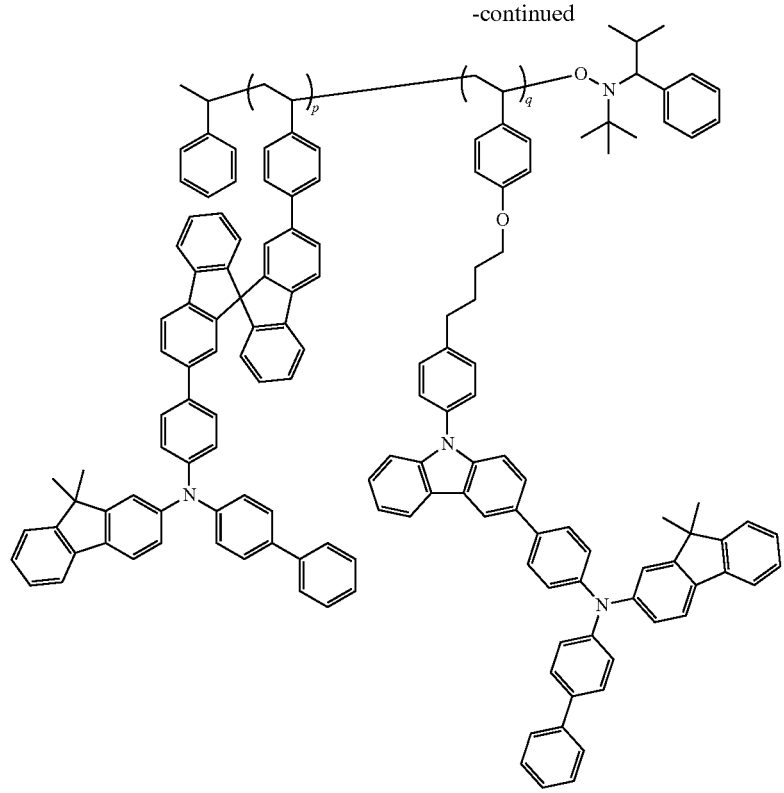
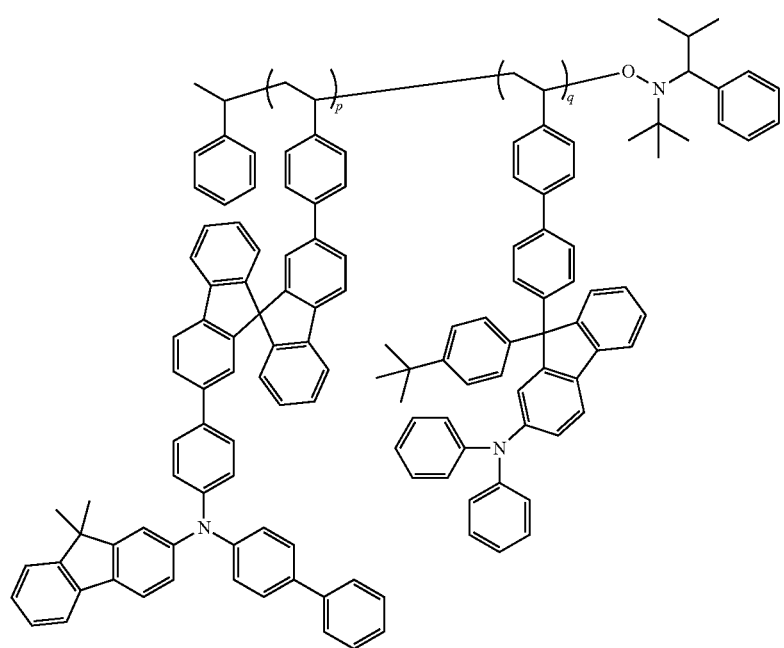

-continued
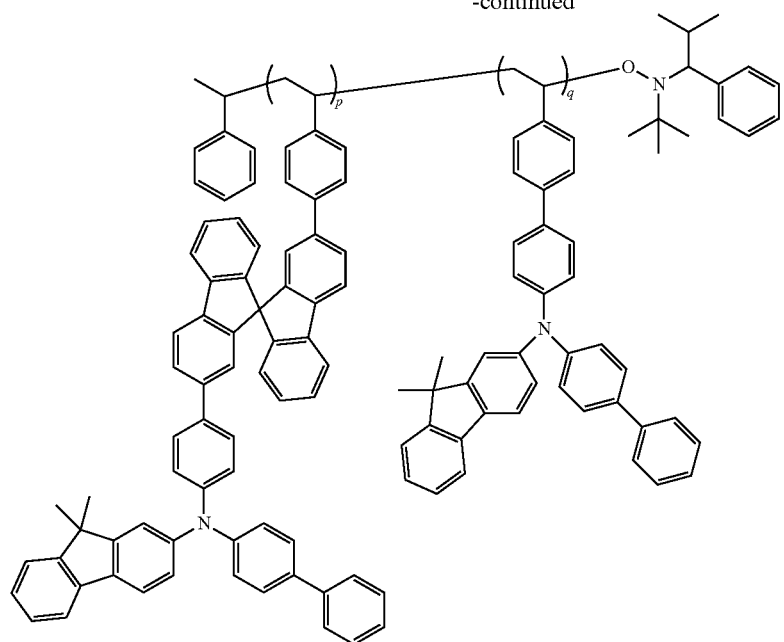
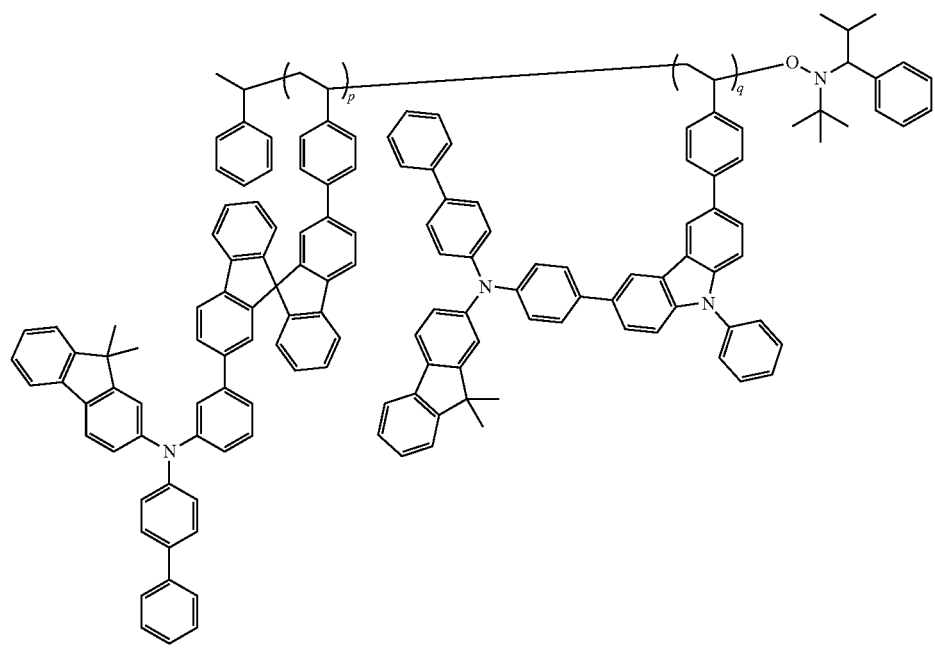

-continued
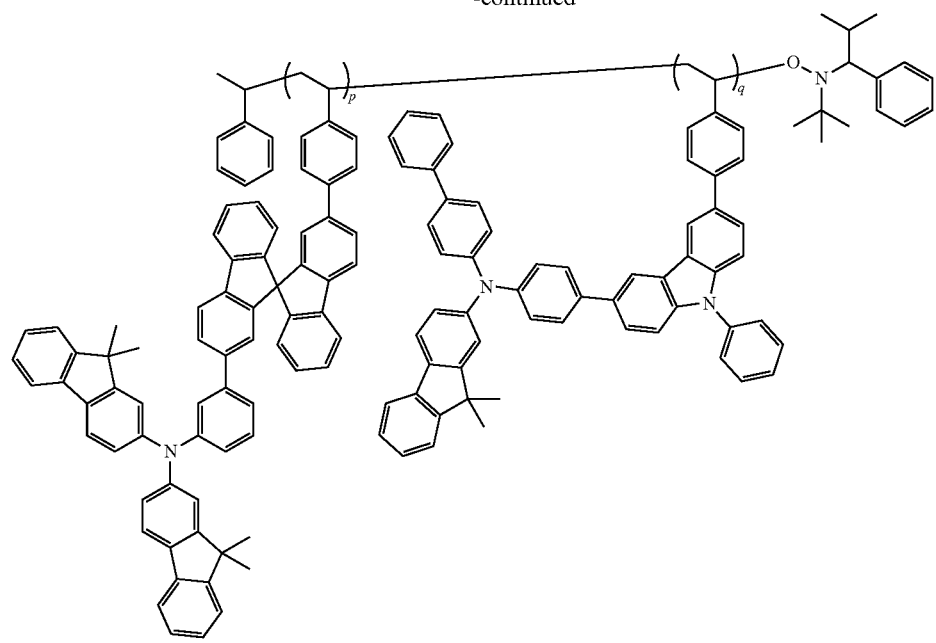
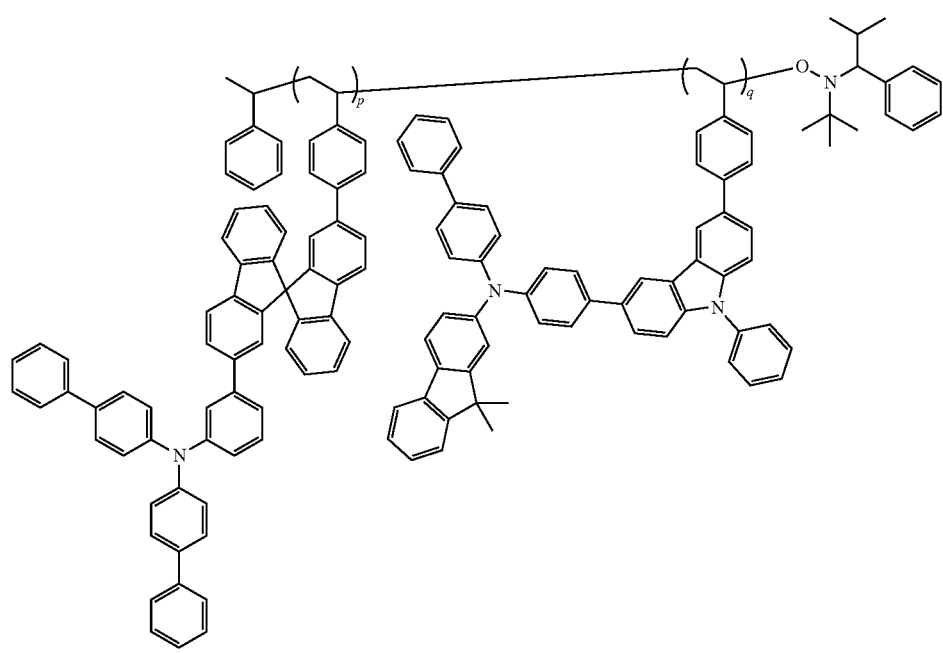

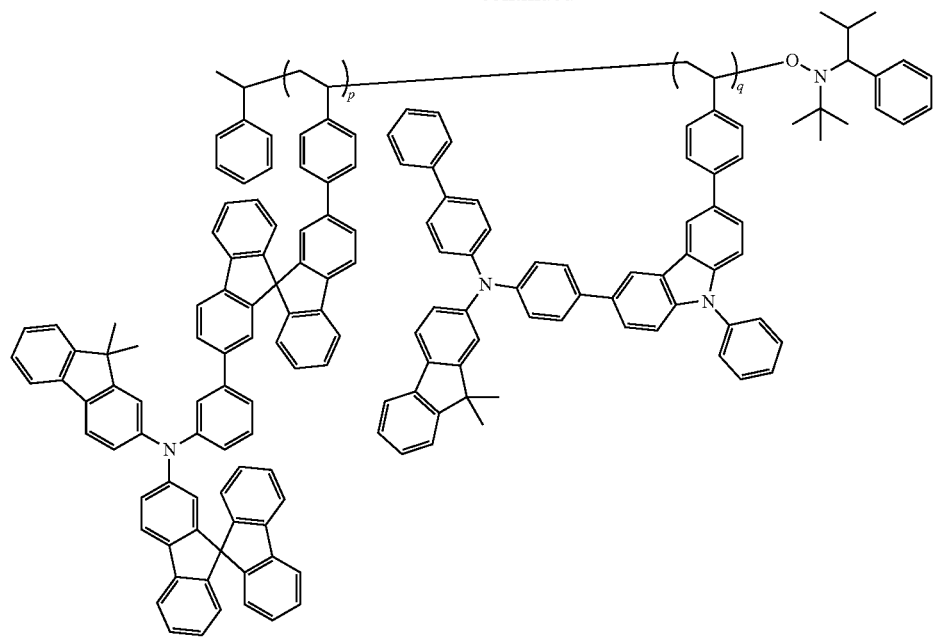
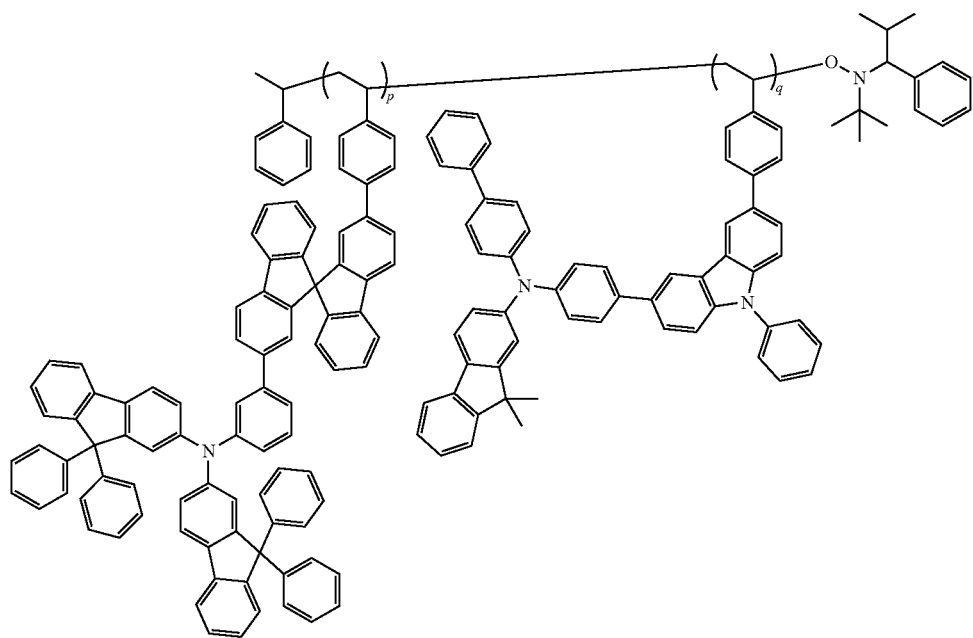

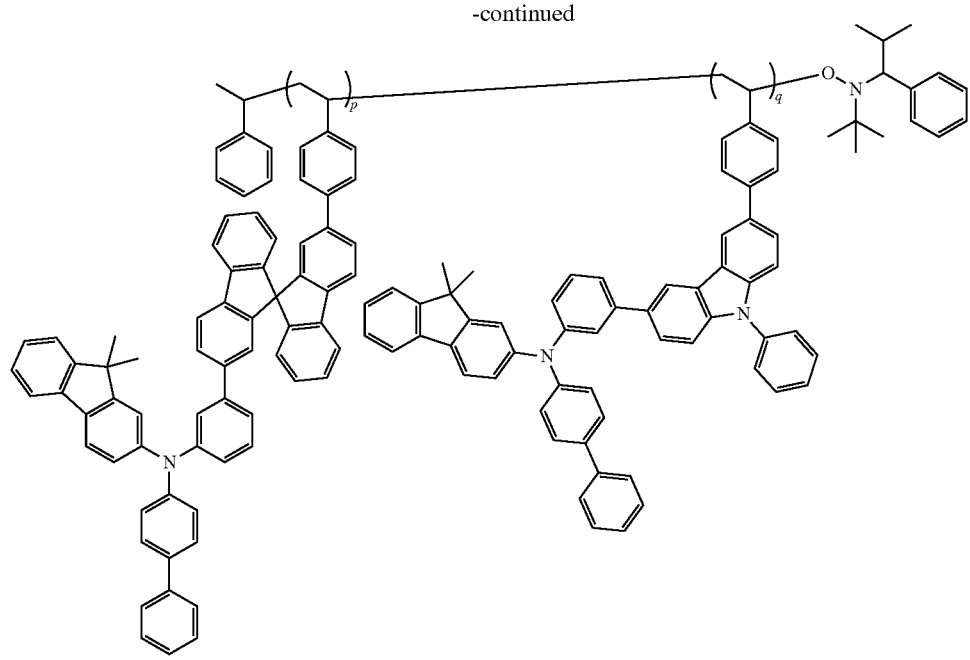
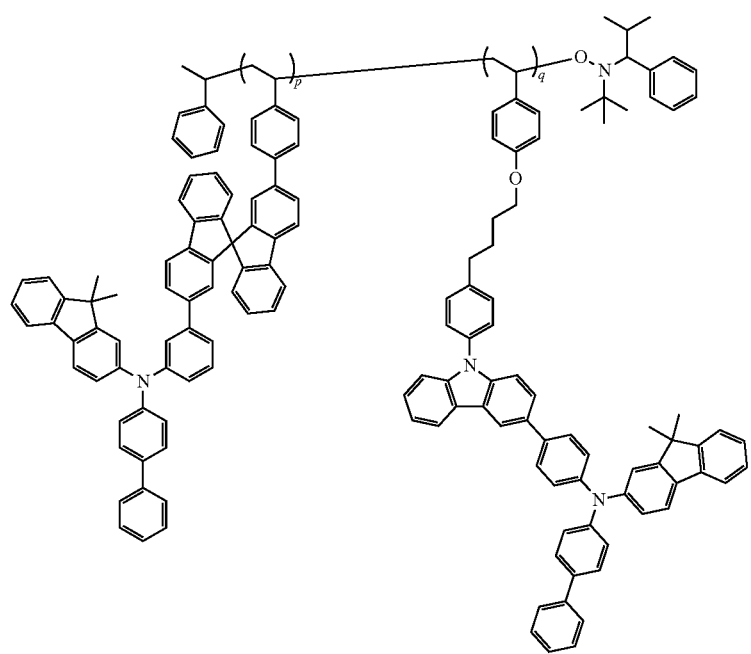

-continued
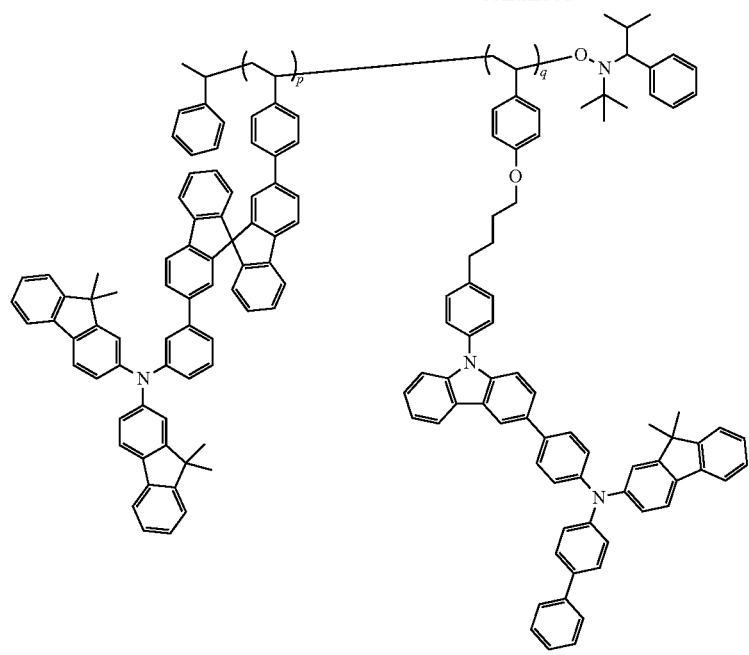
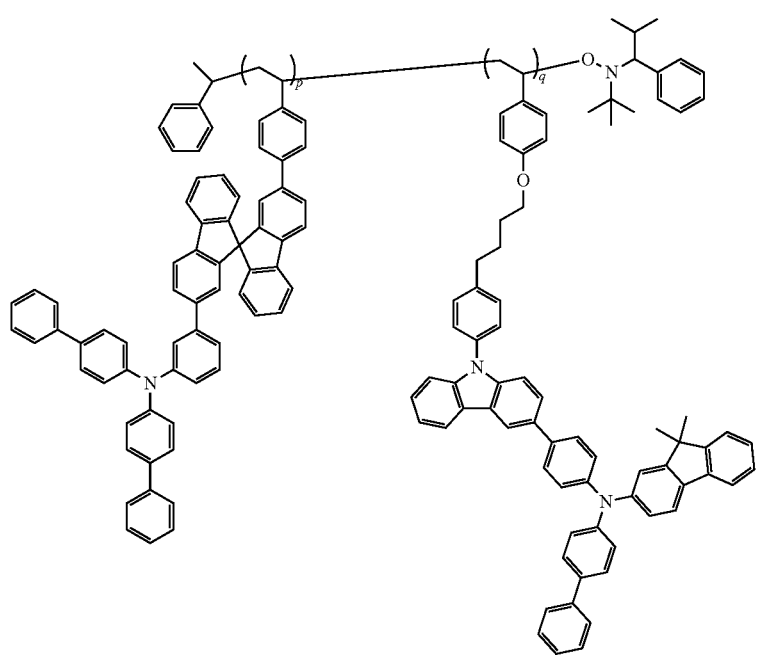

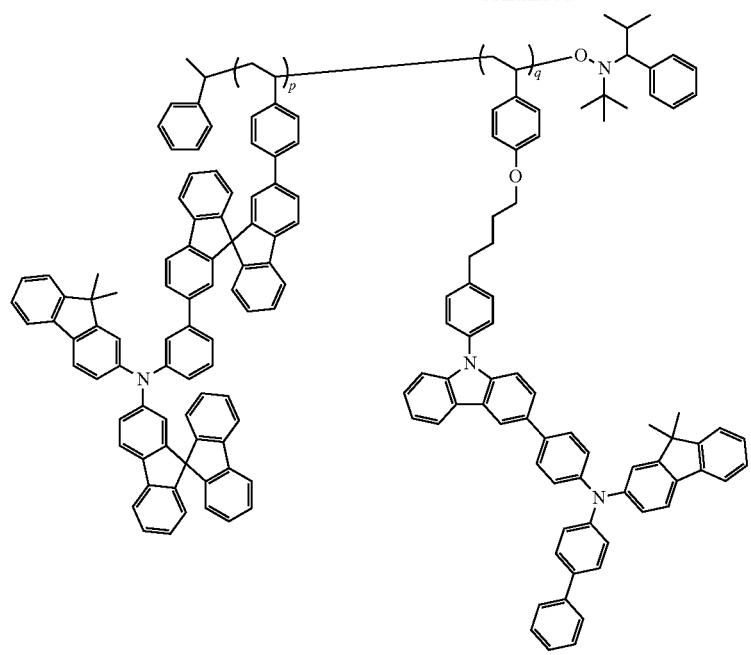
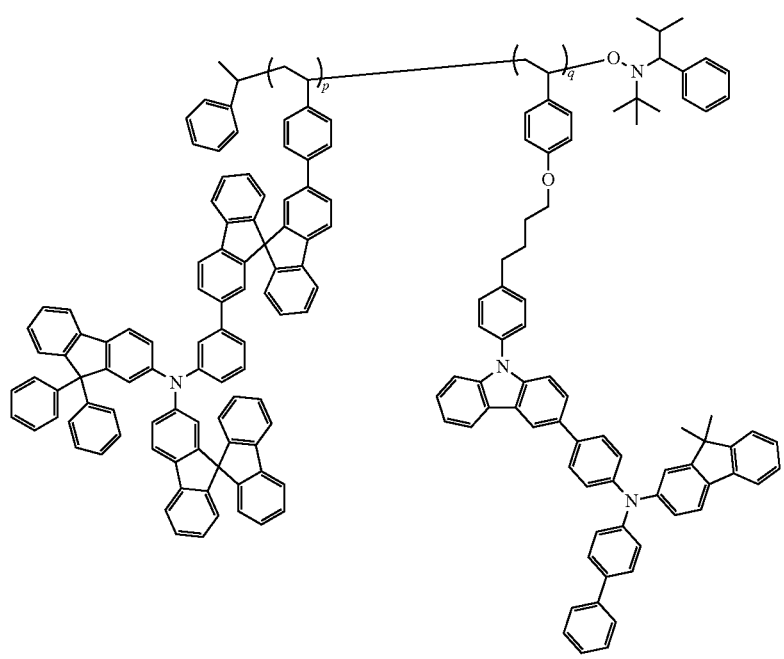

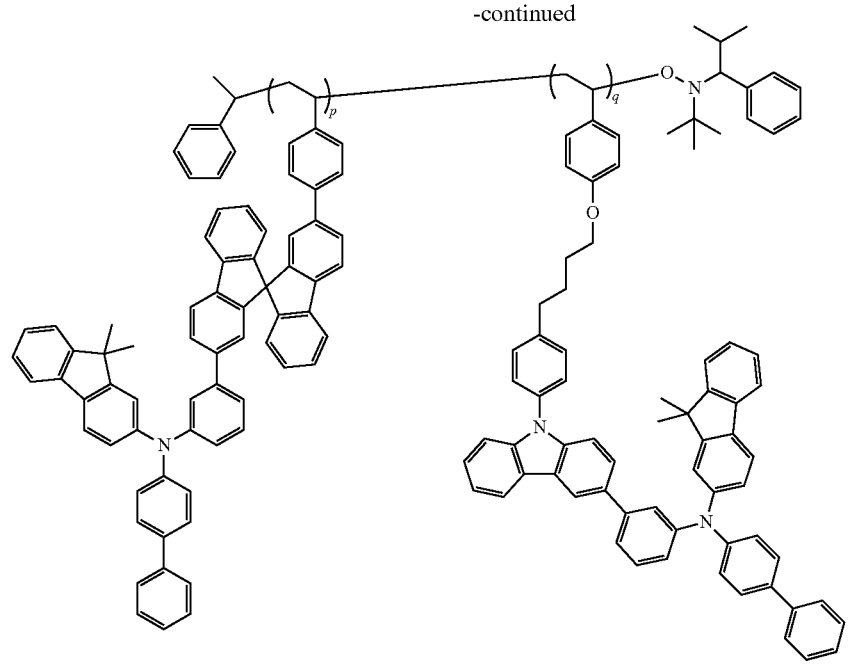
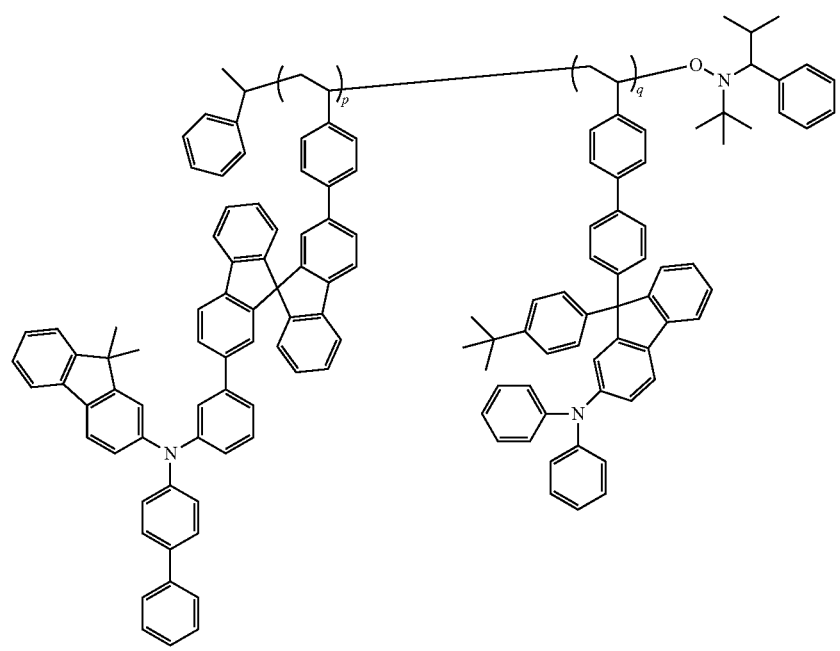

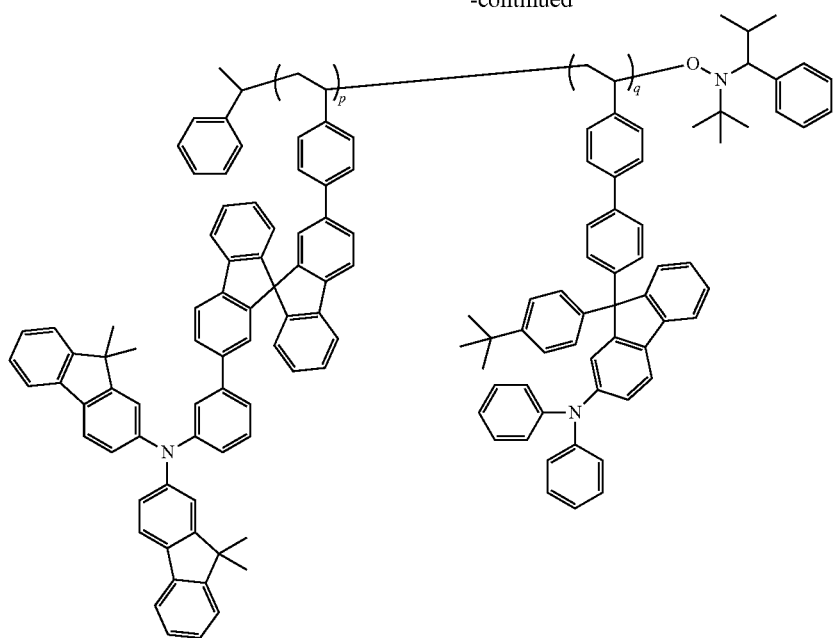
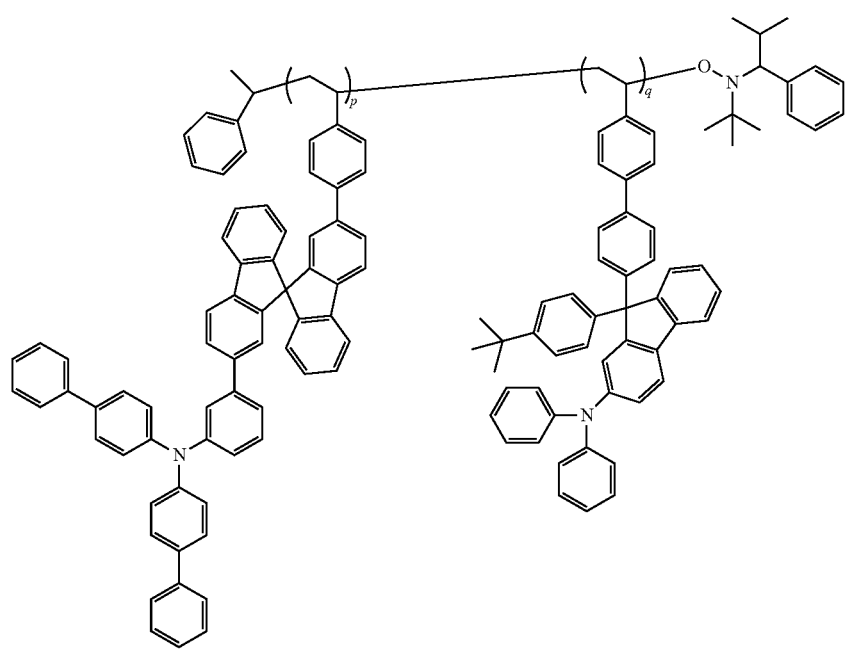

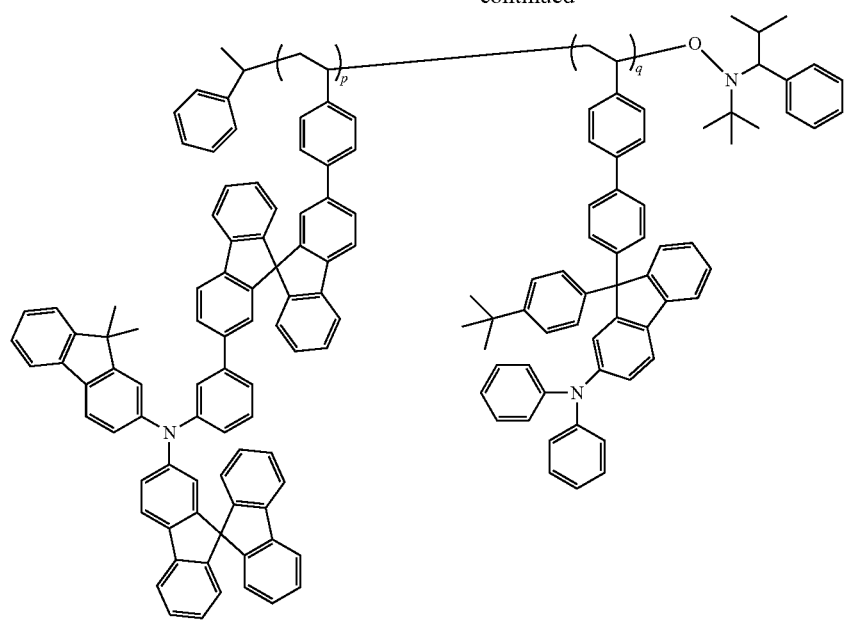
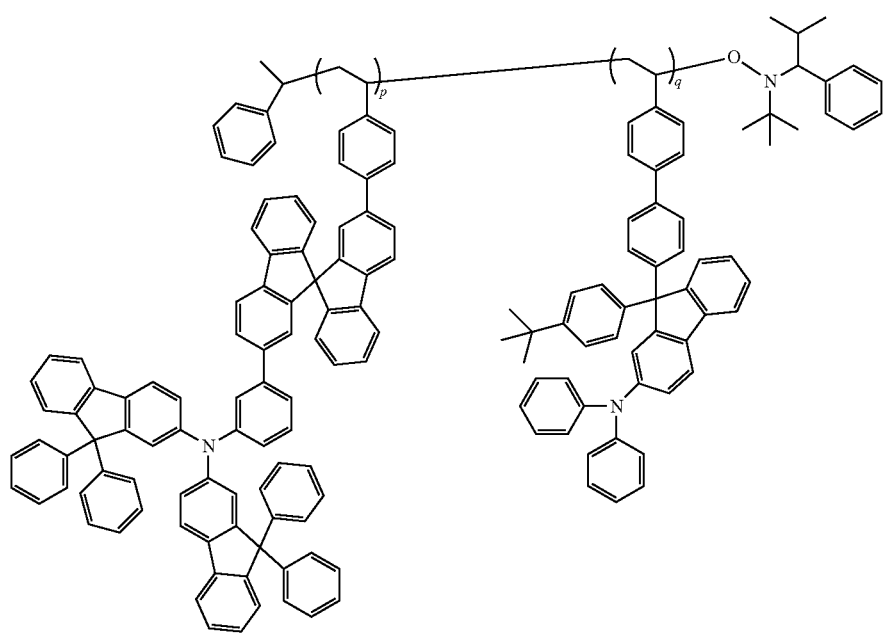

-continued
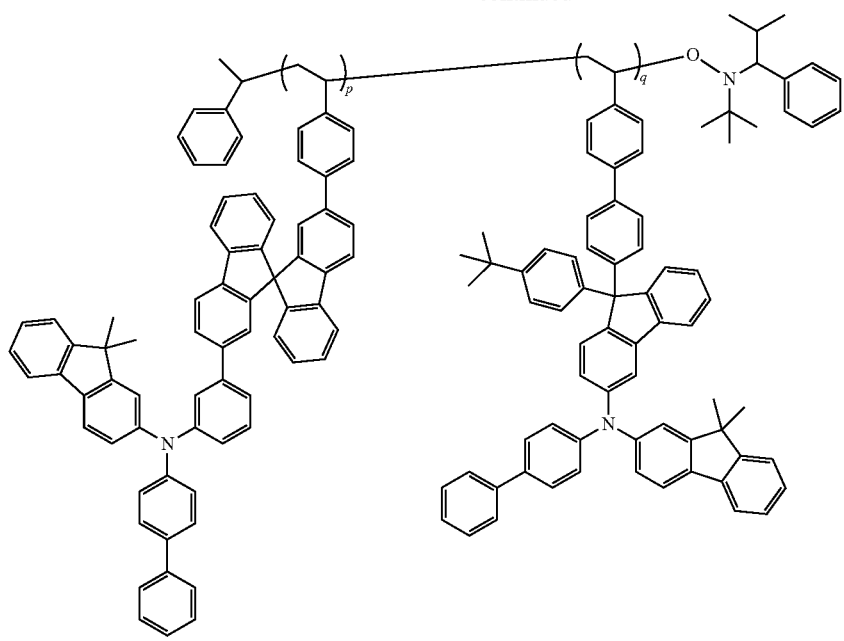
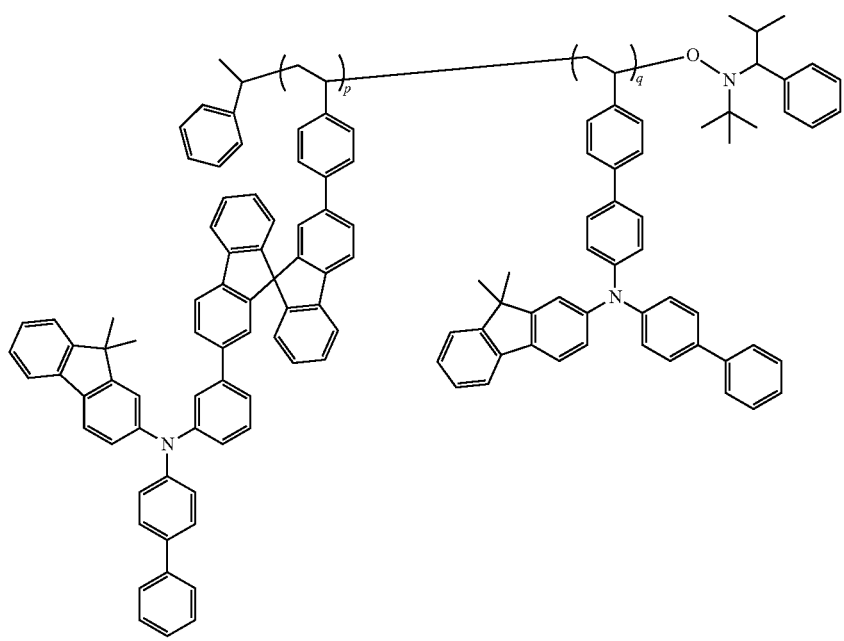

-continued
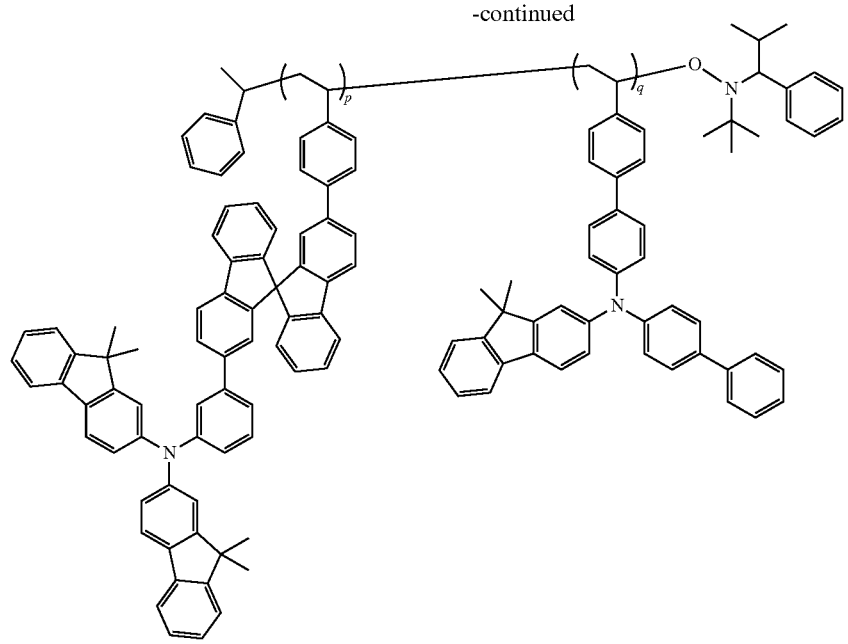
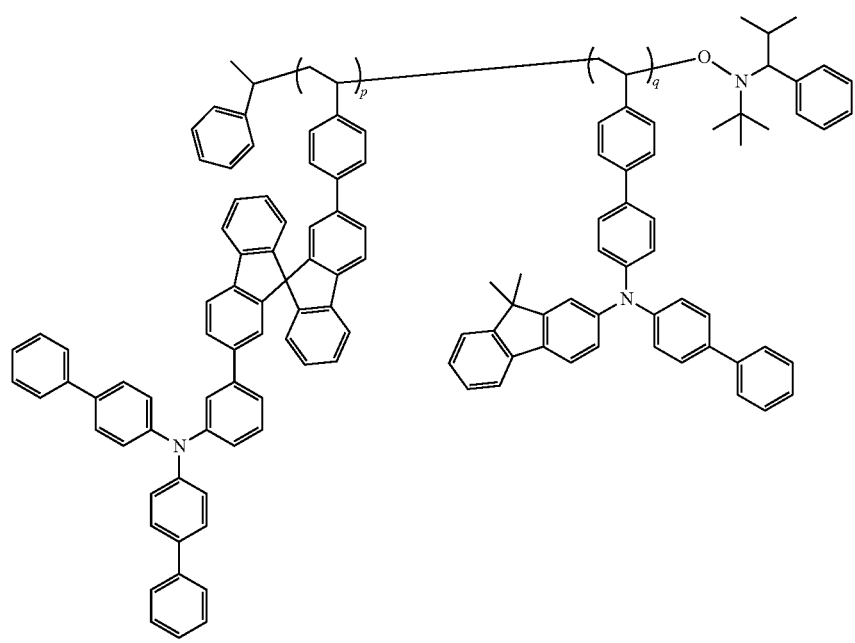

-continued
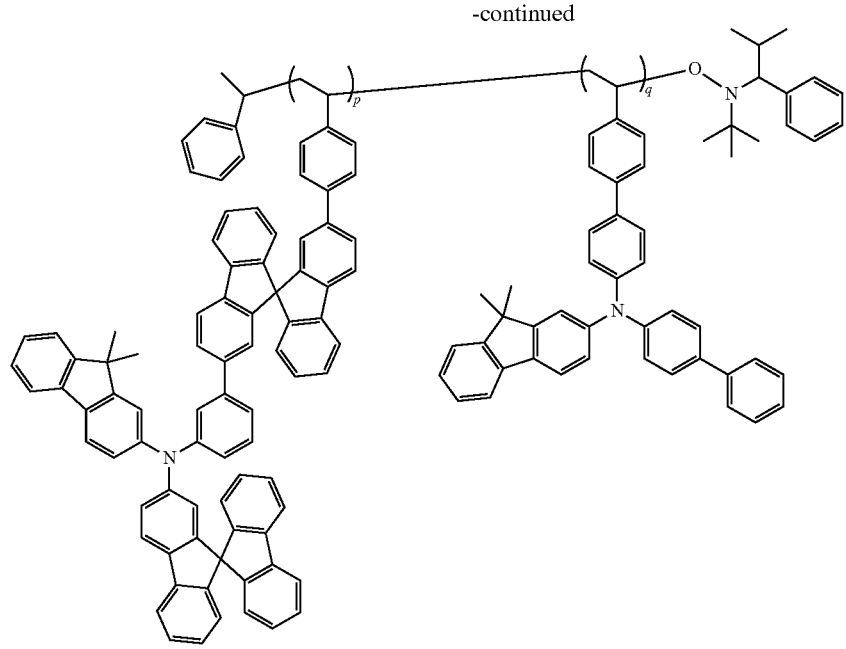
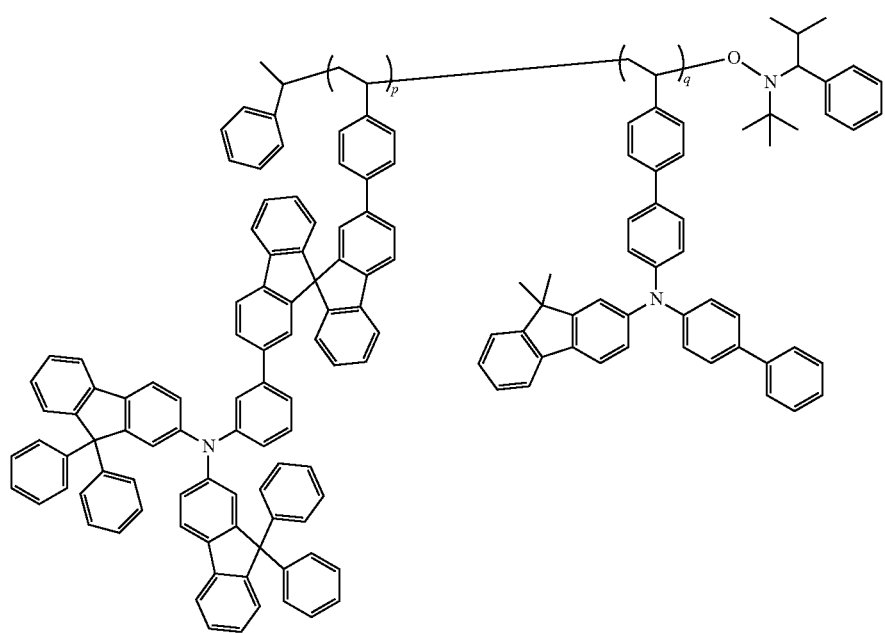

-continued
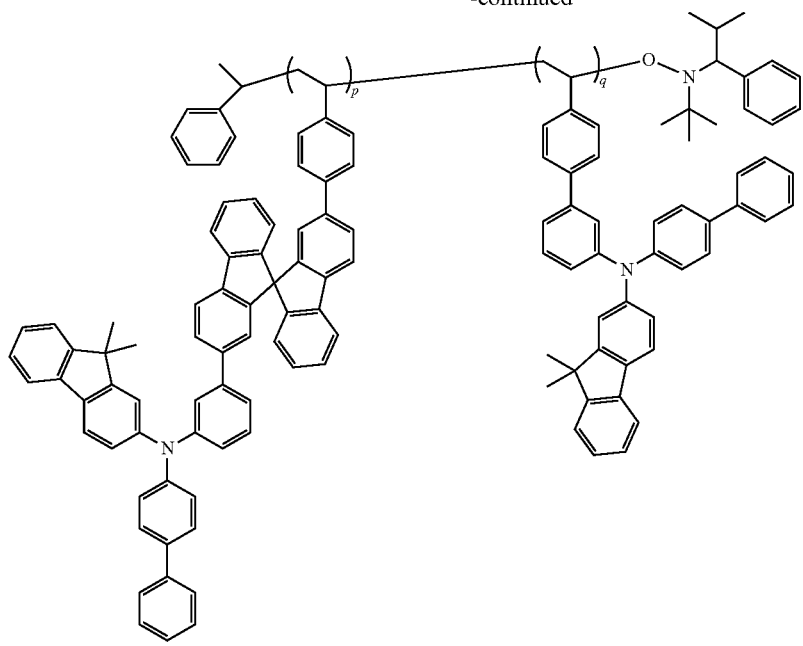
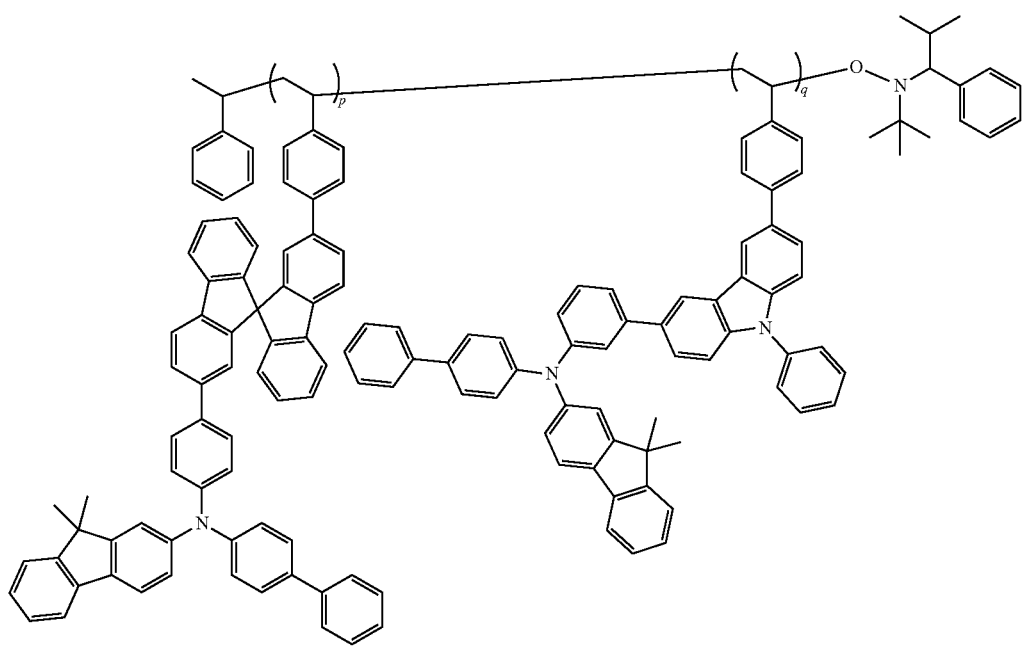

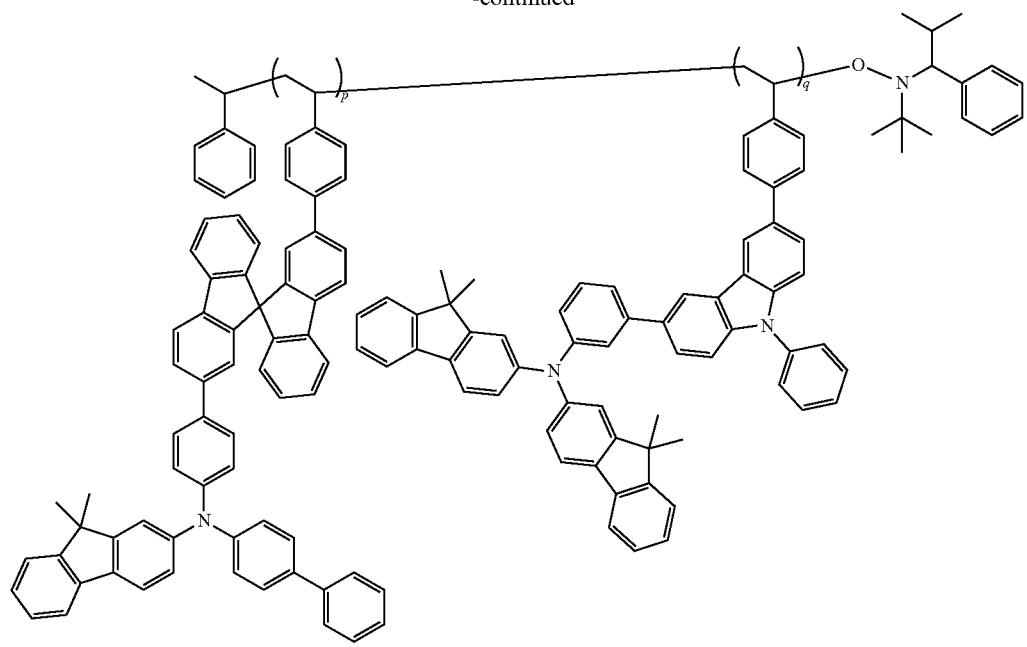
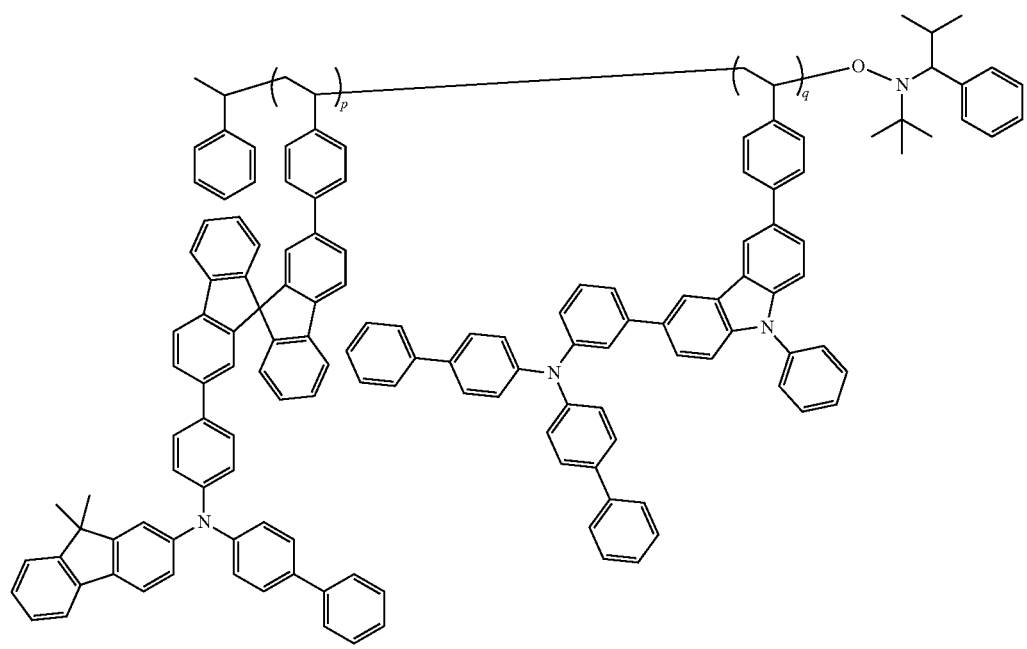

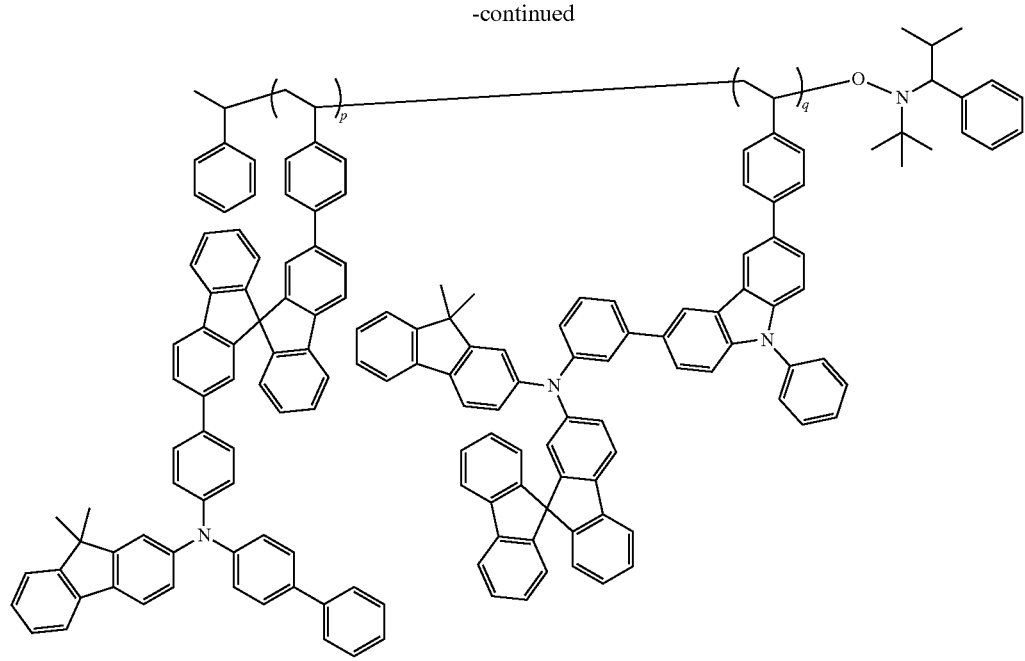
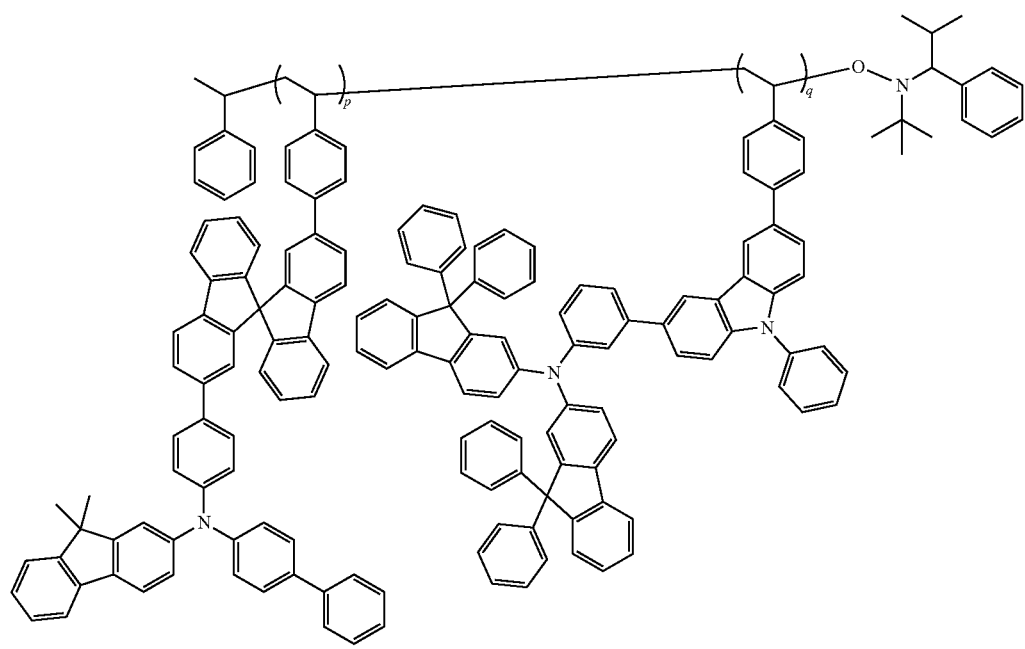

-continued
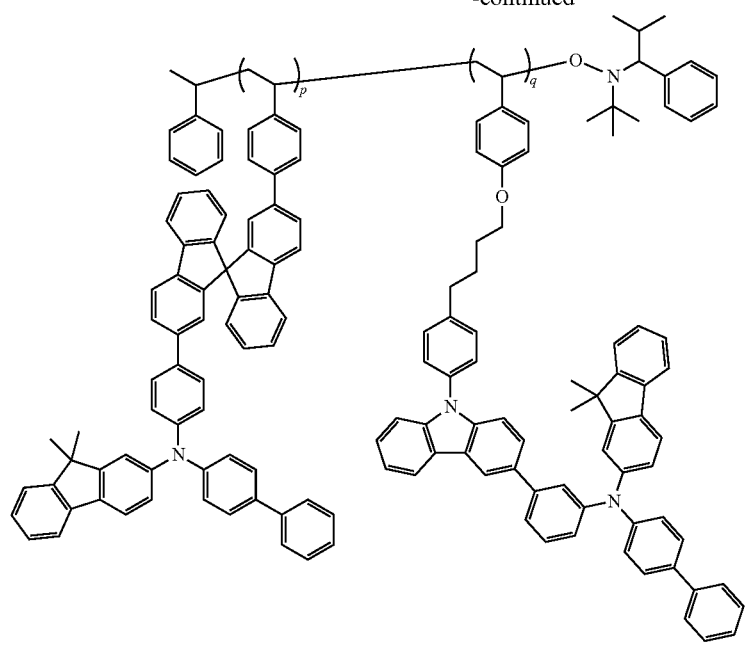
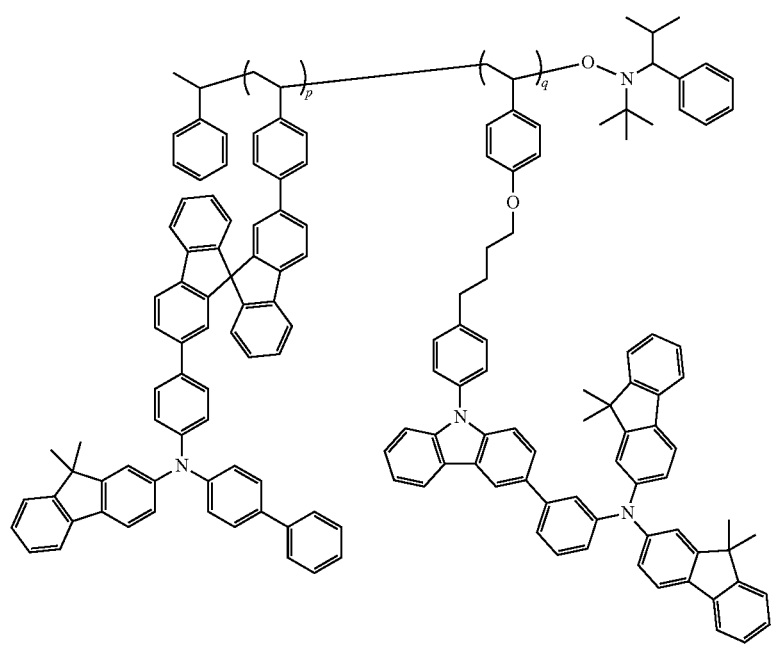

-continued
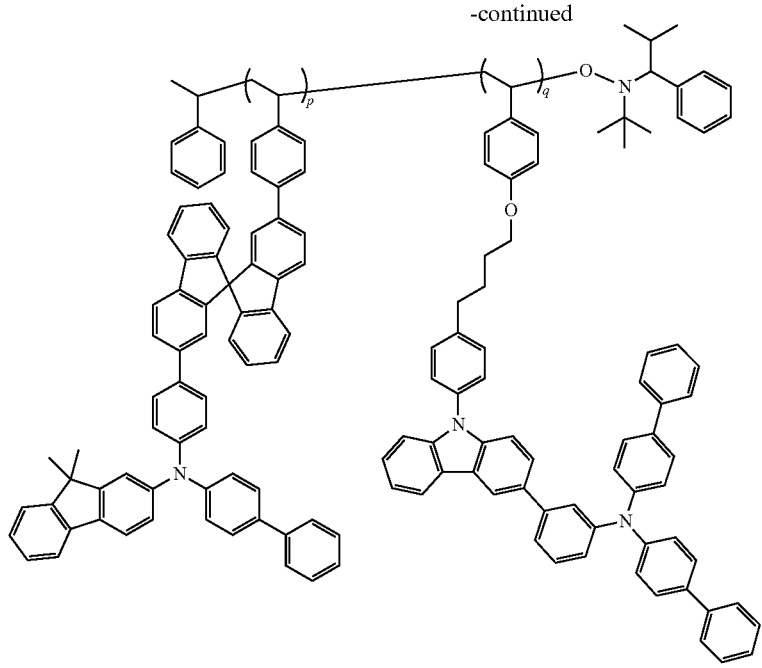
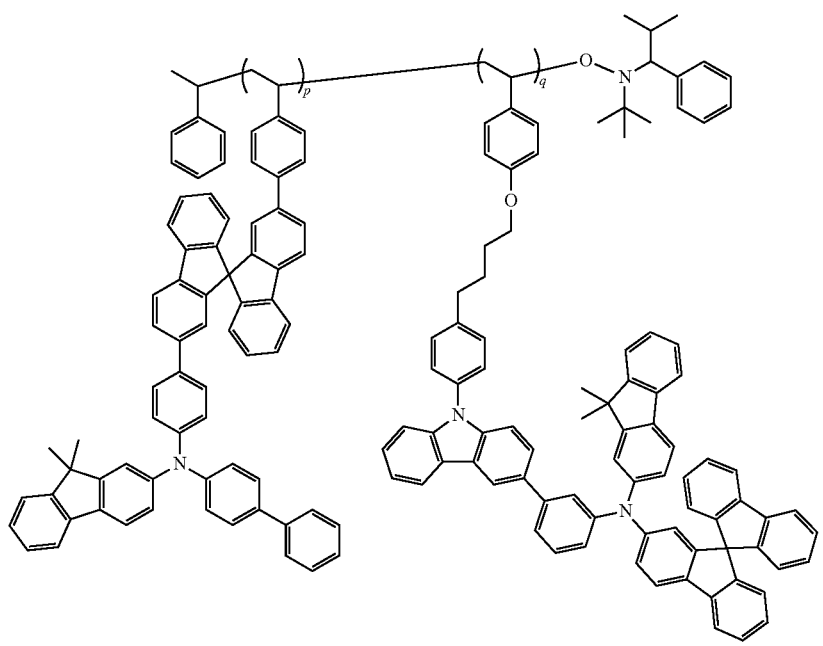

-continued
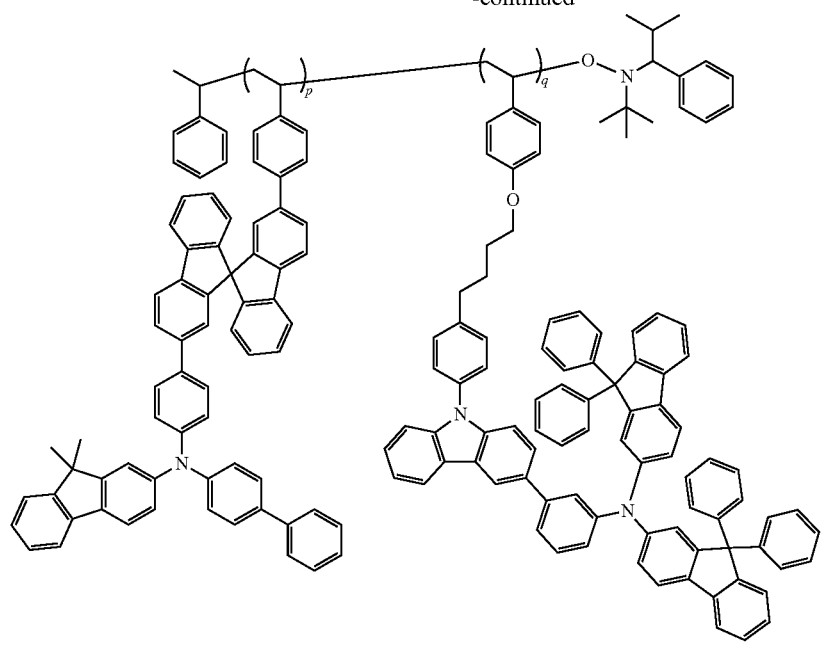
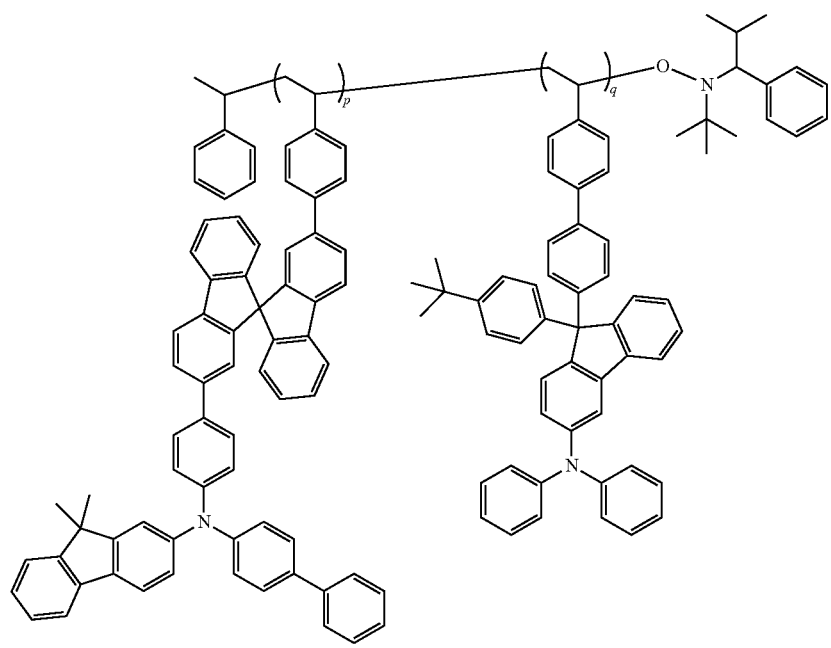

-continued
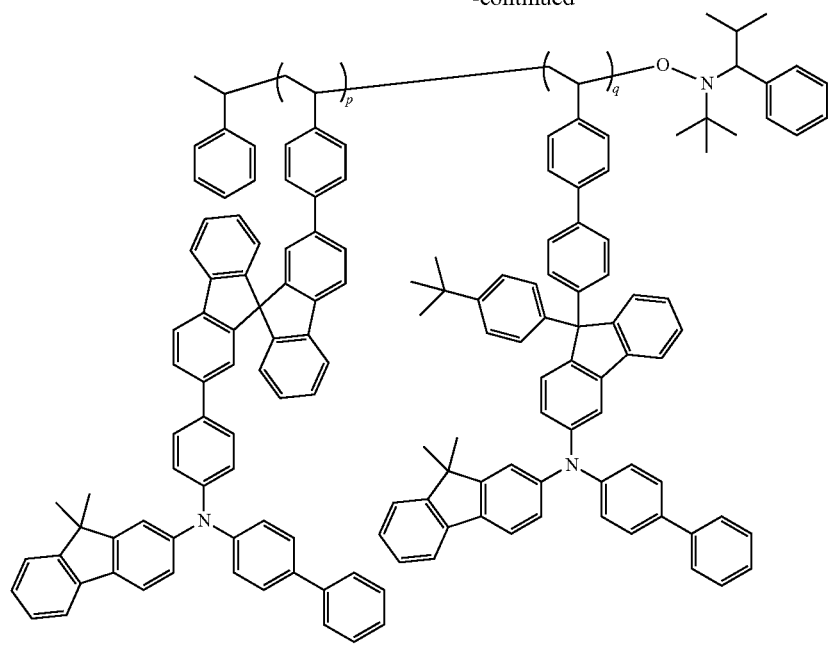
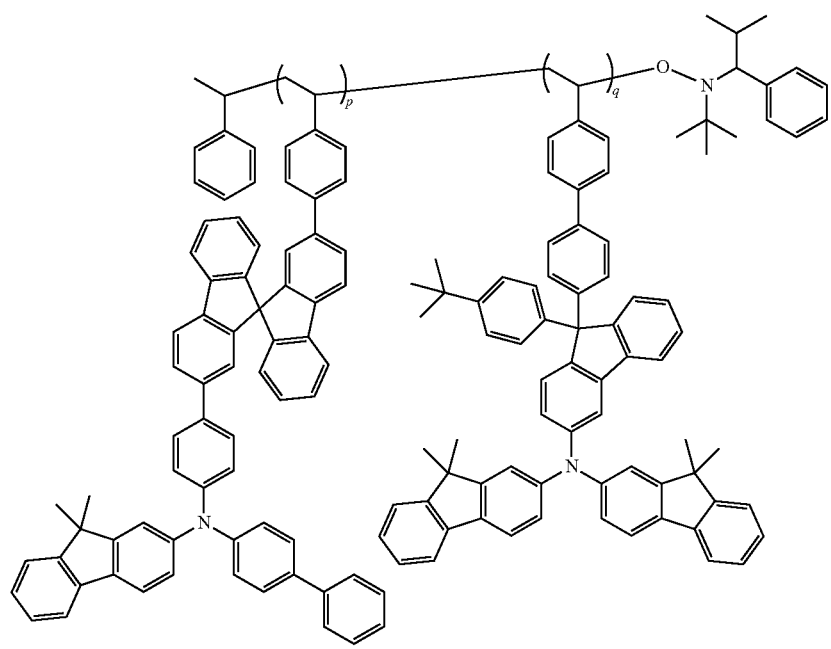

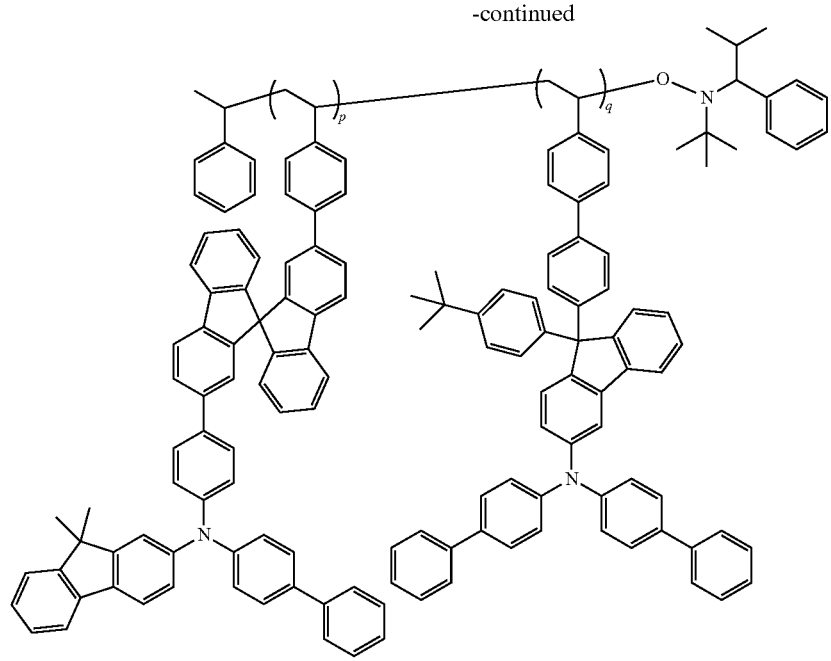
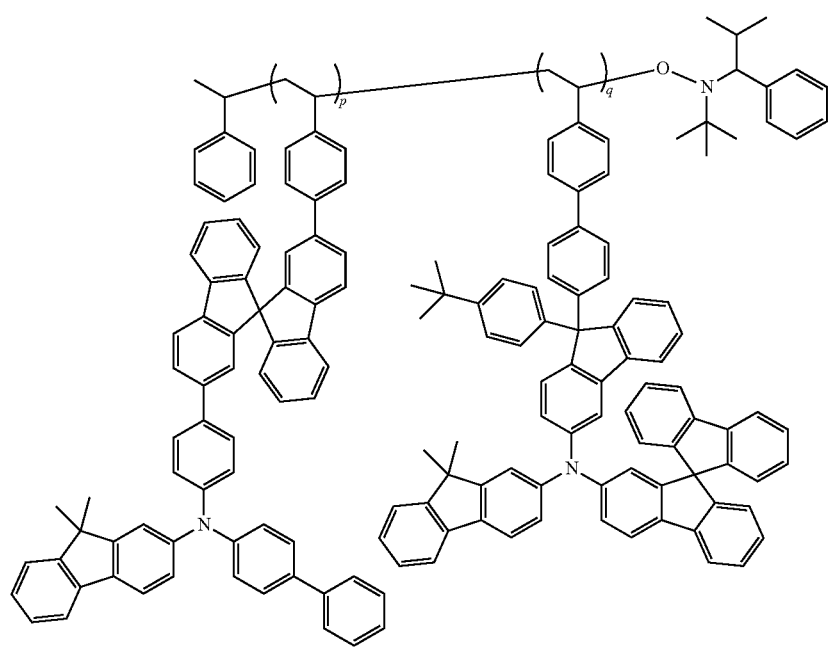

-continued
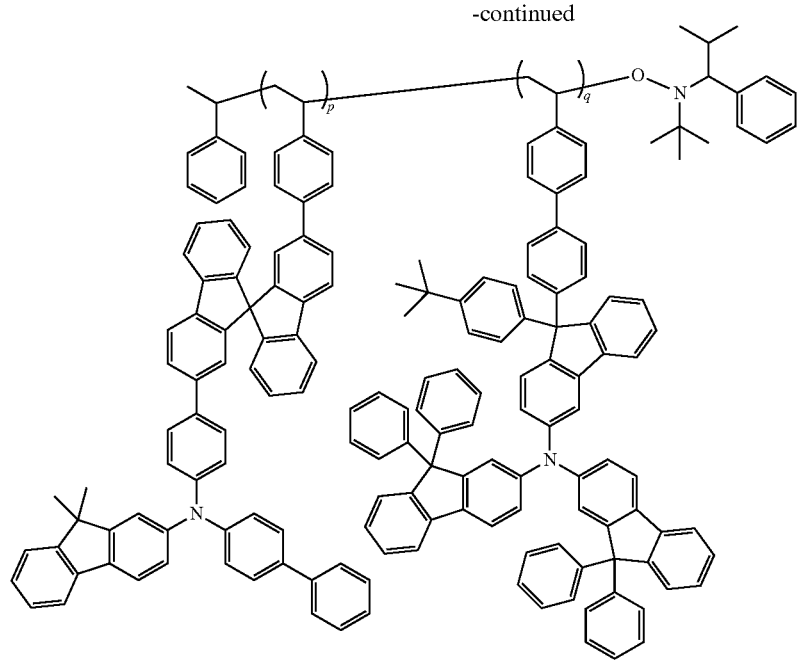
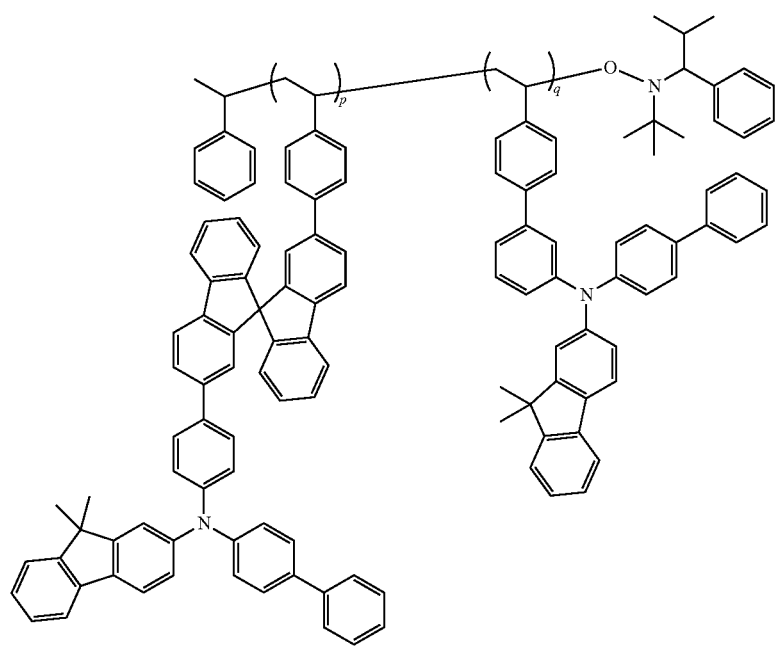

-continued
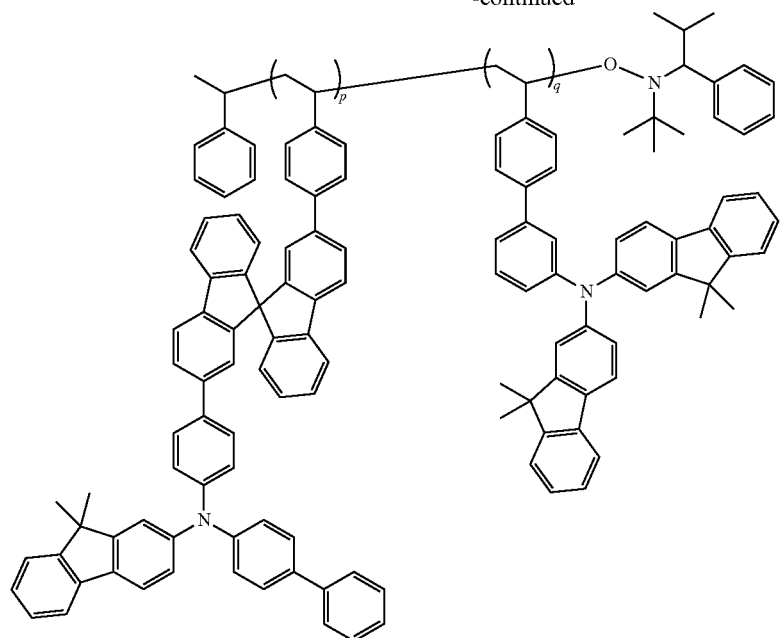
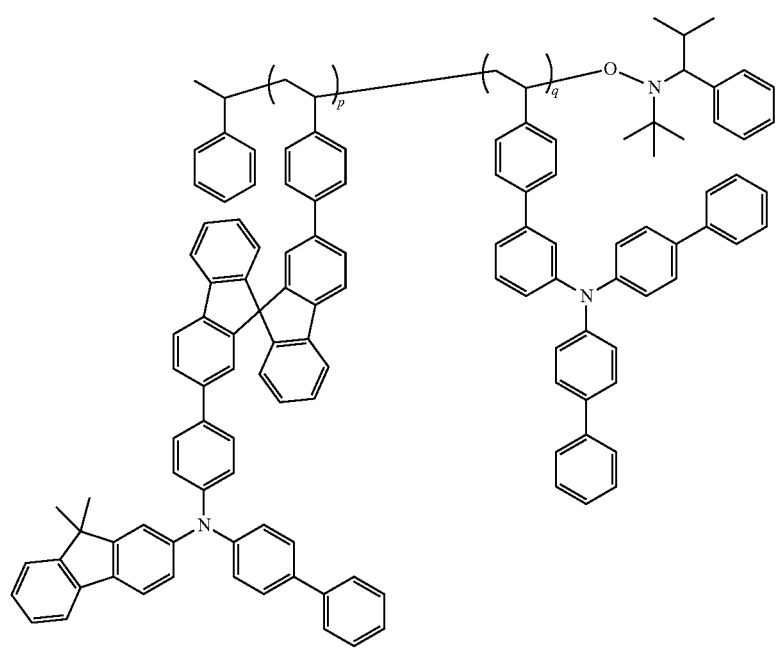

-continued
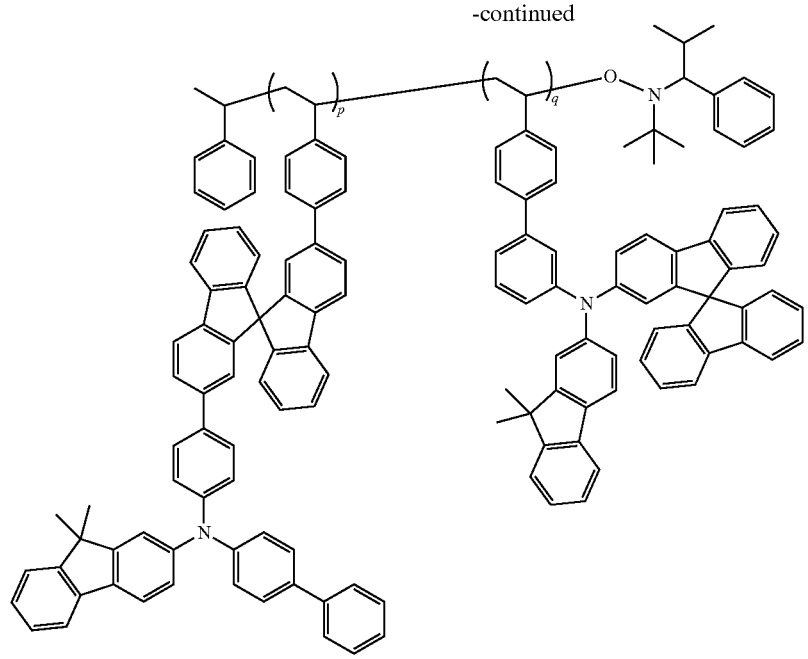
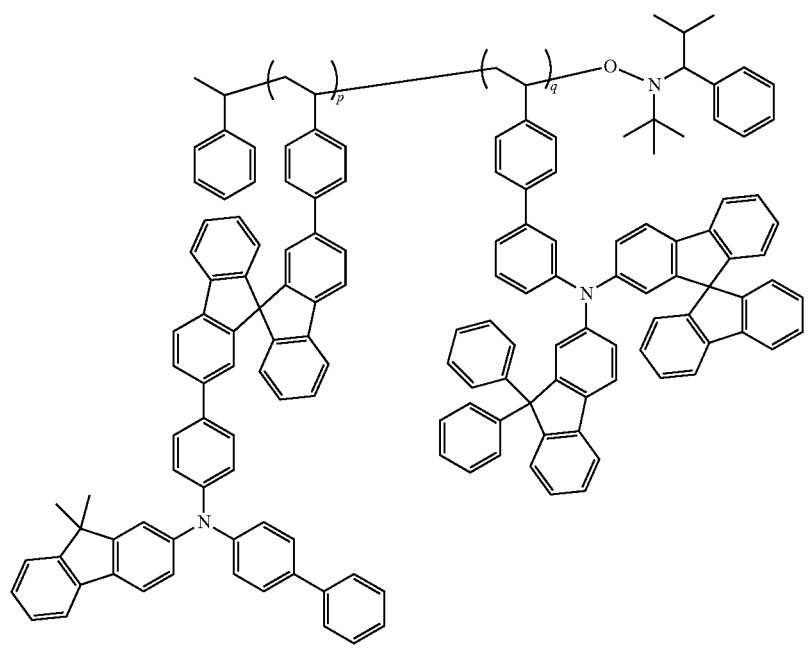
In the structures,
p is an integer from 1 to 100, and
q is an integer from 1 to 100.
In an exemplary embodiment of the present specification, the first unit of the Formula 1 is derived from a first monomer of the following Formula 1-A.

[Formula 1-A]

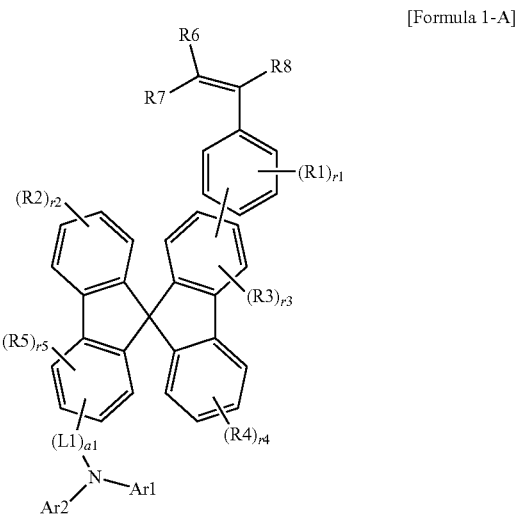

In Formula 1-A, L1, R1 to R8, r1 to r5, a1, Ar1, and Ar2 are the same as those defined in Formula 1.

In an exemplary embodiment of the present specification, the second unit of the Formula 2 is derived from a second monomer of the following Formula 2-A.

[Formula 2-A]

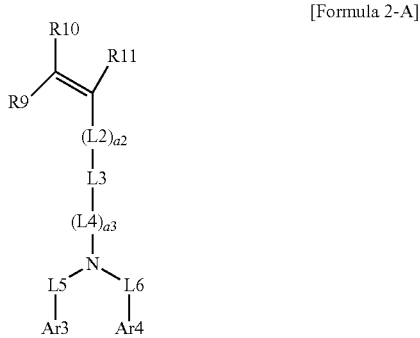

In Formula 2-A, L2 to L6, a2, a3, R9 to R11, Ar3, and Ar4 are the same as those defined in Formula 2.

The polymer according to an exemplary embodiment of the present specification may be prepared by polymerizing the first monomer of the Formula 1-A and the second monomer of the Formula 2-A as described above. Preferably, the polymer according to the present specification is a random copolymer of the first unit and the second unit.

The random copolymer means a copolymer in which two different monomers are bonded together in the same chain, but which are irregularly linked.

The polymer according to an exemplary embodiment of the present specification may include a parenthesis [ ] represented by a repeating number p, a parenthesis represented by a repeating number q, and an any additional comonomer, for example,

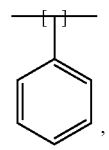

if present.

In the polymer, p and q are a molar ratio of the first unit and the second unit in the polymer, and the molar ratio of the polymers may be adjusted by adjusting a reaction molar ratio of the first monomer of the Formula 1-A and the second monomer of the Formula 2-A as described above. Preferably, the p:q is 90:10 to 10:90.

In an exemplary embodiment of the present specification, the polymer may have a number average molecular weight of 5,000 g/mol to 100,000 g/mol.

In an exemplary embodiment of the present specification, the polymer may have a molecular weight distribution of 1 to 10. Preferably, the polymer has a molecular weight distribution of 1 to 3.

A number average molecular weight (Mn) and a weight average molecular weight (Mw) of the molecular weight were measured by GPC using tetrahydrofuran (THF) as a solvent, and the molecular weight distribution means a numerical value obtained by dividing the weight average molecular weight (Mw) by the number average molecular weight (Mn), that is, the weight average molecular weight (Mw)/the number average molecular weight (Mn).

Specifically, in the present specification, the molecular weight was analyzed by GPC equipment. WATERS STYRAGEL HR3/HR4 (THF) was used as a column, and tetrahydrofuran (THF) (filtered with a 0.45 m filter and used) was used as a solvent. The molecular weight was measured at a flow rate of 1.0 mL/min and a sample concentration of 1 mg/mL. 100 μL of the sample was injected, and the column temperature was set to 40° C. A Waters RI detector was used as a detector, and a reference was set with polystyrene (PS). Data processing was performed by the Empower3 program.

The core structure of Formula 1 according to an exemplary embodiment of the present specification may be prepared as in the following Reaction Scheme 1, substituents may be bonded by methods known in the art, and the type, position, or number of substituents may be changed according to the technology known in the art.

<Reaction Scheme 1>

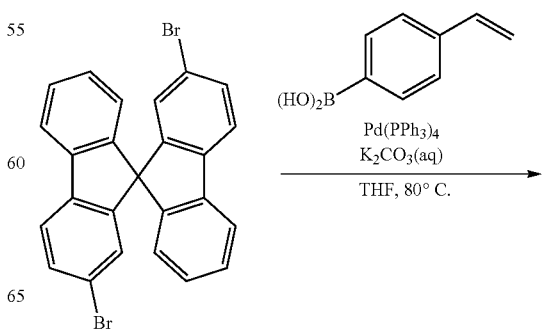

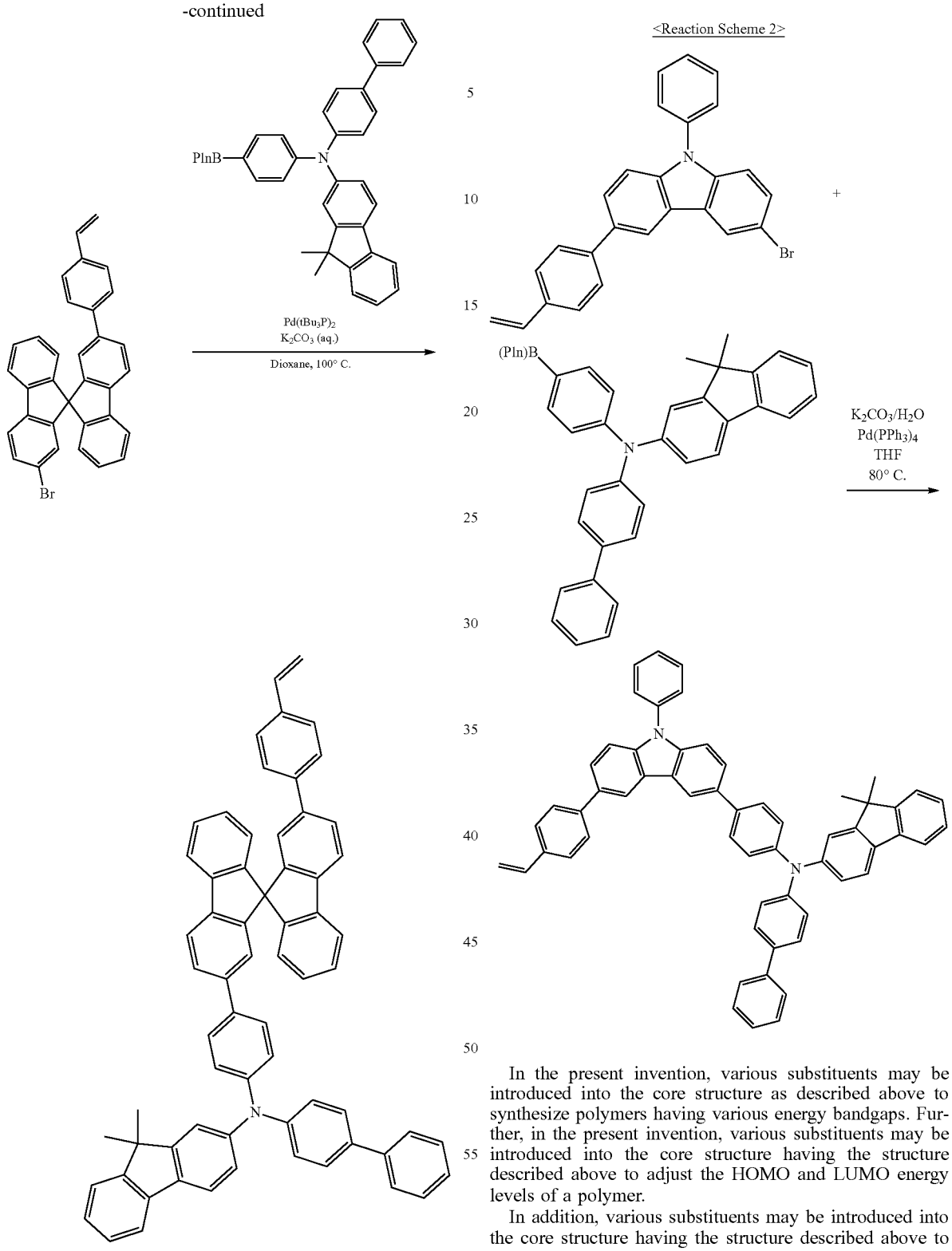

The core structure of Formula 2 according to an exemplary embodiment of the present specification may be prepared as in the following Reaction Scheme 2, substituents may be bonded by methods known in the art, and the type, position, or number of substituents may be changed according to the technology known in the art.

In the present invention, various substituents may be introduced into the core structure as described above to synthesize polymers having various energy bandgaps. Further, in the present invention, various substituents may be introduced into the core structure having the structure described above to adjust the HOMO and LUMO energy levels of a polymer.

In addition, various substituents may be introduced into the core structure having the structure described above to synthesize polymers having inherent characteristics of the introduced substituents. For example, a substituent usually used for a hole injection layer material, a hole transport layer material, a light emitting layer material, and an electron transport layer material, which are used for manufacturing an organic light emitting device, may be introduced into the core structure to synthesize a material which satisfies conditions required for each organic material layer.

The present specification provides a coating composition including the polymer.

In an exemplary embodiment of the present specification, the coating composition may further include a solvent.

In an exemplary embodiment of the present specification, the coating composition may be in a liquid phase. The "liquid phase" means that the composition is in a liquid state at room temperature under atmospheric pressure.

In an exemplary embodiment of the present specification, it is preferred that the solvent does not dissolve a material applied to a lower layer.

For example, when the coating composition is applied to a hole transport layer, there is an advantage in that a hole transport layer can be introduced into a solution process by using a solvent which does not dissolve a material of a lower layer (a hole injection layer or positive electrode).

In an exemplary embodiment of the present specification, examples of the solvent include: a chlorine-based solvent such as chloroform, methylene chloride, 1,2-dichloroethane, 1,1,2-trichloroethane, chlorobenzene, and o-dichlorobenzene; an ether-based solvent such as tetrahydrofuran and dioxane; an aromatic hydrocarbon-based solvent such as toluene, xylene, trimethylbenzene, and mesitylene; a ketone-based solvent such as acetone, methyl ethyl ketone, and cyclohexanone; an ester-based solvent such as ethyl acetate, butyl acetate, and ethyl cellosolve acetate; a polyhydric alcohol such as ethylene glycol, ethylene glycol monobutyl ether, ethylene glycol monoethyl ether, ethylene glycol monomethyl ether, dimethoxy ethane, propylene glycol, diethoxymethane, triethylene glycol monoethyl ether, glycerin, and 1,2-hexanediol and a derivative thereof; an alcohol-based solvent such as methanol, ethanol, propanol, isopropanol, and cyclohexanol; a sulfoxide-based solvent such as dimethyl sulfoxide; an amide-based solvent such as N-methyl-2-pyrrolidone and N,N-dimethylformamide; a benzoate-based solvent such as methyl benzoate, butyl benzoate, and 3-phenoxybenzoate; and a solvent such as tetralin, but the solvent can be used as long as the solvent can dissolve or disperse the compound according to an exemplary embodiment of the present specification, and is not limited thereto.

In another exemplary embodiment, the solvents may be used either alone or in a mixture of two or more solvents.

In still another exemplary embodiment, a boiling point of the solvent is preferably 40° C. to 250° C., and more preferably 60° C. to 230° C., but is not limited thereto.

In yet another exemplary embodiment, a viscosity of the single solvent or the mixed solvent is preferably 1 CP to 10 CP, and more preferably 3 CP to 8 CP, but is not limited thereto.

In still yet another exemplary embodiment, a concentration of the coating composition is preferably 0.1 wt/v % to 5 wt/v %, and more preferably 0.5 wt/v % to 2 wt/v %, but is not limited thereto.

An exemplary embodiment of the present specification provides a method for preparing a polymer, the method including: dissolving a first monomer of the following Formula A, a second monomer of the following Formula B, and an initiator in a solvent, and then performing a living radical polymerization.

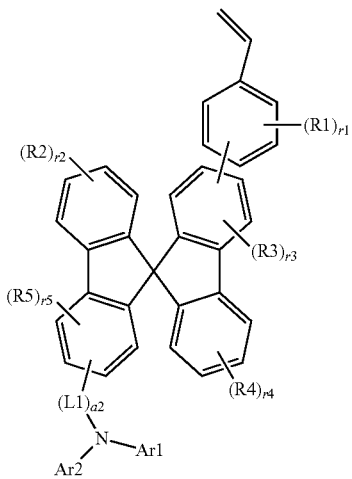

[Formula A]

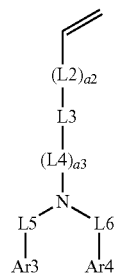

[Formula B]

In Formulae A and B,

L1, L2, and L4 to L6 are each independently a direct bond; —O—; a substituted or unsubstituted alkylene group; a substituted or unsubstituted arylene group; a substituted or unsubstituted divalent amine group; or a substituted or unsubstituted divalent heterocyclic group, L3 is a substituted or unsubstituted divalent carbazole group; a substituted or unsubstituted divalent fluorenyl group; or a substituted or unsubstituted phenylene group, a1, a2, and a3 are each an integer from 1 to 10, when a1 is 2 or higher, two or more L1's are the same as or different from each other, when a2 is 2 or higher, two or more L2's are the same as or different from each other, when a3 is 2 or higher, two or more L4's are the same as or different from each other, Ar1 to Ar4 are the same as or different from each other, and are each independently a substituted or unsubstituted alkyl group; a substituted or unsubstituted alkoxy group; a substituted or unsubstituted aryloxy group; a substituted or unsubstituted aryl group; or a substituted or unsubstituted heterocyclic group, R1 to R5 are the same as or different from each other, and are each independently hydrogen; deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group, r1, r2, and r4 are each an integer from 1 to 4, r3 and r5 are each an integer from 1 to 3, when r1 is 2 or higher, two or more R1's are the same as or different from each other, and when r2 is 2 or higher, two or more R2's are the same as or different from each other, when r3 is 2 or higher, two or more R3's are the same as or different from each other, when r4 is 2 or higher, two or more R4's are the same as or different from each other, and when r5 is 2 or higher, two or more R5's are the same as or different from each other.

A living radical polymerization method has a small number of side reactions such as a termination which may occur during polymerization, and thus has advantages in that a molecular weight can be predicted by amounts of monomer and initiator used, and the molecular weight distribution of a prepared polymer is narrow. Further, since the terminus is alive, the molecular weight is continuously increased when the monomer is added again.

An exemplary embodiment of the present specification can prepare a polymer having a target molecular weight by using the living radical polymerization method. Specifically, a polymer having a number average molecular weight of 5,000 g/mol to 100,000 g/mol can be prepared by using the living radical polymerization method.

In an exemplary embodiment of the present specification, a nitroxide-mediated polymerization (NMP), reversible addition-fragmentation chain transfer (RAFT), or atom transfer radical polymerization (ATRP) polymerization method may be used as the living radical polymerization. Specifically, an exemplary embodiment of the present specification may use the NMP polymerization.

An exemplary embodiment of the present specification uses a compound of the following Formula C as an initiator.

[Formula C]

In Formula C,

Ra to Rc are the same as or different from each other, and are each independently a substituted or unsubstituted alkyl group; a substituted or unsubstituted cycloalkyl group; a substituted or unsubstituted aryl group; or a substituted or unsubstituted heterocyclic group. In an exemplary embodiment of the present specification, Ra is a substituted or unsubstituted alkyl group.

In an exemplary embodiment of the present specification, Ra is an alkyl group which is unsubstituted or substituted with an aryl group.

In an exemplary embodiment of the present specification, Rb is a substituted or unsubstituted alkyl group.

In an exemplary embodiment of the present specification, Rb is an unsubstituted alkyl group.

In an exemplary embodiment of the present specification, Rb is a branched alkyl group.

In an exemplary embodiment of the present specification, Rc is a substituted or unsubstituted alkyl group.

In an exemplary embodiment of the present specification, Rc is an alkyl group which is unsubstituted or substituted with an aryl group.

An exemplary embodiment of the present specification provides an organic light emitting device including:

a first electrode;

a second electrode provided to face the first electrode; and an organic material layer having one or more layers provided between the first electrode and the second electrode, in which one or more layers of the organic material layer include the polymer.

The organic material layer of the organic light emitting device of the present invention may be composed of a single-layered structure, but may be composed of a multi-layered structure in which two or more organic material layers are stacked. For example, the organic light emitting device of the present invention may have a structure including a hole injection layer, a hole transport layer, a layer which injects and transports holes simultaneously, a light emitting layer, an electron transport layer, an electron injection layer, and the like as organic material layers. However, the structure of the organic light emitting device is not limited thereto, and may include a fewer or greater number of organic material layers.

In the organic light emitting device of the present invention, the organic material layer may include one or more layers of an electron transport layer, an electron injection layer, and a layer which injects and transports electrons simultaneously, and one or more layers of the layers may include the polymer.

In another organic light emitting device, the organic material layer may include an electron transport layer or an electron injection layer, and the electron transport layer or the electron injection layer may include the polymer of the formula.

In the organic light emitting device of the present invention, the organic material layer may include one or more layers of a hole injection layer, a hole transport layer, and a layer which injects and transports holes simultaneously, and one or more layers of the layers may include the polymer.

In still another organic light emitting device, the organic material layer may include a hole injection layer or a hole transport layer, and the hole transport layer or the hole injection layer may include the polymer.

In yet another exemplary embodiment, the organic material layer includes a light emitting layer, and the light emitting layer includes the polymer. As an example, the polymer may be included as a dopant of a light emitting layer.

In an exemplary embodiment of the present specification, the organic material layer including the polymer is a hole transport layer, a hole injection layer, or a layer which transports and injects holes simultaneously.

In an exemplary embodiment of the present specification, the first electrode is a positive electrode, and the second electrode is a negative electrode.

According to another exemplary embodiment, the first electrode is a negative electrode, and the second electrode is a positive electrode.

The organic light emitting device of the present invention may be stacked as a structure in the following examples.

(1) Positive electrode/Hole transport layer/Light emitting layer/Negative electrode (2) Positive electrode/Hole injection layer/Hole transport layer/Light emitting layer/Negative electrode (3) Positive electrode/Hole injection layer/Hole buffer layer/Hole transport layer/Light emitting layer/Negative electrode (4) Positive electrode/Hole transport layer/Light emitting layer/Electron transport layer/Negative electrode (5) Positive electrode/Hole transport layer/Light emitting layer/Electron transport layer/Electron injection layer/Negative electrode (6) Positive electrode/Hole injection layer/Hole transport layer/Light emitting layer/Electron transport layer/Negative electrode (7) Positive electrode/Hole injection layer/Hole transport layer/Light emitting layer/Electron transport layer/Electron injection layer/Negative electrode (8) Positive electrode/Hole injection layer/Hole buffer layer/Hole transport layer/Light emitting layer/Electron transport layer/Negative electrode (9) Positive electrode/Hole injection layer/Hole buffer layer/Hole transport layer/Light emitting layer/Electron transport layer/Electron injection layer/Negative electrode

(10) Positive electrode/Hole transport layer/Electron blocking layer/Light emitting layer/Electron transport layer/Negative electrode

(11) Positive electrode/Hole transport layer/Electron blocking layer/Light emitting layer/Electron transport layer/Electron injection layer/Negative electrode

(12) Positive electrode/Hole injection layer/Hole transport layer/Electron blocking layer/Light emitting layer/Electron transport layer/Negative electrode

(13) Positive electrode/Hole injection layer/Hole transport layer/Electron blocking layer/Light emitting layer/Electron transport layer/Electron injection layer/Negative electrode

(14) Positive electrode/Hole transport layer/Light emitting layer/Hole blocking layer/Electron transport layer/Negative electrode

(15) Positive electrode/Hole transport layer/Light emitting layer/Hole blocking layer/Electron transport layer/Electron injection layer/Negative electrode

(16) Positive electrode/Hole injection layer/Hole transport layer/Light emitting layer/Hole blocking layer/Electron transport layer/Negative electrode

(17) Positive electrode/Hole injection layer/Hole transport layer/Light emitting layer/Hole blocking layer/Electron transport layer/Electron injection layer/Negative electrode

(18) Positive electrode/Hole injection layer/Hole transport layer/Electron blocking layer/Light emitting layer/Hole blocking layer/Electron injection and transport layers/Negative electrode The structure of the organic light emitting device of the present invention may have a structure illustrated in FIG. 1, but is not limited thereto.

FIG. 1 illustrates an example of an organic light emitting device composed of a substrate 1, a positive electrode 2, a hole transport layer 3, a light emitting layer 4, and a negative electrode 5.

FIG. 2 illustrates an example of an organic light emitting device composed of a substrate 1, a positive electrode 2, a hole injection layer 6, a hole transport layer 3, a light emitting layer 4, an electron transport layer 7, an electron injection layer 8, and a negative electrode 5.

The organic light emitting device of the present invention may be manufactured using typical manufacturing methods and materials of an organic light emitting device, except that the above-described polymer is used to form an organic material layer having one or more layers.

For example, the organic light emitting device according to the present invention may be manufactured by depositing a metal or a metal oxide having conductivity, or an alloy thereof on a substrate to form a positive electrode, forming an organic material layer having one or more layers selected from the group consisting of a hole injection layer, a hole transport layer, a layer which transports and injects holes simultaneously, a light emitting layer, an electron transport layer, an electron injection layer, and a layer which transports and injects electrons simultaneously, thereon, and then depositing a material, which may be used as a negative electrode, thereon, by using a physical vapor deposition (PVD) method such as sputtering or e-beam evaporation. In addition to the method described above, an organic light emitting device may also be made by sequentially depositing a negative electrode material, an organic material layer, and a positive electrode material on a substrate.

The polymer may be formed as an organic material layer by not only a vacuum deposition method, but also a solution application method when an organic light emitting device is manufactured. Here, the solution application method means spin coating, dip coating, inkjet printing, screen printing, a spray method, roll coating, and the like, but is not limited thereto.

The organic material layer may have a multi-layered structure including a hole injection layer, a hole transport layer, a light emitting layer, and an electron transport layer, and the like, but is not limited thereto and may have a single-layered structure. Further, the organic material layer may be manufactured to include a fewer number of layers by a method such as a solvent process, for example, spin coating, dip coating, doctor blading, screen printing, inkjet printing, or a thermal transfer method, using various polymer materials, instead of a deposition method.

The positive electrode is an electrode which injects holes, and as a positive electrode material, materials having a high work function are usually preferred so as to facilitate the injection of holes into an organic material layer. Specific examples of the positive electrode material which may be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as $ZnO:Al$ or $SnO_2:Sb$; a conductive polymer, such as poly(3-methylthiophene), poly[3,4-(ethylene-1,2-dioxy)thiophene] (PEDOT), polypyrrole, and polyaniline; and the like, but are not limited thereto.

The negative electrode is an electrode which injects electrons, and as a negative electrode material, materials having a low work function are usually preferred so as to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which serves to facilitate the injection of holes from a positive electrode to a light emitting layer, and a hole injection material is preferably a material which may proficiently accept holes from a positive electrode at a low voltage, and the highest occupied molecular orbital (HOMO) of the hole injection material is preferably a value between the work function of the positive electrode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto. The hole injection layer may have a thickness of 1 nm to 150 nm. When the hole injection layer has a thickness of 1 nm or more, there is an advantage in that it is possible to prevent hole injection characteristics from deteriorating, and when the hole injection layer has a thickness of 150 nm or less, there is an advantage in that it is possible to prevent the driving voltage from being increased in order to improve the movement of holes due to the too thick hole injection layer.

The hole transport layer may serve to facilitate the transport of holes. A hole transport material is suitably a material having high hole mobility which may accept holes from a positive electrode or a hole injection layer and transfer the holes to a light emitting layer. The above-described polymer may be used in the hole transport layer.

In an exemplary embodiment of the present specification, a hole buffer layer may be additionally provided between a hole injection layer and a hole transport layer, and materials known in the art may be used in the hole buffer layer.

In an exemplary embodiment of the present specification, an electron blocking layer may be provided between a hole transport layer and a light emitting layer. For the electron blocking layer, materials known in the art may be used.

The light emitting layer may emit red, green, or blue light, and may be composed of a phosphorescent material or a fluorescent material. The light emitting material is a material which may accept holes and electrons from a hole transport layer and an electron transport layer, respectively, and combine the holes and the electrons to emit light in a visible ray region, and is preferably a material having high quantum efficiency for fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene) (PPV)-based polymers; spiro compounds; polyfluorene, lubrene, and the like, but are not limited thereto.

Examples of the host material for the light emitting layer include fused aromatic ring derivatives, or hetero ring-containing compounds, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, and the like, but the examples thereof are not limited thereto.

When the light emitting layer emits red light, it is possible to use a phosphorescent material such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP), or a fluorescent material such as tris(8-hydroxyquinolino)aluminum ($Alq_3$) as a light emitting dopant, but the light emitting dopant is not limited thereto. When the light emitting layer emits green light, it is possible to use a phosphorescent material such as fac tris(2-phenylpyridine)iridium ($Ir(ppy)_3$), or a fluorescent material such as tris(8-hydroxyquinolino)aluminum ($Alq_3$), as the light emitting dopant, but the light emitting dopant is not limited thereto. When the light emitting layer emits blue light, it is possible to use a phosphorescent material such as (4,6-$F_2ppy)_2$Irpic, or a fluorescent material such as spiro-DPVBi, spiro-6P, distyryl benzene (DSB), distyryl arylene (DSA), a PFO-based polymer or a PPV-based polymer as the light emitting dopant, but the light emitting dopant is not limited thereto.

In an exemplary embodiment of the present specification, a hole blocking layer may be provided between an electron transport layer and a light emitting layer, and materials known in the art may be used in the hole blocking layer.

The electron transport layer may serve to facilitate the transport of electrons. An electron transport material is suitably a material having high electron mobility which may proficiently accept electrons from a negative electrode and transfer the electrons to a light emitting layer. Specific examples thereof include: Al complexes of 8-hydroxyquinoline; complexes including $Alq_3$; organic radical compounds; hydroxyflavone-metal complexes; and the like, but are not limited thereto. The electron transport layer may have a thickness of 1 nm to 50 nm. When the electron transport layer has a thickness of 1 nm or more, there is an advantage in that it is possible to prevent electron transport characteristics from deteriorating, and when the electron transport layer has a thickness of 50 nm or less, there is an advantage in that it is possible to prevent the driving voltage from being increased in order to improve the movement of electrons due to the too thick electron transport layer.

The electron injection layer may serve to facilitate the injection of electrons. An electron injection material is preferably a compound which has a capability of transporting electrons, an effect of injecting electrons from a negative electrode, and an excellent effect of injecting electrons into a light emitting layer or a light emitting material, prevents excitons produced from a light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato)(o-cresolato) gallium, bis(2-methyl-8-quinolinato)(1-naphtholato) aluminum, bis(2-methyl-8-quinolinato)(2-naphtholato) gallium, and the like, but are not limited thereto.

The hole blocking layer is a layer which blocks holes from reaching a negative electrode, and may be generally formed under the same conditions as those of the hole injection layer. Specific examples thereof include oxadiazole derivatives or triazole derivatives, phenanthroline derivatives, BCP, aluminum complexes, and the like, but are not limited thereto.

An exemplary embodiment of the present specification provides a method for manufacturing an organic light emitting device, the method including: preparing a first electrode;

forming an organic material layer including a hole transport layer on the first electrode; and forming a second electrode on the organic material layer, in which the forming of the organic material layer includes forming the hole transport layer using the coating composition.

In an exemplary embodiment of the present specification, a method for manufacturing an organic light emitting device used in the art is applied except that the coating composition is used.

In an exemplary embodiment of the present specification, the method for manufacturing an organic light emitting device includes: preparing a first electrode;

forming an organic material layer including a hole transport layer and a light emitting layer on the first electrode; and forming a second electrode on the organic material layer, in which the forming of the organic material layer includes forming the hole transport layer using the coating composition.

The organic light emitting device according to the present invention may be a top emission type, a bottom emission type, or a dual emission type according to the material to be used.

Hereinafter, the present specification will be described in detail with reference to Examples for specifically describing the present specification. However, the Examples according to the present specification may be modified in various forms, and it is not interpreted that the scope of the present application is limited to the Examples described in detail below. The Examples of the present application are provided to explain the present specification more completely to a person with ordinary skill in the art.

MODE FOR INVENTION

Synthesis Example 1. Preparation of Polymer Compound 1

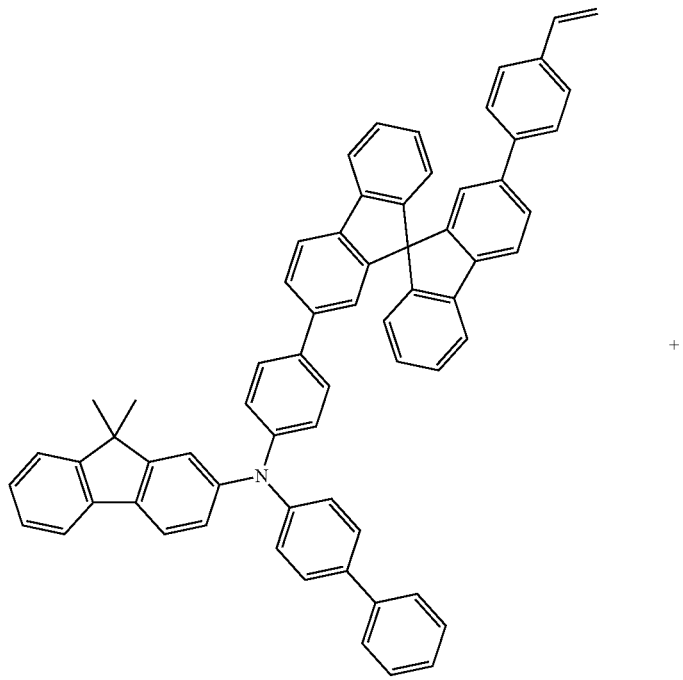

1-a

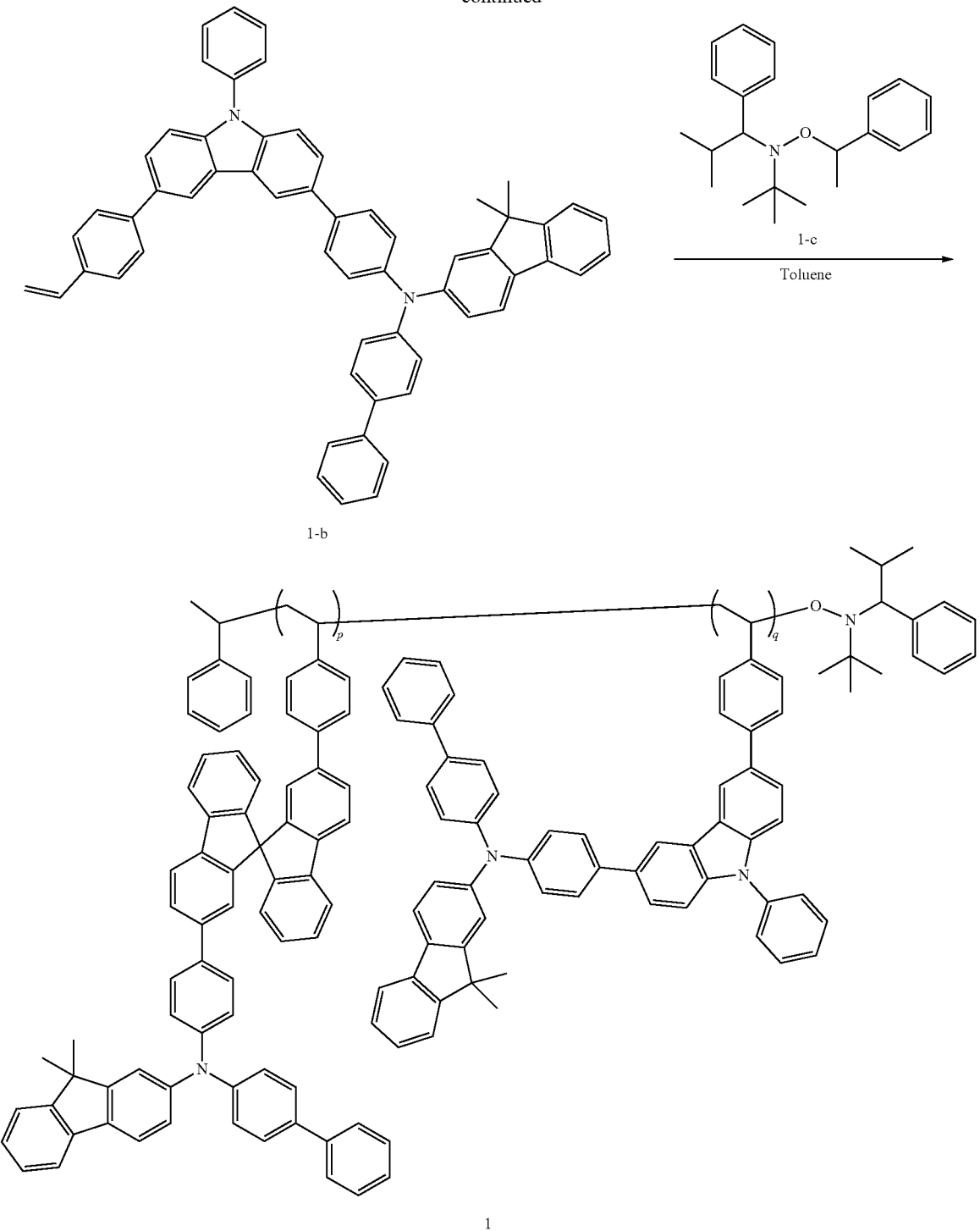

After Monomer 1-a (1.0 g, 1.17 mmol), Monomer 1-b (1.0 g, 1.28 mmol), and Initiator 1-c (5.0 mg, 0.015 mmol) were put into a Schlenk flask and dissolved in toluene (5.0 ml), a process of freeze-evacuate-thaw was repeated three times, and the resulting product was stirred at 120° C. for 7 hours. After completion of the reaction, a polymer was obtained by pouring the solution into methanol to take a precipitate. After the polymer obtained by filtration was stored in a vacuum oven, the remaining monomers were removed by an adsorption column (hexane:methyl chloride=5:5), and a polymer solution obtained by flowing toluene was evaporated. Thereafter, a precipitate was taken in methanol, filtered, and then dried in a vacuum oven to obtain Polymer 1. The polymerization, molecular weight, and molecular weight distribution of a polymer were confirmed by 1H-NMR and GPC analysis.

FIG. 3 is a view illustrating NMR measurement results of Polymer 1.

FIG. 4 is a view illustrating GPC measurement results of Polymer 1.

Synthesis Example 2. Preparation of Polymer Compound 2
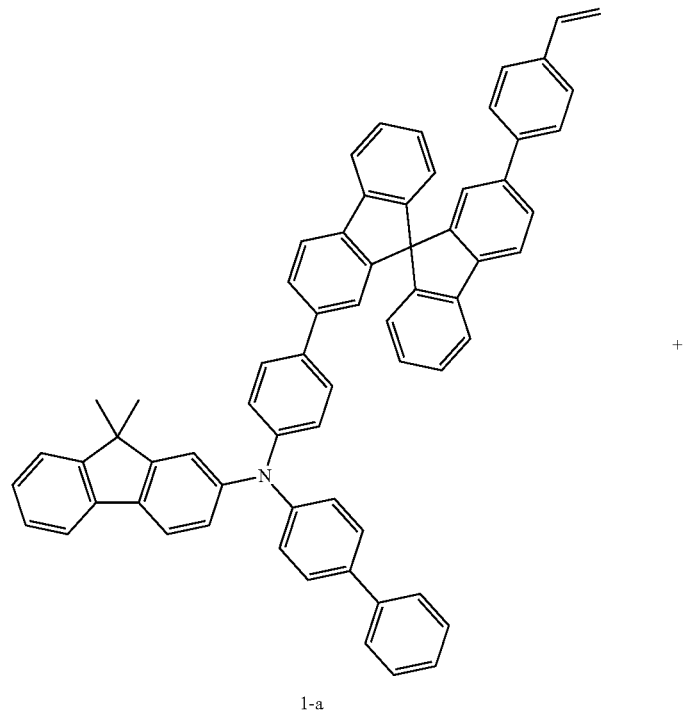
1-a
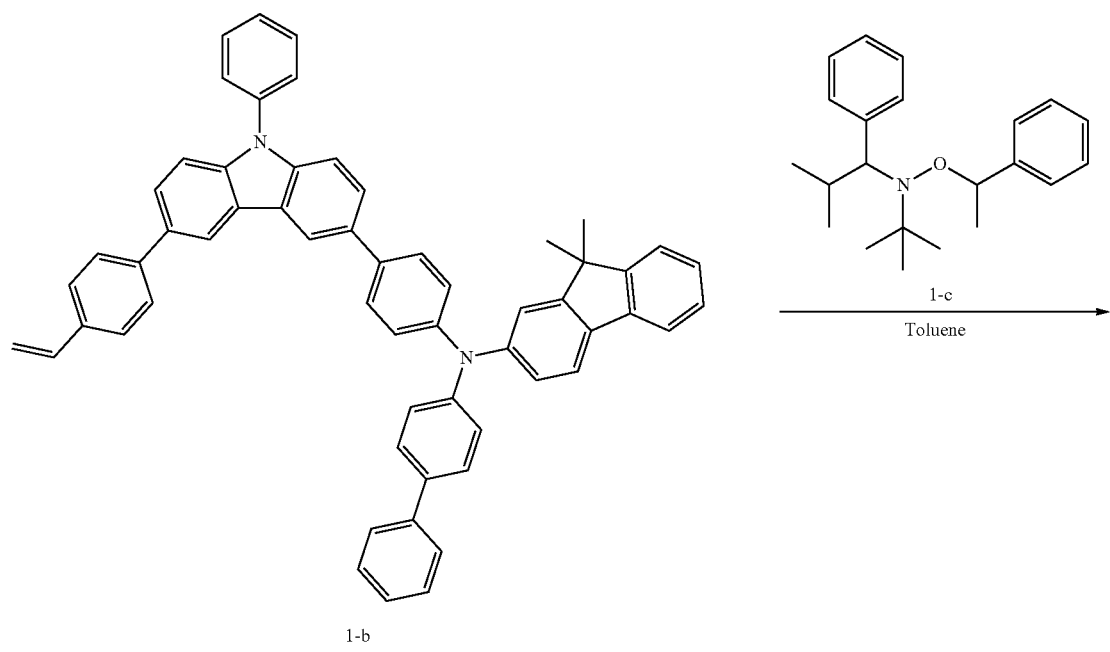
1-b

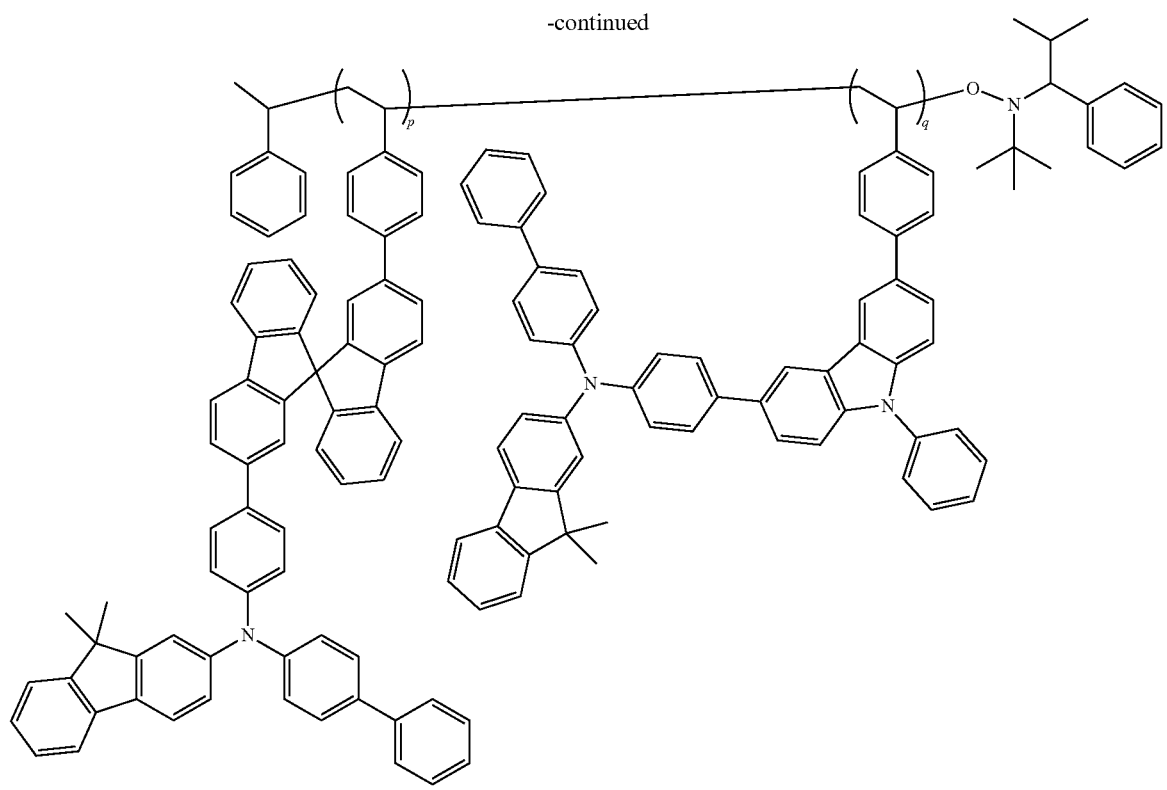
2
Polymer 2 was synthesized in the same manner as in Synthesis Example 1, except that 2.0 g (2.34 mmol) of Monomer 1-a and 1.0 g (1.28 mmol) of Monomer 1-b were used in Synthesis Example 1.
Synthesis Example 3. Preparation of Polymer Compound 3
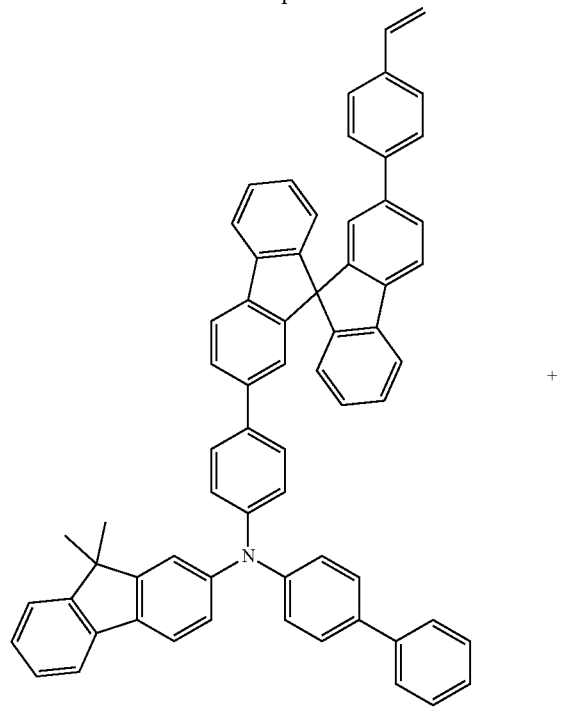
1-a -continued
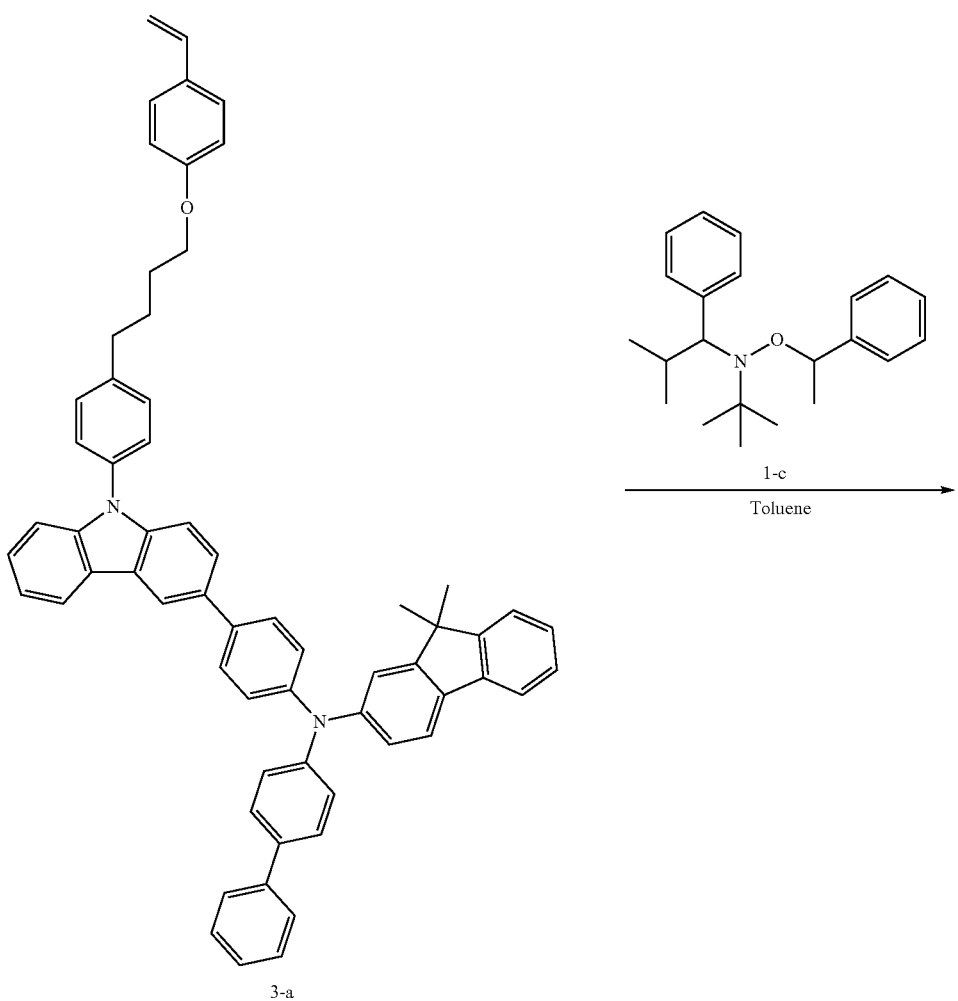

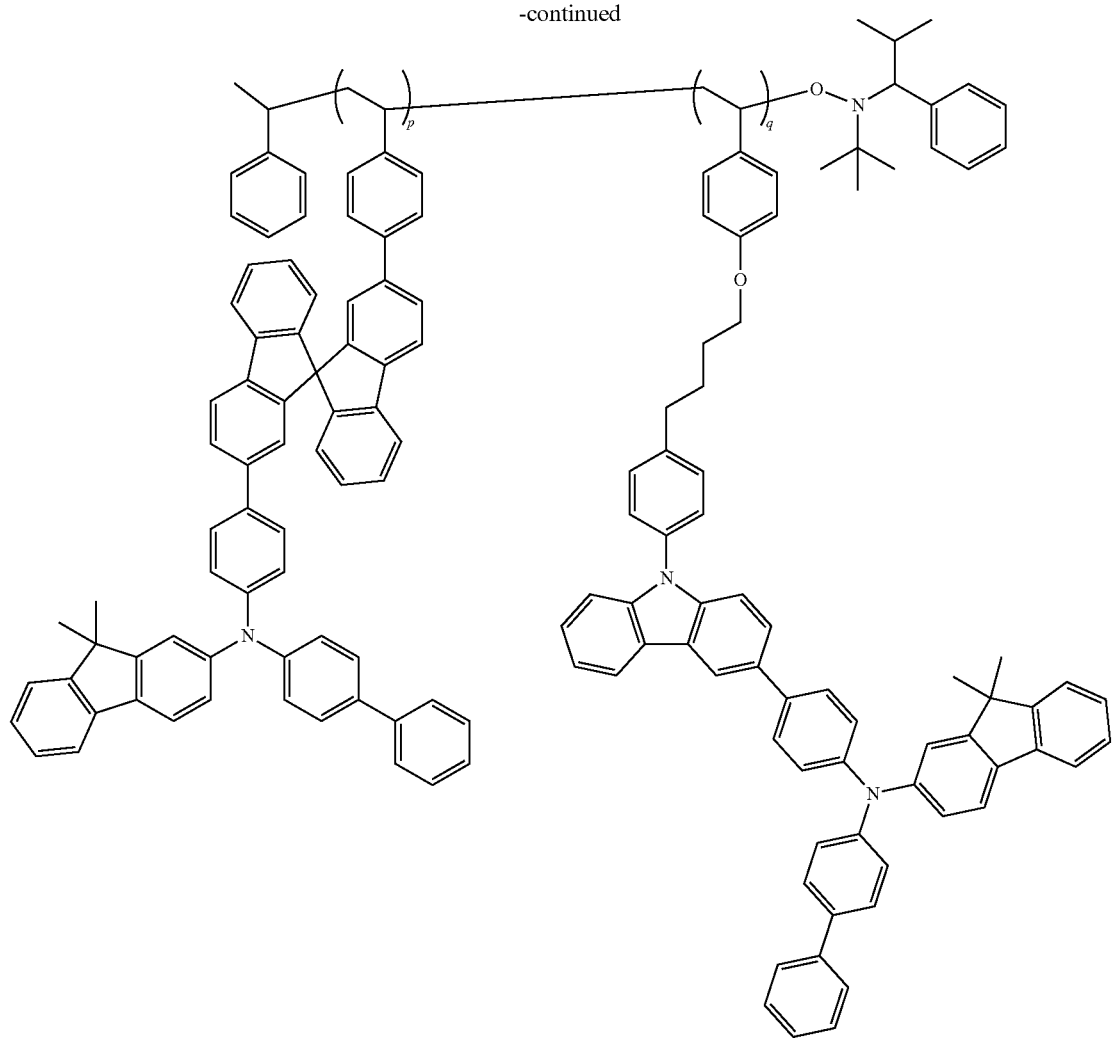

3

After Monomer 1-a (1.0 g, 1.17 mmol), Monomer 3-a (0.4 g, 0.469 mmol), and Initiator 1-c (5.0 mg, 0.015 mmol) were put into a Schlenk flask and dissolved in toluene (3.3 ml), a process of freeze-evacuate-thaw was repeated three times, and the resulting product was stirred at 120° C. for 7 hours. After completion of the reaction, a polymer was obtained by pouring the solution into methanol to take a precipitate. After the polymer obtained by filtration was stored in a vacuum oven, the remaining monomers were removed by an adsorption column (hexane:methyl chloride=5:5), and a polymer solution obtained by flowing toluene was evaporated. Thereafter, a precipitate was taken in methanol, filtered, and then dried in a vacuum oven to obtain Polymer 3. The polymerization, molecular weight, and molecular weight distribution of a polymer were confirmed by 1H-NMR and GPC analysis.

FIG. 5 is a view illustrating NMR measurement results of Polymer 3.

FIG. 6 is a view illustrating GPC measurement results of Polymer 3.

Synthesis Example 4. Preparation of Polymer Compound 4
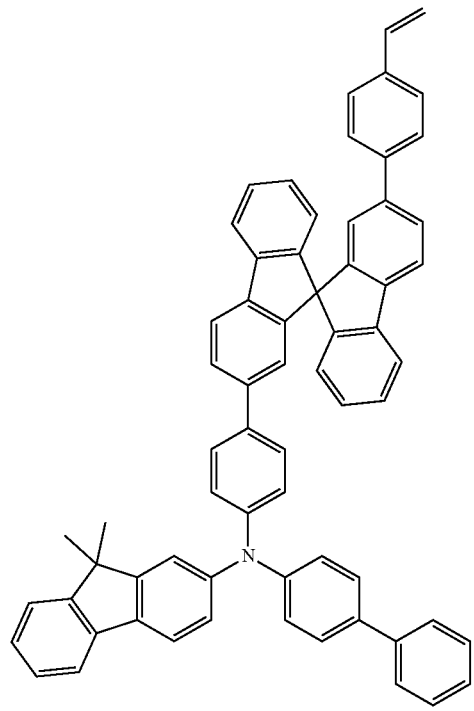
1-a
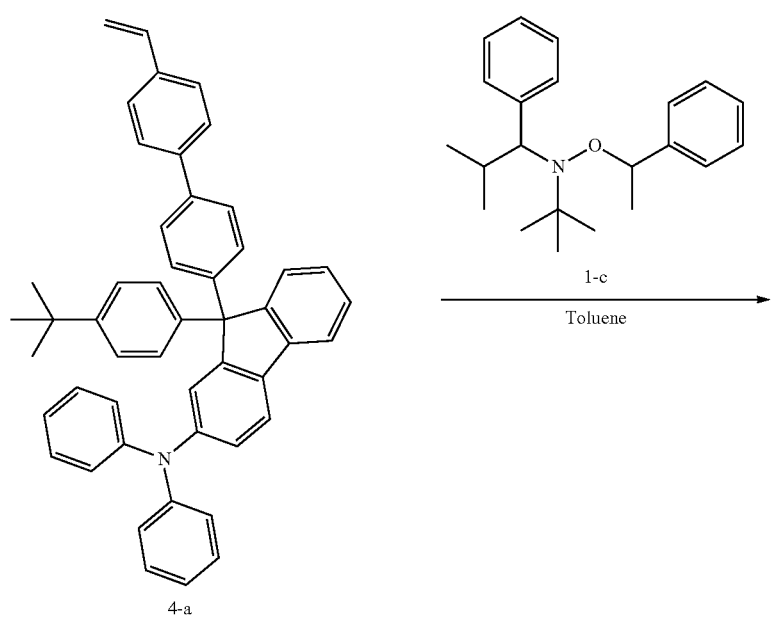

-continued
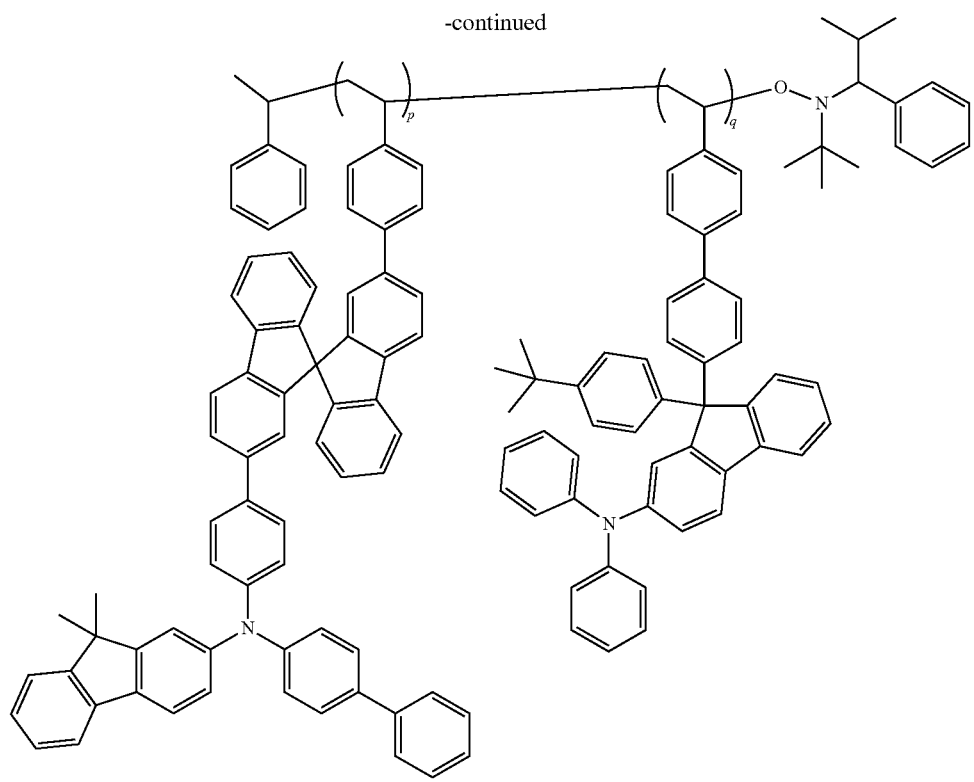
4
Polymer 4 was prepared in the same manner as in Synthesis Example 1, except that Monomer 4-a (0.4 g, 0.62 mmol) was used instead of Monomer 1-b in Synthesis Example 1.
FIG. 7 is a view illustrating NMR measurement results of Polymer 4.
FIG. 8 is a view illustrating GPC measurement results of Polymer 4.
Synthesis Example 5. Preparation of Polymer Compound 5
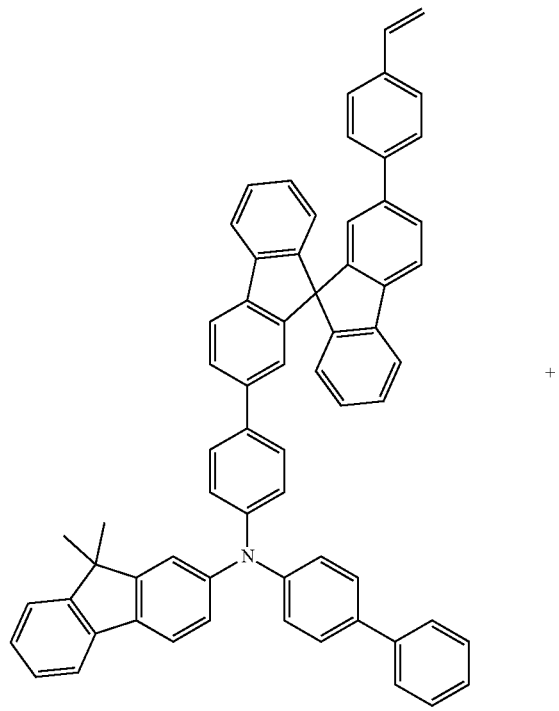
1-a
+

-continued
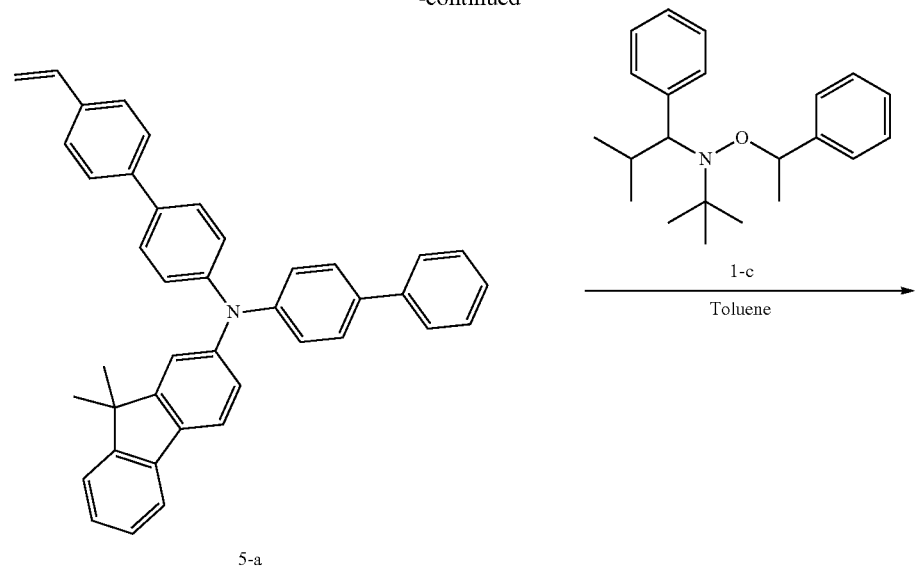
5-a
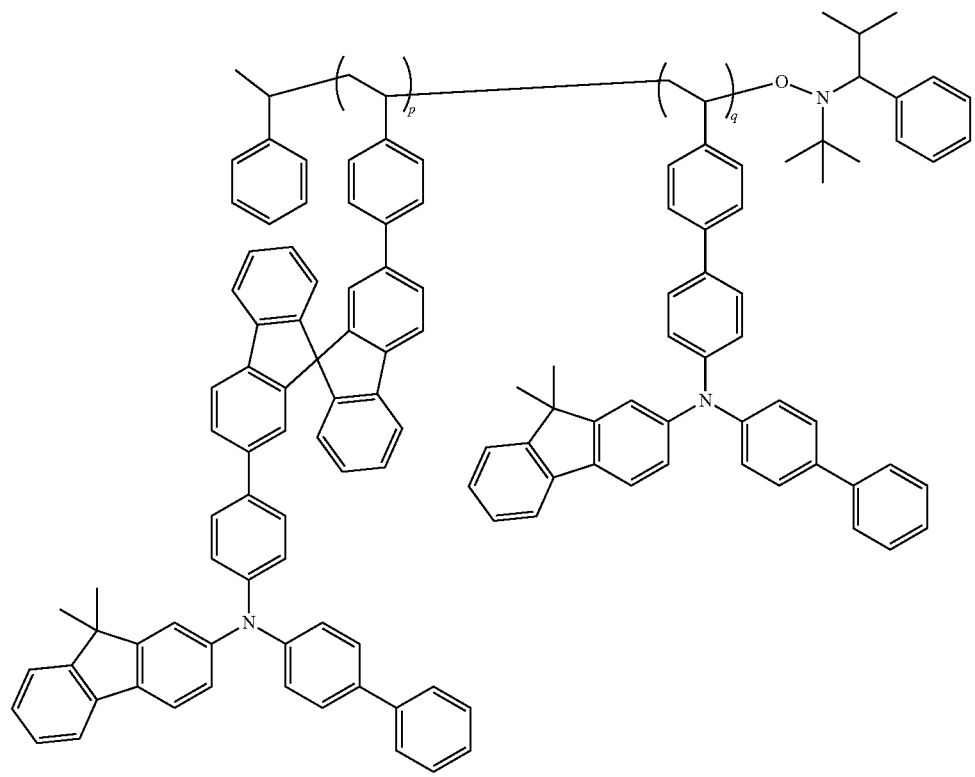
5
Polymer 5 was prepared in the same manner as in Synthesis Example 1, except that Monomer 5-a (0.1 g, 0.19 mmol) was used instead of Monomer 1-b in Synthesis Example 1.
FIG. 9 is a view illustrating GPC measurement results of Polymer 5.

Comparative Synthesis Example 1: Synthesis of Comparative Compound P1
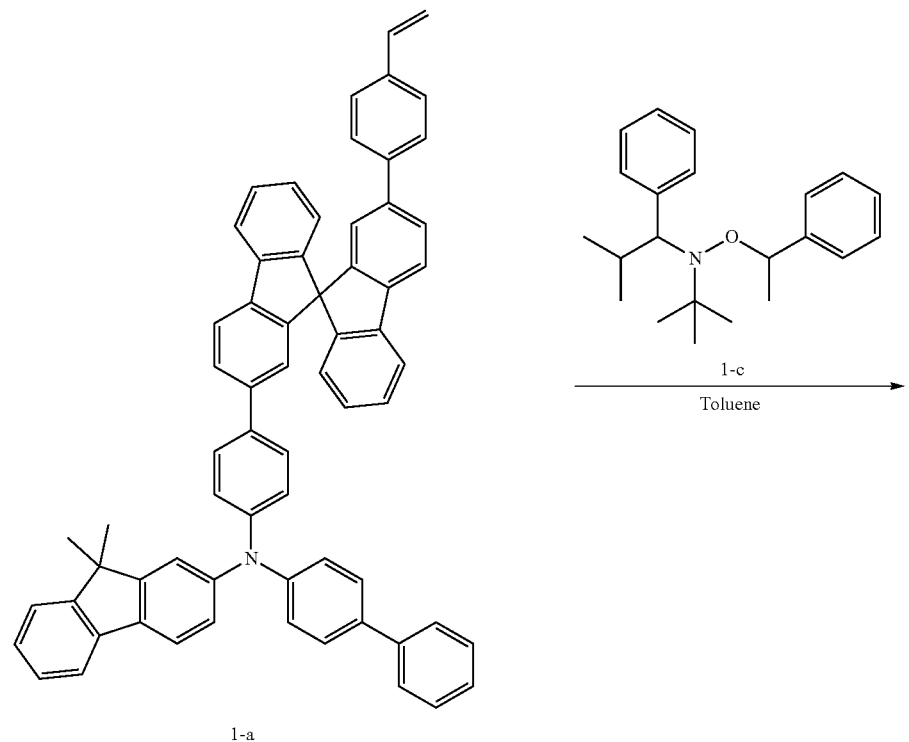
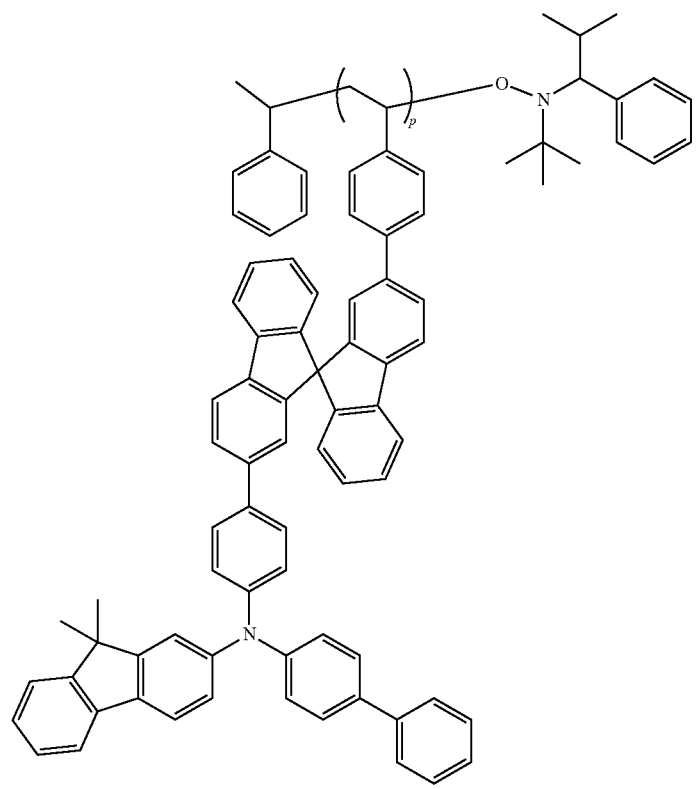

After Monomer 1-a (1.0 g, 1.17 mmol) and Initiator 1-c (4.0 mg, 0.012 mmol) were put into a Schlenk flask and dissolved in toluene (3.0 ml), a process of freeze-evacuate-thaw was repeated three times, and the resulting product was stirred at 120° C. for 6 hours. After completion of the reaction, a polymer was obtained by pouring the solution into methanol to take a precipitate. After the polymer obtained by filtration was stored in a vacuum oven, the remaining monomers were removed by an adsorption column (hexane:methyl chloride=5:5), and a polymer solution obtained by flowing toluene was evaporated. Thereafter, a precipitate was taken in methanol, filtered, and then dried in a vacuum oven to obtain Polymer P1.

Comparative Synthesis Example 2: Synthesis of Comparative Compound P2

After Monomer 1-b (1.0 g, 1.28 mmol) and Initiator 1-c (9.0 mg, 0.028 mmol) were put into a Schlenk flask and dissolved in toluene (3.0 ml), a process of freeze-evacuate-thaw was repeated three times, and the resulting product was stirred at 120° C. for 6 hours. After completion of the reaction, a polymer was obtained by pouring the solution into methanol to take a precipitate. After the polymer obtained by filtration was stored in a vacuum oven, the remaining monomers were removed by an adsorption column (hexane:methyl chloride=5:5), and a polymer solution obtained by flowing toluene was evaporated. Thereafter, a precipitate was taken in methanol, filtered, and then dried in a vacuum oven to obtain Polymer P2.

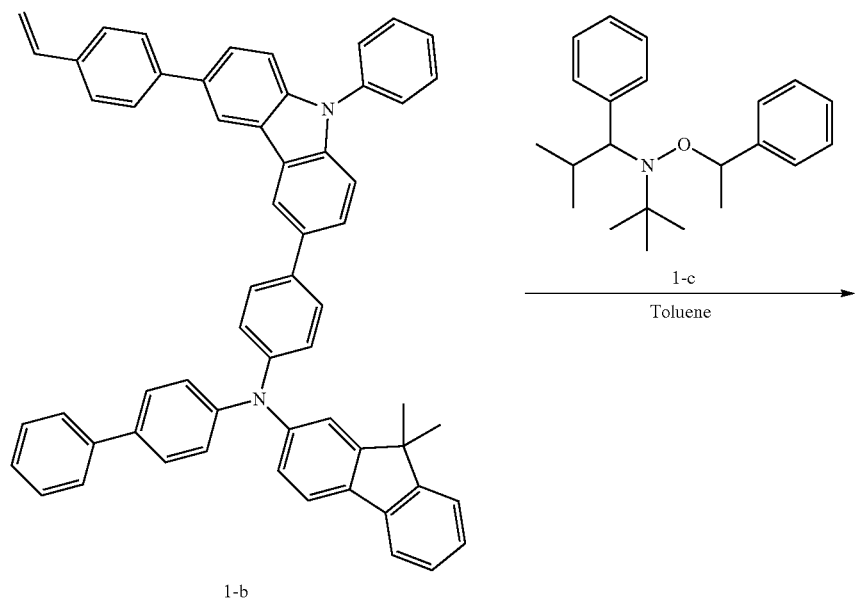

1-b

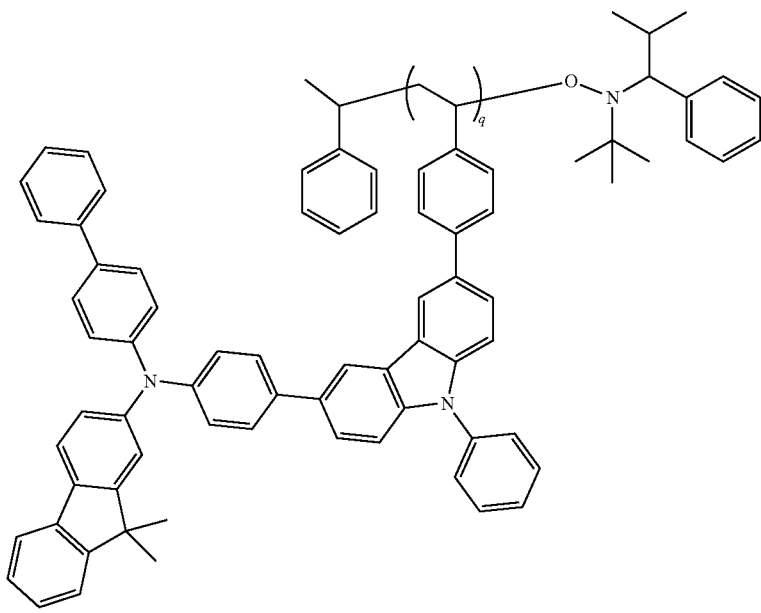

P2

Comparative Synthesis Example 3: Synthesis of Comparative Compound P3

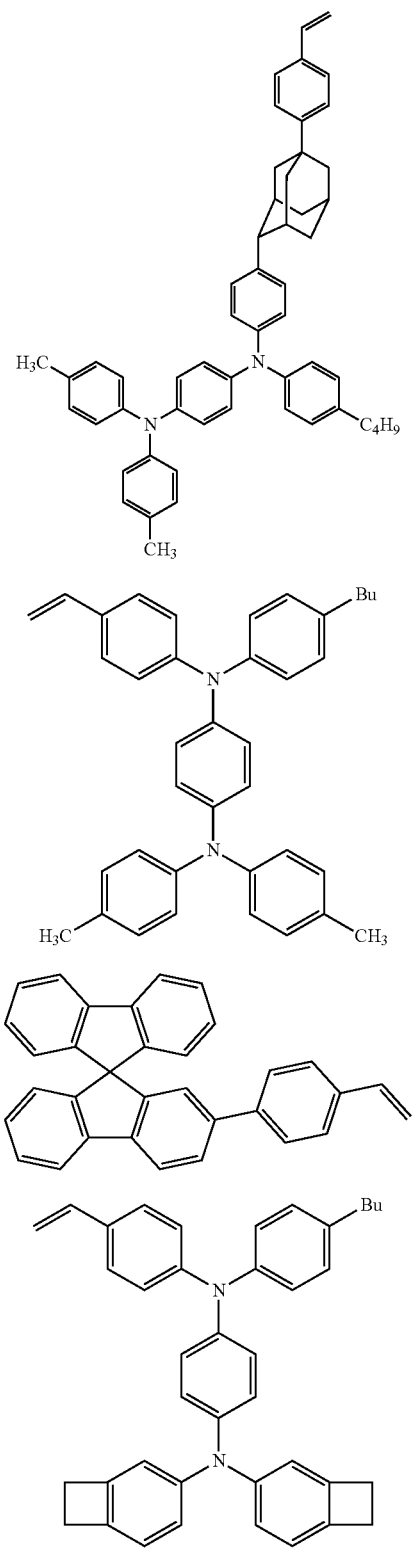

Monomer M1 (1.09 g, 1.49 mmol), Monomer M2 (0.35 g, 0.67 mmol), Monomer M3 (0.23 g, 0.55 mmol), Monomer M4 (0.61 g, 1.12 mmol), azobisisobutyronitrile (AIBN, 0.027 g, 0.16 mmol), and toluene (7 mL) were added to a Schlenk flask, a process of freeze-evacuate-thaw was repeated three times, and the resulting product was heated at 70° C. for 6 hours. After being cooled to room temperature, the reactant was diluted with tetrahydrofuran (THF), and then re-precipitated five times by using an excessive amount of acetone/methanol (1/1, v/v), and then an obtained material was dried in a vacuum oven to obtain Polymer P3.

Comparative Synthesis Example 4: Synthesis of Comparative Compound P4

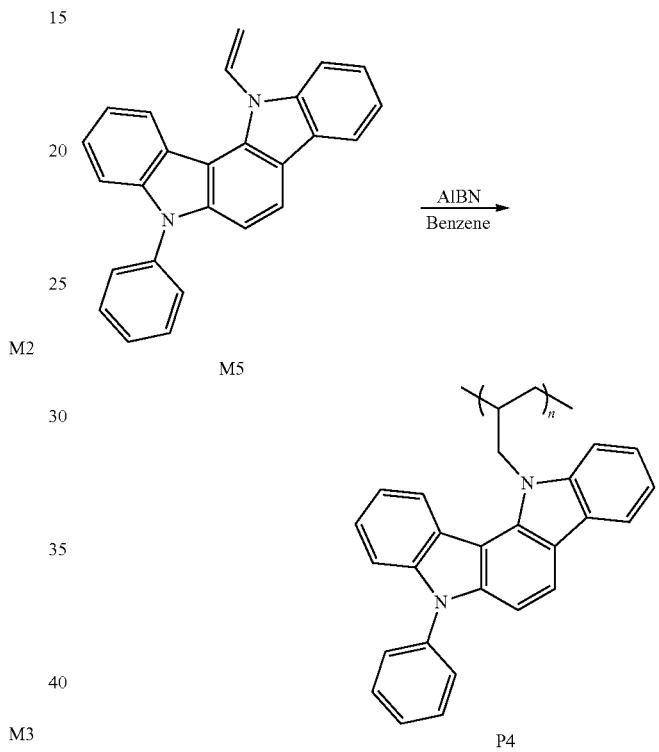

Compound M5 (0.38 g, 0.13 mmol) was dissolved in benzene (19 mL), a catalyst AIBN (0.21 g, 1.25 mmol) was added thereto, and after nitrogen substitution, the mixture was reacted at 70° C. for 17 hours. After being cooled to room temperature, the reactant was diluted with THF, and then re-precipitated three times by using acetonitrile, and then an obtained material was dried in a vacuum oven to obtain Polymer P4.

The molecular weight of the polymer was measured by GPC using PC standard using Agilent 1200 series.

TABLE 1

| Polymer | Mn | Mw/Mn |
|---|---|---|
| 1 | 28,491 | 1.13 |
| 2 | 27,351 | 1.13 |
| 3 | 15,039 | 1.12 |
| 4 | 17,542 | 1.12 |
| 5 | 14,133 | 1.14 |
| P1 | 27,526 | 1.12 |
| P2 | 28,485 | 1.13 |
| P3 | 17,800 | 2.15 |
| P4 | 12,000 | 2.00 |

EXPERIMENTAL EXAMPLES

Experimental Example 1. Solubility Experiment

In order to confirm the solubility of each of Synthesis Examples 1 to 5 and Comparative Compounds 1 to 4 to the solvent used in the solution process, these compounds were dissolved in an amount of 4 wt %, 6 wt %, and 10 wt % in the solvent toluene under the conditions of room temperature (25±0.5° C.)/atmospheric pressure (1±0.01 atm), and the results are shown in Table 2.

TABLE 2

| | 4 wt % | 6 wt % | 10 wt % |
|---|---|---|---|
| Polymer Compound 1 | ○ | ○ | ○ |
| Polymer Compound 2 | ○ | ○ | ○ |
| Polymer Compound 3 | ○ | ○ | ○ |
| Polymer Compound 4 | ○ | ○ | ○ |
| Polymer Compound 5 | ○ | ○ | ○ |
| Polymer P1:Polymer P2 (1:1, w/w) | ○ | ○ | ○ |
| Polymer P3 | Dissolved at 80° C. | X | X |
| Polymer P4 | ○ | ○ | ○ |

Evaluation table (○): Soluble
Evaluation table (X): Insoluble

As can be confirmed in Table 2, it can be seen that the synthesized polymers exhibited excellent solubility to the solvent toluene used in the solution process of the organic light emitting device, unlike Comparative Compound P3.

Meanwhile, it was further confirmed that a warming condition to about 80° C. was required to dissolve Comparative Compound P3 in an amount of 4 wt %, confirming that the solubility was remarkably reduced as compared to the Examples in which the compounds are dissolved at room temperature, and accordingly, Comparative Compound P3 was not suitable for the solution process.

Experimental Example 2: Manufacture of Organic Light Emitting Device

Example 1

A glass substrate thinly coated with indium tin oxide (ITO) to have a thickness of 500 Å was put into distilled water in which a detergent was dissolved, and ultrasonically washed. In this case, a product manufactured by Fischer Co., was used as the detergent, and distilled water, which had been filtered twice with a filter manufactured by Millipore Co., was used as the distilled water. After the ITO was washed for 30 minutes, ultrasonic washing was conducted twice repeatedly using distilled water for 10 minutes. After the washing with distilled water was completed, the substrate was ultrasonically washed with a solvent of isopropyl alcohol and acetone, and dried, and then the substrate was cleaned for 5 minutes, and the substrate was transported to a glovebox.

A coating composition was prepared by dissolving the following Compound B as a host of a hole injection layer and the following Compound A as a dopant of a hole injection layer in an organic solvent (cyclohexanone). Host B and Dopant A in the hole injection layer were mixed at a weight ratio of 8:2. The hole injection layer mixture thus prepared was spin-coated on an ITO transparent electrode, thereby forming a film having a thickness of 400 Å. The film was heated at 230° C. under a nitrogen atmosphere for 30 minutes, thereby forming a hole injection layer. Thereafter, Polymer Compound 1 prepared in Synthesis Example 1 was dissolved in toluene and spin-coated on the hole injection layer to form a film having a thickness of 200 Å, and the film was heated at 230° C. under a nitrogen atmosphere for 30 minutes, thereby forming a hole transport layer. Thereafter, a cyclohexanone solution including the following Host C compound and the following Dopant D compound at a weight ratio of 94:6 was spin-coated on the hole transport layer, and the coated hole transport layer was heated at 150° C. for 10 minutes, thereby forming a light emitting layer having a thickness of 250 Å. ETL Compound E was vacuum-deposited to have a thickness of 300 Å on the light emitting layer, thereby forming a layer which injects and transports electrons simultaneously. Aluminum was deposited to have a thickness of 1000 Å on the layer which injects and transports electrons simultaneously, thereby forming a cathode.

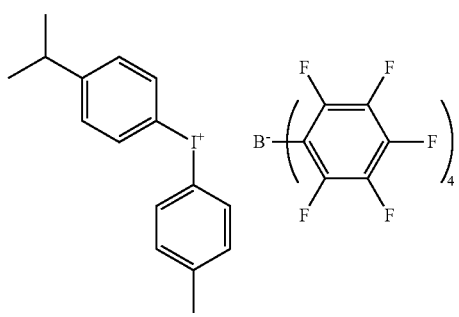

A

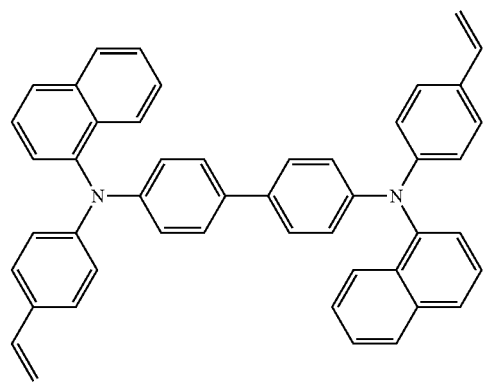

B

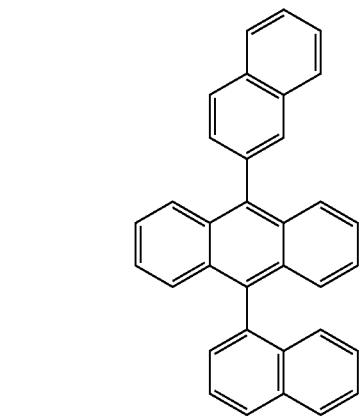

C

-continued

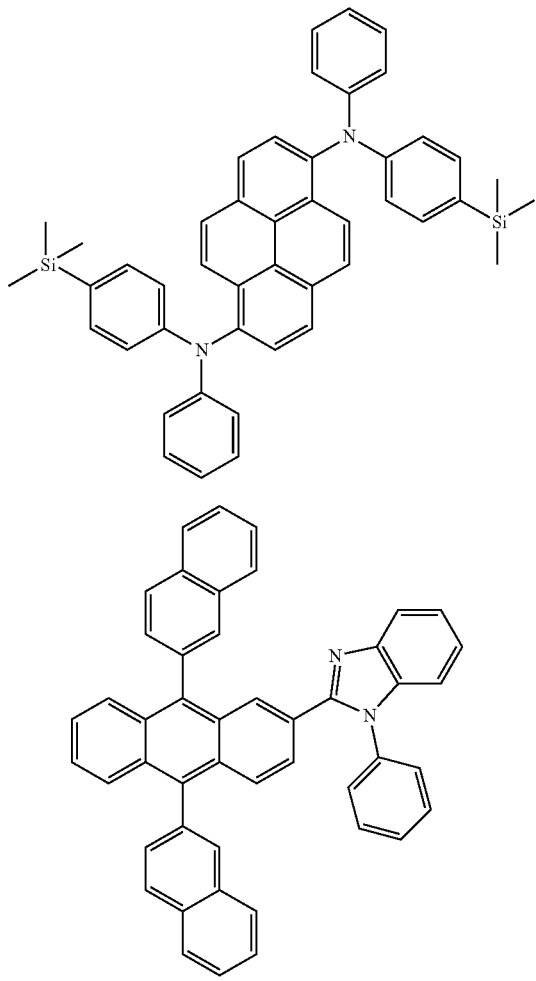

In the aforementioned procedure, the deposition rate of the organic materials were maintained at 0.4 to 1 Å/sec, the deposition rate of aluminum was maintained at 2 Å/sec, and the degree of vacuum during the deposition was maintained at $2\times10^{-8}$ torr to $5\times10^{-6}$ torr, thereby manufacturing an organic light emitting device. The subsequent operation was performed at room temperature (25° C.) in the atmosphere.

Example 2

An organic light emitting device was manufactured in the same manner as in Example 1, except that Polymer Compound 2 prepared in Synthesis Example 2 was used instead of Polymer Compound 1 in Example 1.

Example 3

An organic light emitting device was manufactured in the same manner as in Example 1, except that Polymer Compound 3 prepared in Synthesis Example 3 was used instead of Polymer Compound 1 in Example 1.

Example 4

An organic light emitting device was manufactured in the same manner as in Example 1, except that Polymer Compound 4 prepared in Synthesis Example 4 was used instead of Polymer Compound 1 in Example 1.

Example 5

An organic light emitting device was manufactured in the same manner as in Example 1, except that Polymer Compound 5 prepared in Synthesis Example 5 was used instead of Polymer Compound 1 in Example 1.

Comparative Example 1

After Polymer Compound P1 prepared in Comparative Synthesis Example 1 and Polymer Compound P2 prepared in Comparative Synthesis Example 2 were mixed at a weight ratio of 1:1 in a solid sample state, a blending ink dissolved by putting a solvent toluene into the resulting mixture was formed.

An organic light emitting device was manufactured in the same manner as in Example 1, except that the blending ink was used instead of Polymer Compound 1 in Example 1.

Comparative Example 2

An organic light emitting device was manufactured in the same manner as in Example 1, except that Polymer Compound P4 prepared in Comparative Synthesis Example 4 was used instead of Polymer Compound 1 in Example 1.

For the organic light emitting devices manufactured in Examples 1 to 5 and Comparative Examples 1 and 2, a voltage value for forming a current density of 10 mA/cm², light emitting characteristics at 10 mA/cm², and time (T95) taken for the luminance to become 95% of the initial luminance at a current density of 10 mA/cm² were measured. Furthermore, the respective parameters were calculated using the area and the power consumption of the light emitting device. The results are shown in the following Table 3.

TABLE 3

| | Voc (V) | Jsc (mA/cm²) | Light emitting efficiency per current (cd/A) | Light source efficiency (la/W) | External quantum efficiency (%) | Light emitting efficiency per area (Cd/m²) | Color coordinate | | T95 (hr) |
| --- | --- | --- | --- | --- | --- | --- | --- | --- | --- |
| | | | | | | | CIE (x) | CIE (y) | |
| Example 1 | 4.28 | 10 | 5.48 | 4.03 | 7.18 | 548.43 | 0.141 | 0.092 | 116 |
| Example 2 | 4.25 | 10 | 5.70 | 4.21 | 7.52 | 569.84 | 0.141 | 0.092 | 149 |
| Example 3 | 4.32 | 10 | 5.92 | 4.31 | 6.17 | 592.15 | 0.141 | 0.092 | 95 |
| Example 4 | 4.37 | 10 | 6.00 | 4.31 | 6.27 | 599.63 | 0.141 | 0.092 | 330 |
| Example 5 | 4.32 | 10 | 6.25 | 4.54 | 6.46 | 624.69 | 0.141 | 0.092 | 236 |
| Comparative Example 1 | 4.20 | 10 | 5.32 | 3.98 | 6.99 | 532.04 | 0.141 | 0.092 | 59 |

TABLE 3-continued

|  | Voc (V) | Jsc (mA/cm$^2$) | Light emitting efficiency per current (cd/Å) | Light source efficiency (Ia/W) | External quantum efficiency (%) | Light emitting efficiency per area (Cd/m$^2$) | Color coordinate CIE (x) | Color coordinate CIE (y) | T95 (hr) |
|---|---|---|---|---|---|---|---|---|---|
| Comparative Example 2 | 4.26 | 10 | 4.87 | 3.65 | 6.57 | 486.86 | 0.141 | 0.092 | 26 |

As shown in Table 3, the polymer according to the present invention may be used in the hole transport layer of the organic light emitting device, and the device according to the present invention exhibits excellent characteristics in terms of service life. In particular, when Examples 1 and 2 and Comparative Example 1 are compared, it can be confirmed that the case where each monomer is copolymerized exhibits excellent performance compared to a material in which monomers are each polymerized and then blended.

The invention claimed is:
1. A polymer comprising:
a first unit of the following Formula 1; and
a second unit of the following Formula 2:

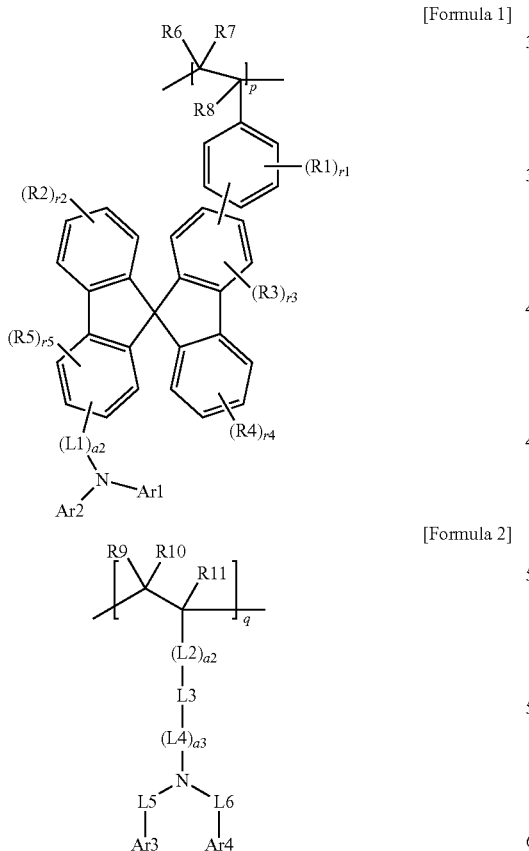

in Formulae 1 and 2,
L1, L2, and L4 to L6 are the same as or different from each other, and each independently a direct bond; —O—; a substituted or unsubstituted alkylene group; a substituted or unsubstituted arylene group; a substituted or unsubstituted divalent amine group; or a substituted or unsubstituted divalent heterocyclic group, L3 is a substituted or unsubstituted divalent carbazole group; a substituted or unsubstituted divalent fluorenyl group; or a substituted or unsubstituted phenylene group, a1, a2, and a3 are the same as or different from each other, and each independently an integer from 1 to 10, when a1 is 2 or higher, each L1 is the same as or different from each other, when a2 is 2 or higher, each L2 is the same as or different from each other, when a3 is 2 or higher, each L4 is the same as or different from each other, Ar1 to Ar4 are the same as or different from each other, and each independently a substituted or unsubstituted alkyl group; a substituted or unsubstituted alkoxy group; a substituted or unsubstituted aryloxy group; a substituted or unsubstituted aryl group; or a substituted or unsubstituted heterocyclic group, R1 to R11 are the same as or different from each other, and are each independently hydrogen; deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group, r1, r2, and r4 are the same as or different from each other, and each independently an integer from 1 to 4, r3 and r5 are the same as or different from each other, and each independently an integer from 1 to 3, when r1 is 2 or higher, each R1 is the same as or different from each other, and when r2 is 2 or higher, each R2 is the same as or different from each other, when r3 is 2 or higher, each R3 is the same as or different from each other, when r4 is 2 or higher, each R4 is the same as or different from each other, when r5 is 2 or higher, each R5 is the same as or different from each other, p is a repeating number of the first unit, and an integer from 1 to 100, and q is a repeating number of the second unit, and an integer from 1 to 100.

2. The polymer of claim 1, wherein the polymer comprises a unit of the following Formula 3-1:
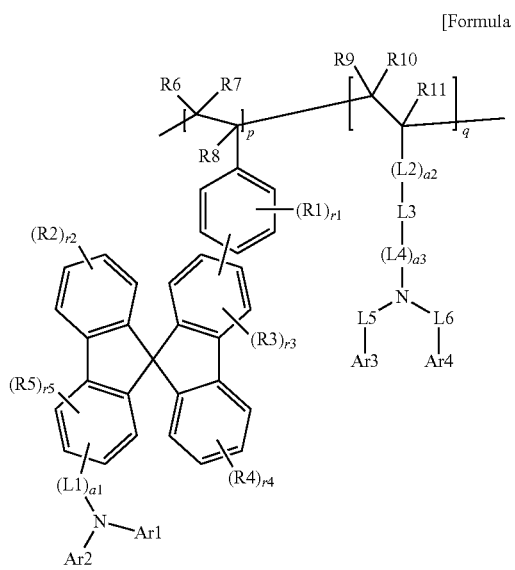
[Formula 3-1]
in Formula 3-1,
L1 to L6, a1 to a3, Ar1 to Ar4, R1 to R11, r1 to r5, p, and q are the same as those defined in Formulae 1 and 2.
3. The polymer of claim 1, wherein the polymer comprises a unit of any one of the following Formula 3-2 to 3-5:
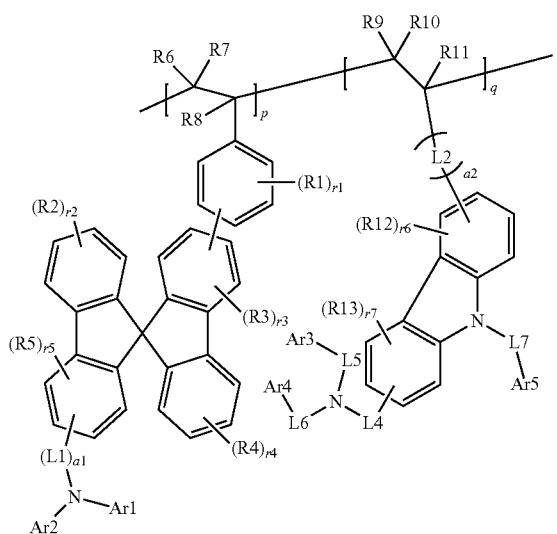
[Formula 3-2]
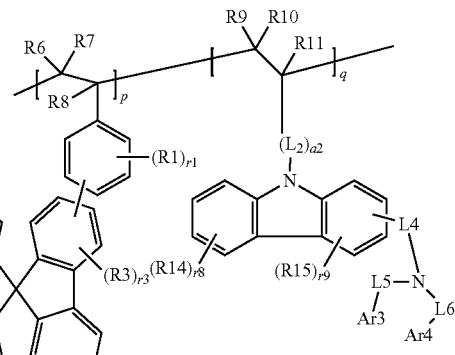
[Formula 3-3]
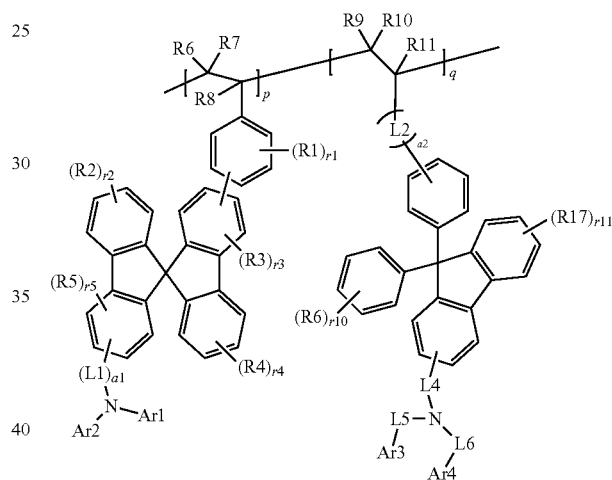
[Formula 3-4]
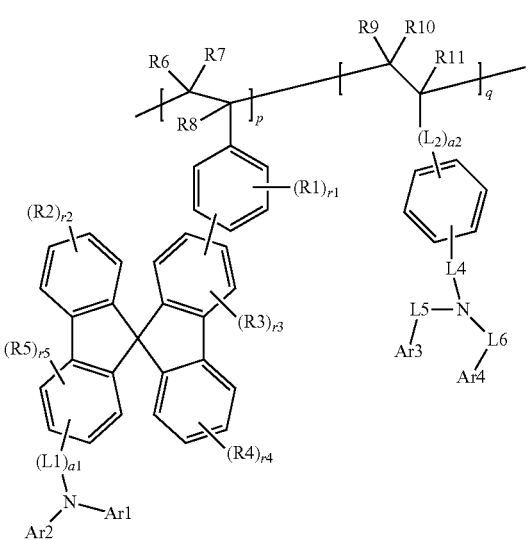
[Formula 3-5]

in Formulae 3-2 to 3-5,

L1, L2, L4 to L6, a1, a2, Ar1 to Ar4, R1 to R11, r1 to r5, p, and q are the same as those defined in Formulae 1 and 2, L7 is a direct bond; a substituted or unsubstituted arylene group; a substituted or unsubstituted divalent amine group; or a substituted or unsubstituted divalent heterocyclic group, Ar5 is a substituted or unsubstituted alkyl group; a substituted or unsubstituted alkoxy group; a substituted or unsubstituted aryloxy group; a substituted or unsubstituted aryl group; or a substituted or unsubstituted heterocyclic group, R12 to R17 are the same as or different from each other, and each independently deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group, r6, r7, and r9 are the same as or different from each other, and each independently an integer from 1 to 3, r8 and r11 are the same as or different from each other, and each independently an integer from 1 to 4, r10 an integer from 1 to 5, when r6 is 2 or higher, each R12 is the same as or different from each other, when r7 is 2 or higher, each R13 is the same as or different from each other, when r8 is 2 or higher, each R14 is the same as or different from each other, when r9 is 2 or higher, each R15 is the same as or different from each other, when r10 is 2 or higher, each R16 is the same as or different from each other, and when r11 is 2 or higher, each R17 is the same as or different from each other.

4. The polymer of claim 1, wherein L1, L2, and L4 to L6 are the same as or different from each other, and are each independently a direct bond; —O—; a substituted or unsubstituted straight-chained or branched alkylene group; or a substituted or unsubstituted arylene group.

5. The polymer of claim 1, wherein Ar1 to Ar4 are the same as or different from each other, and each independently a substituted or unsubstituted aryl group.

6. The polymer of claim 1, wherein the polymer comprises any one of the following structures:

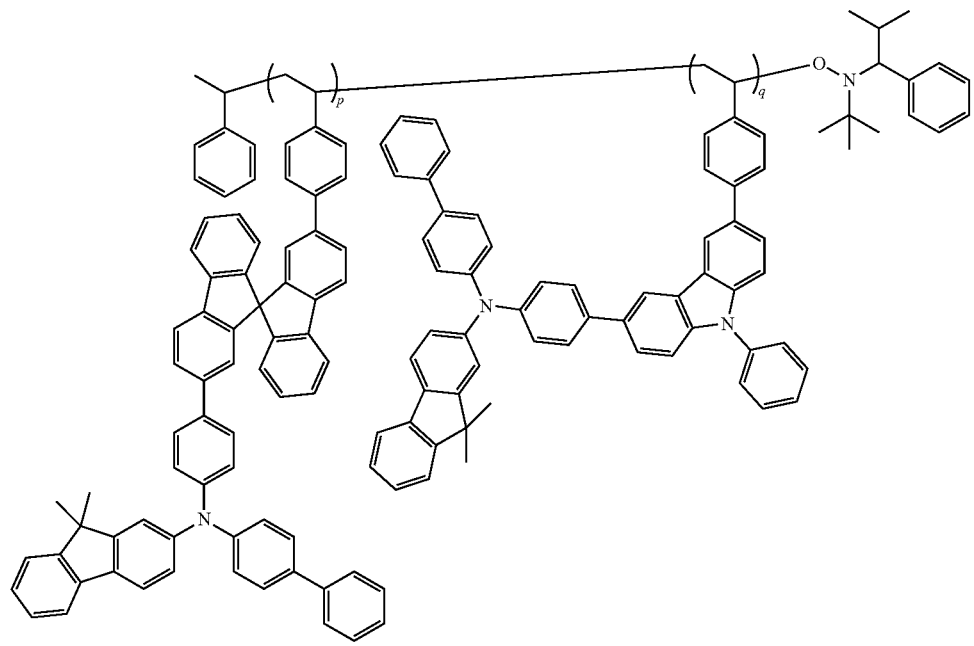

-continued
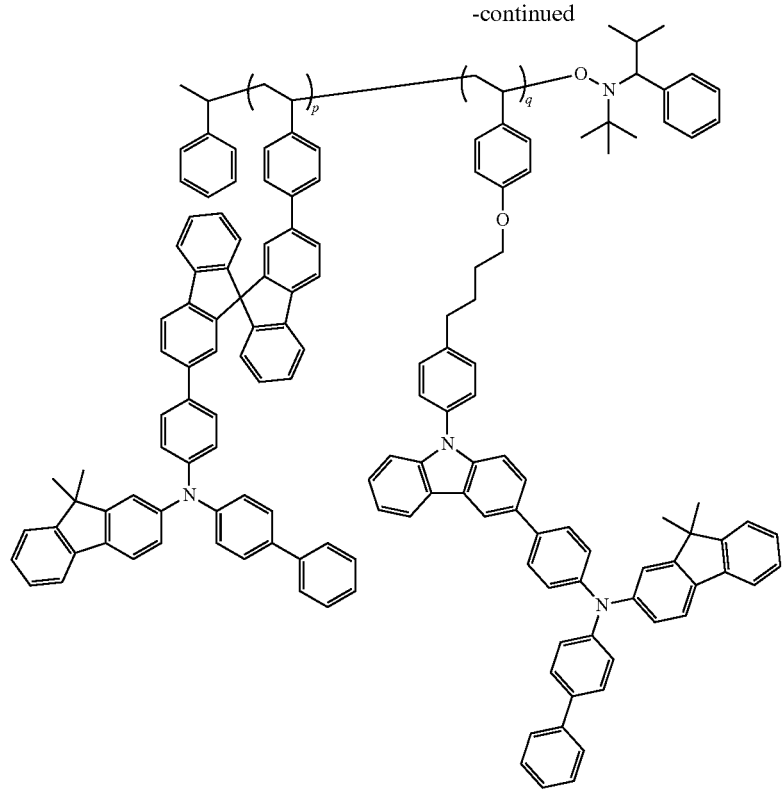
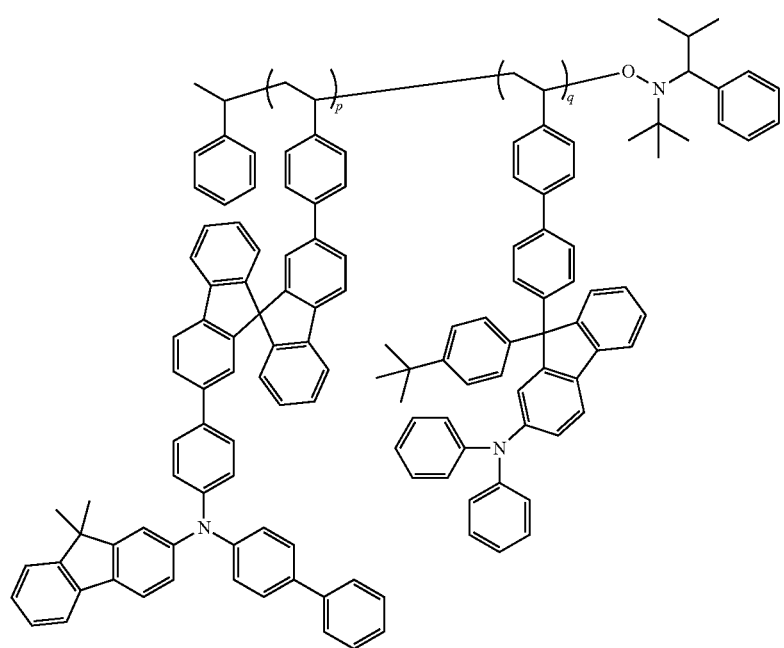

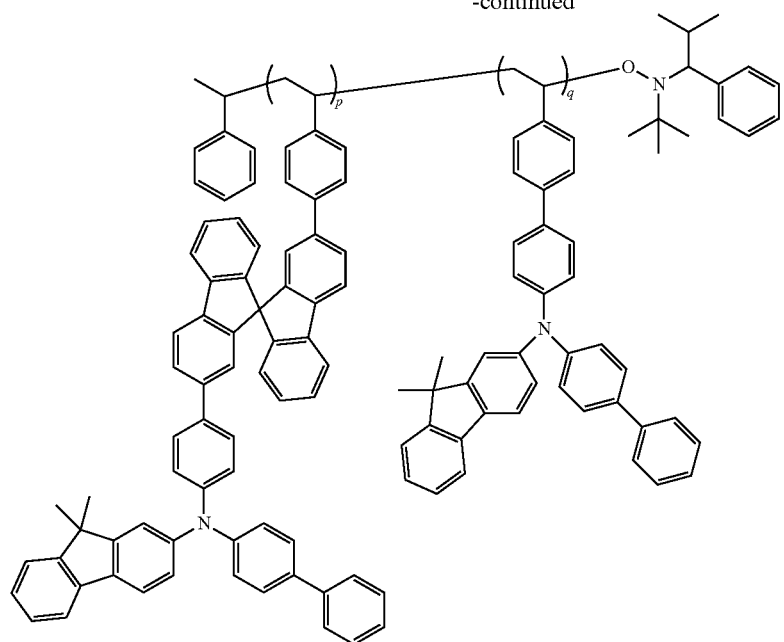
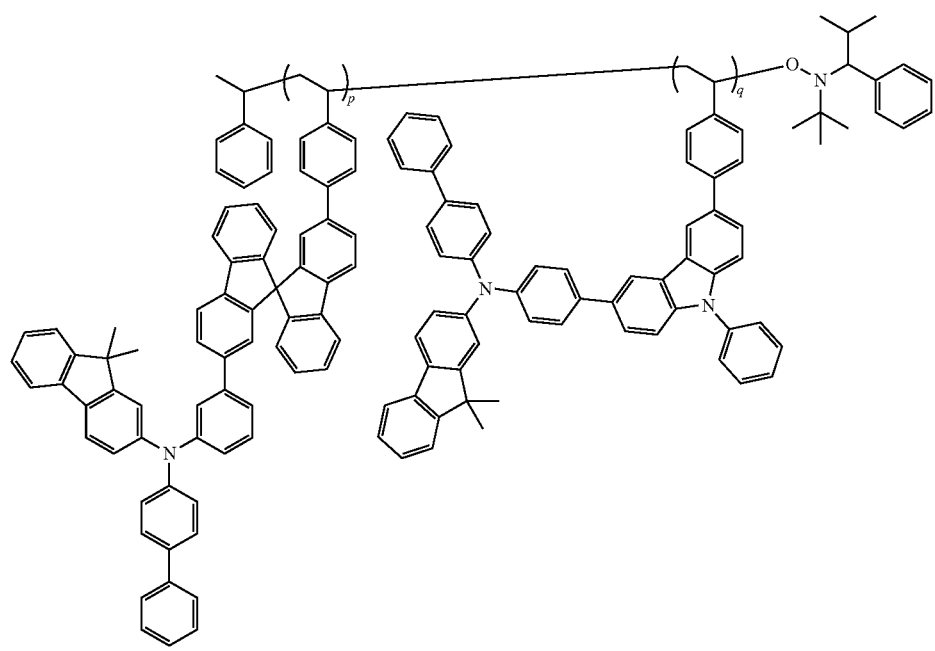

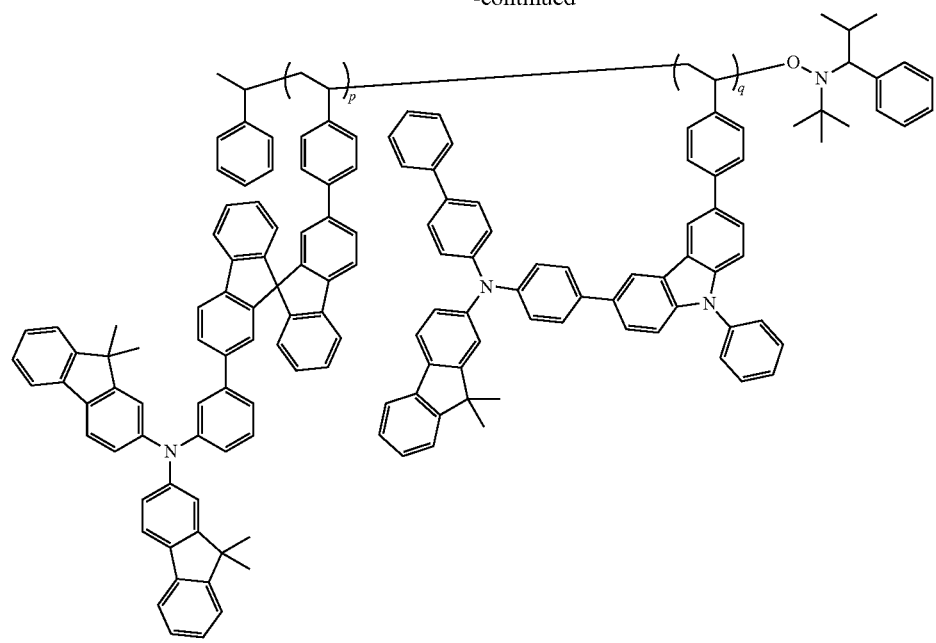
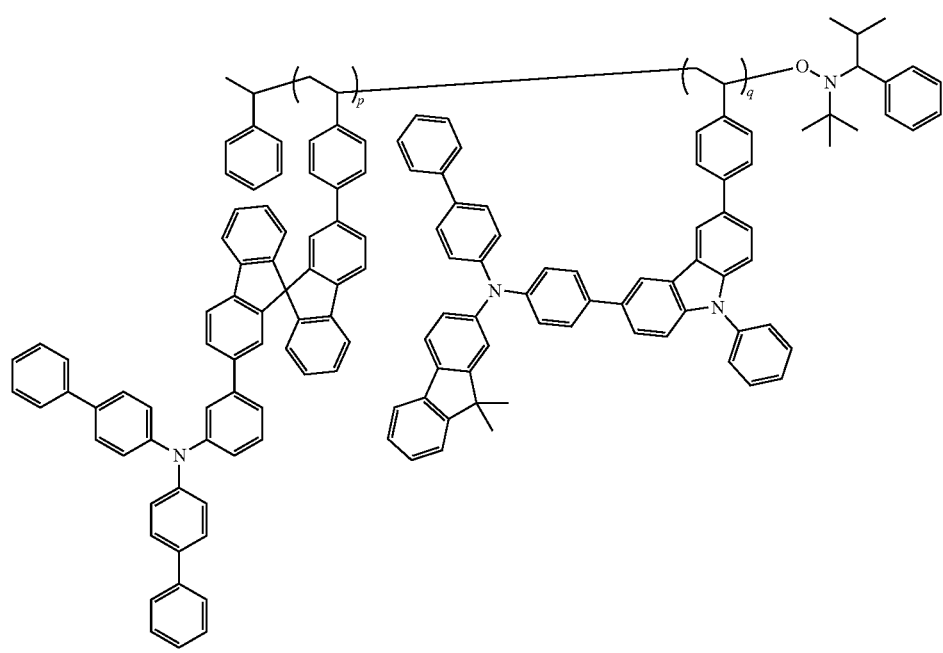

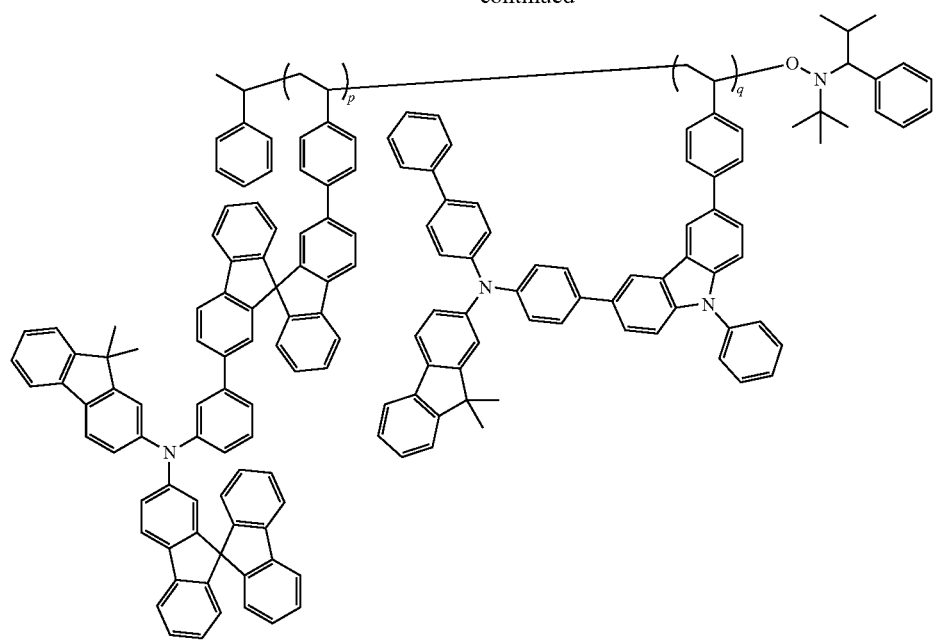
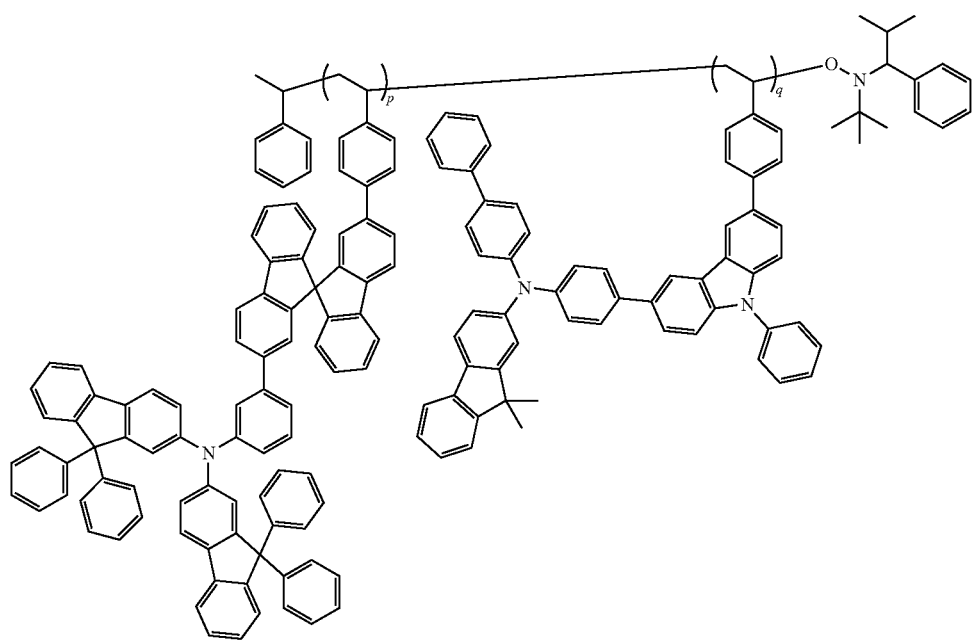

-continued
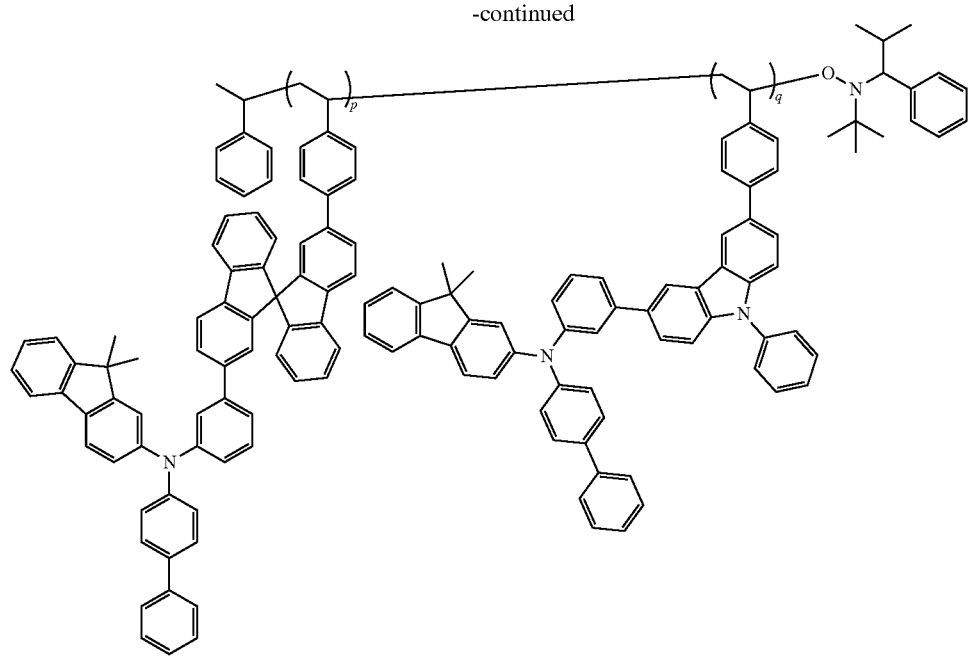
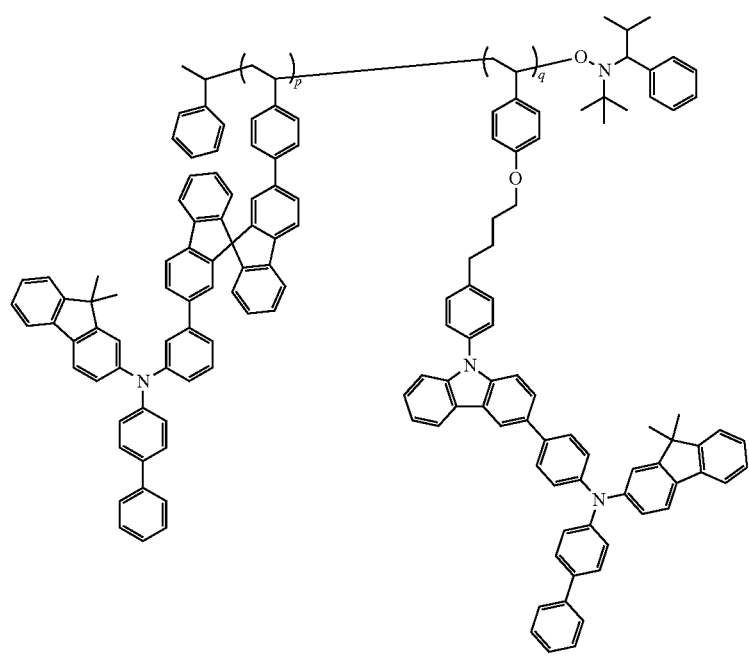

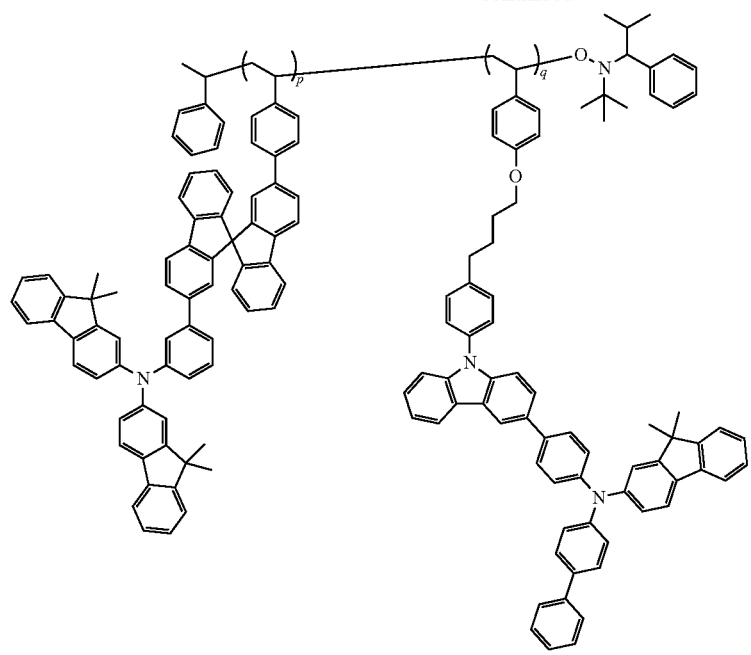
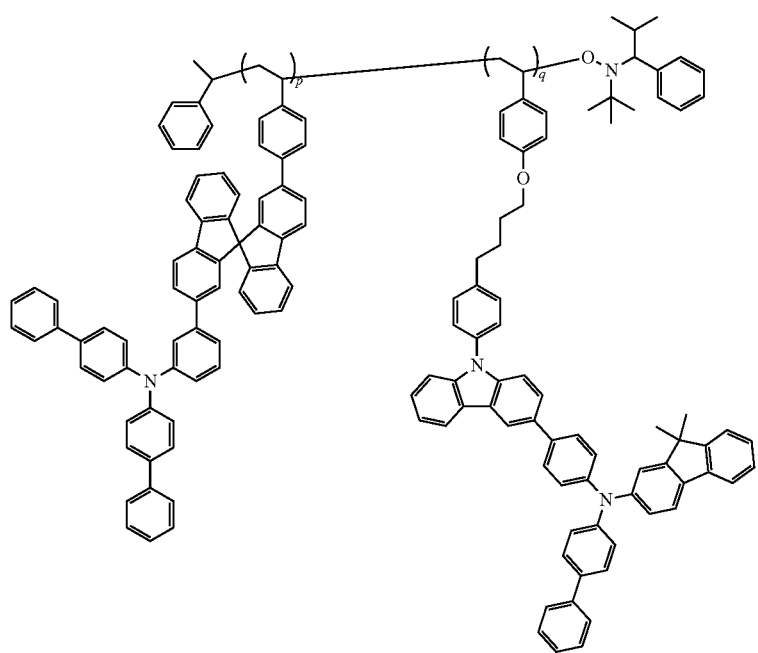

-continued
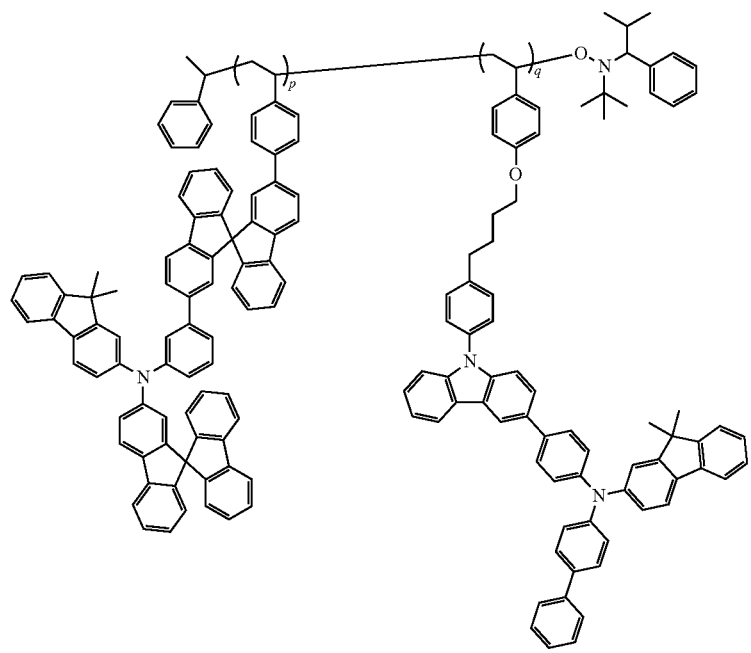
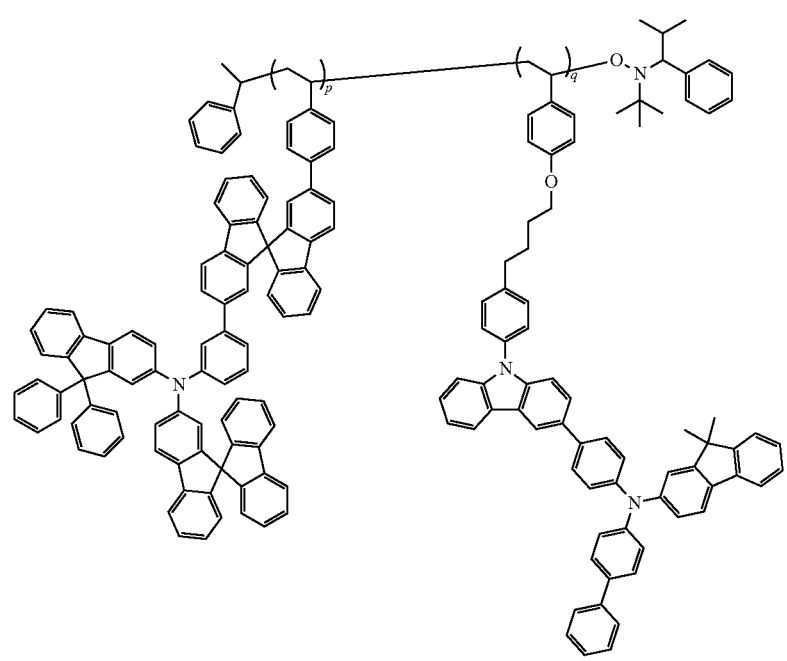

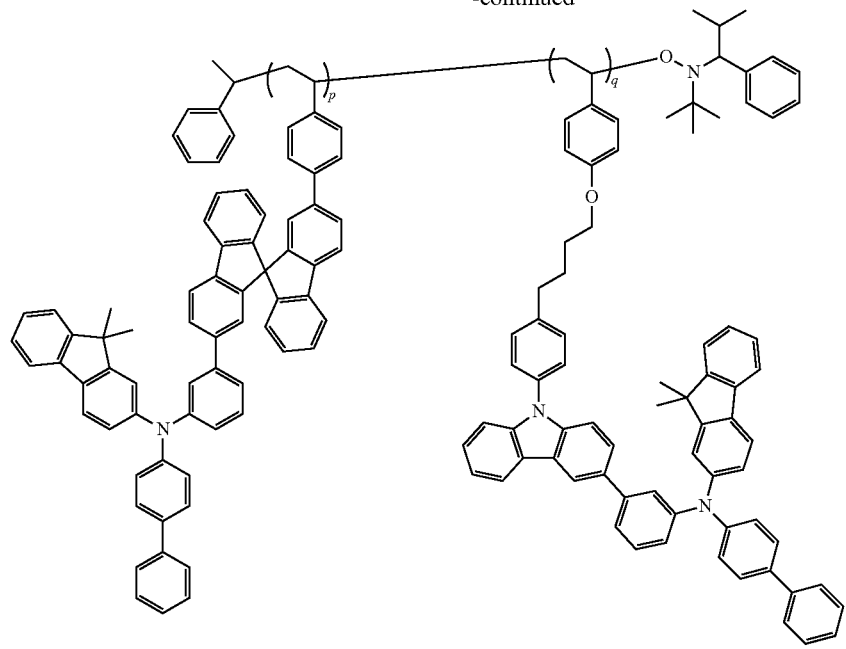
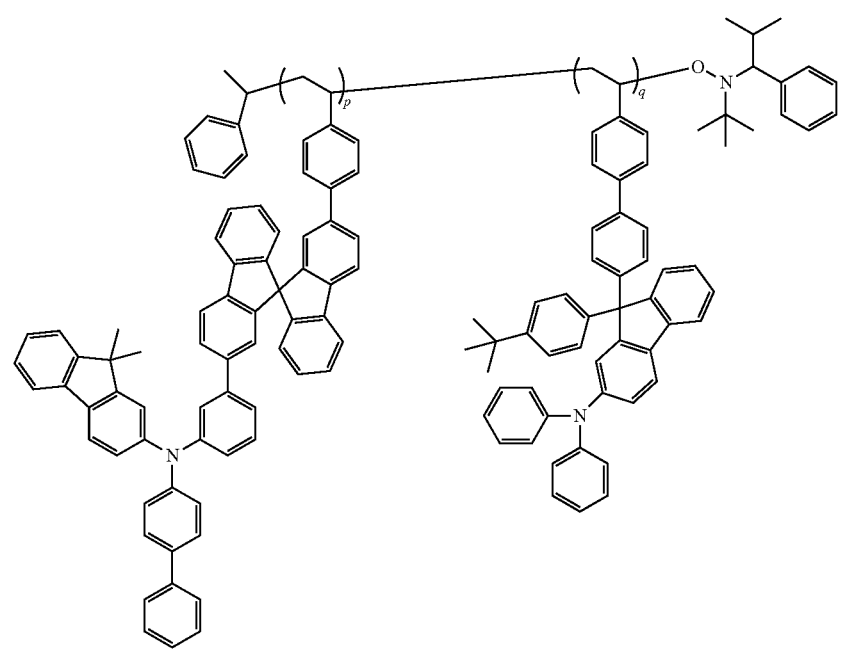

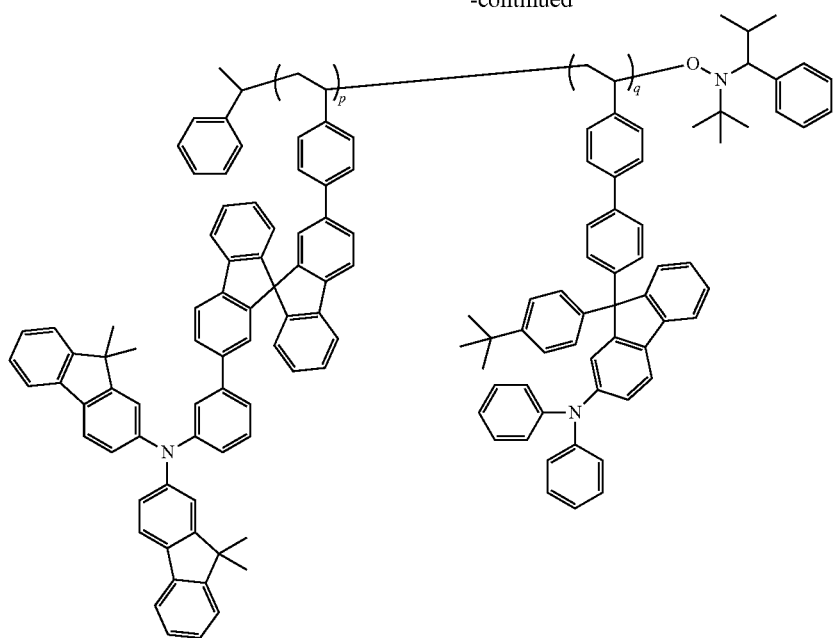
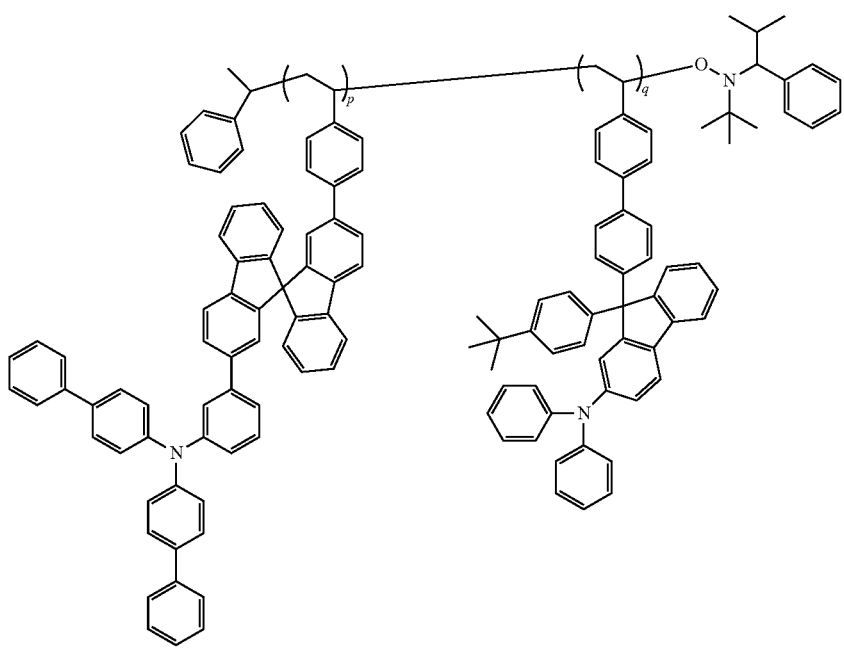

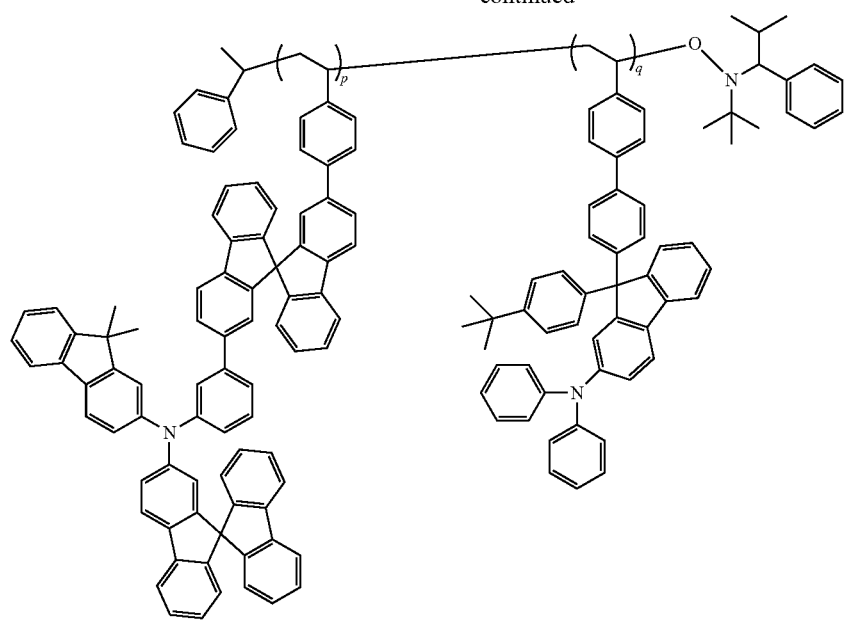
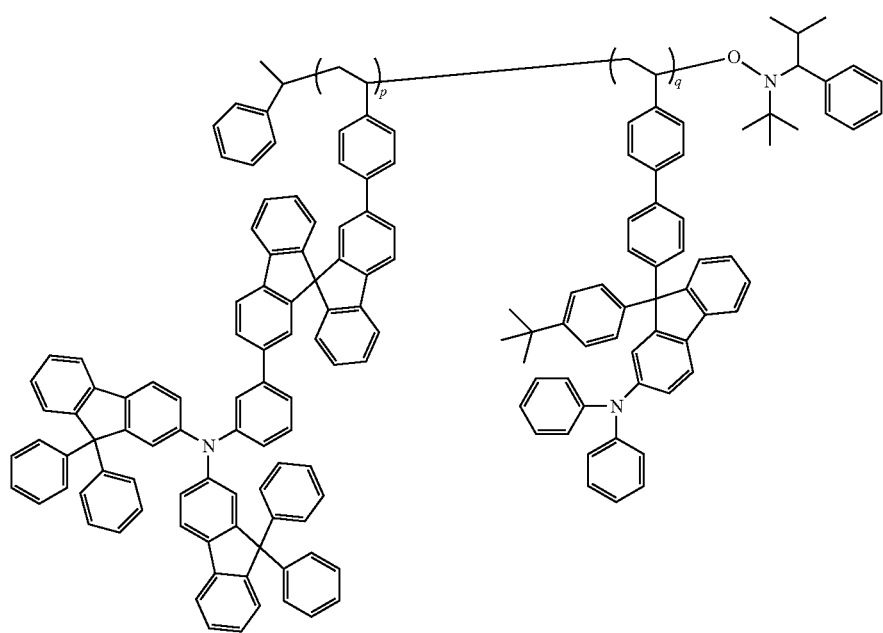

-continued
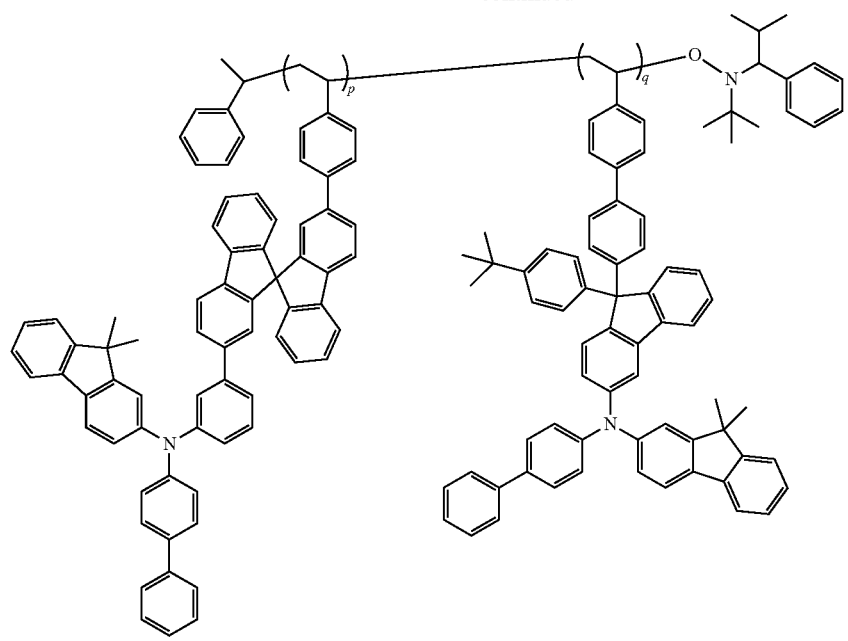
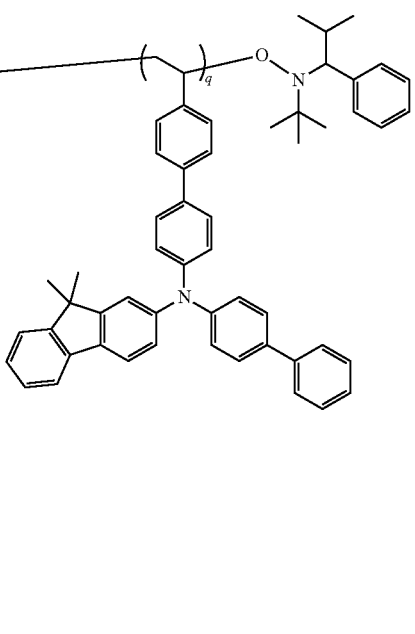

-continued
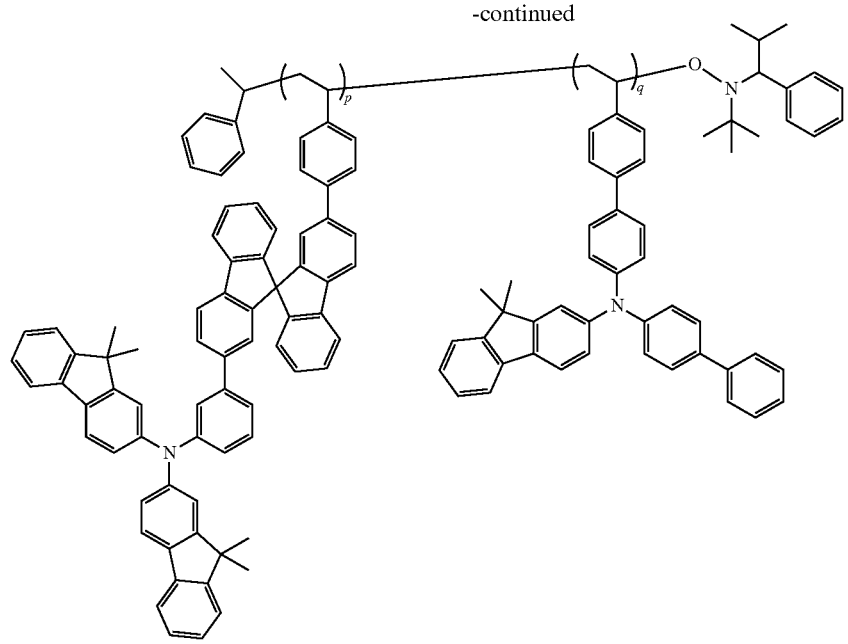
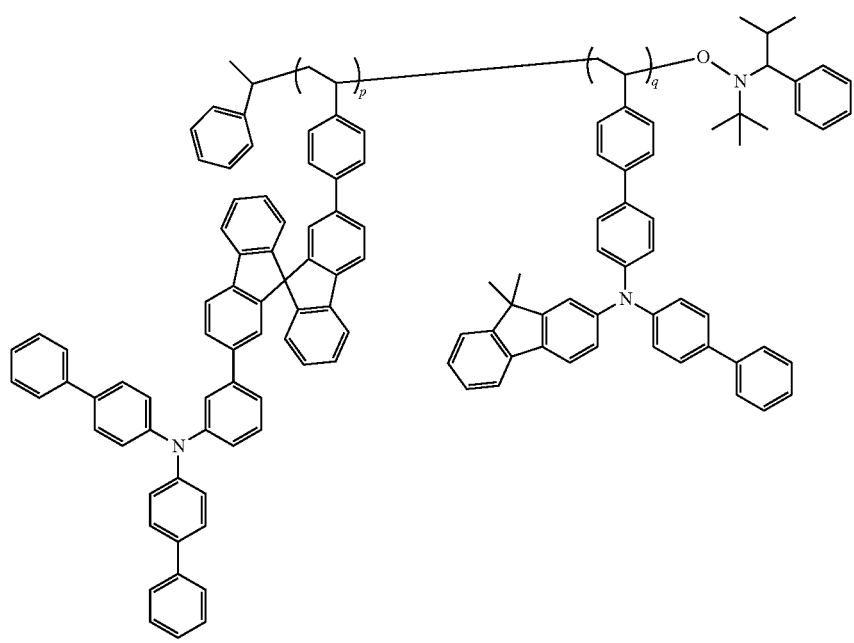

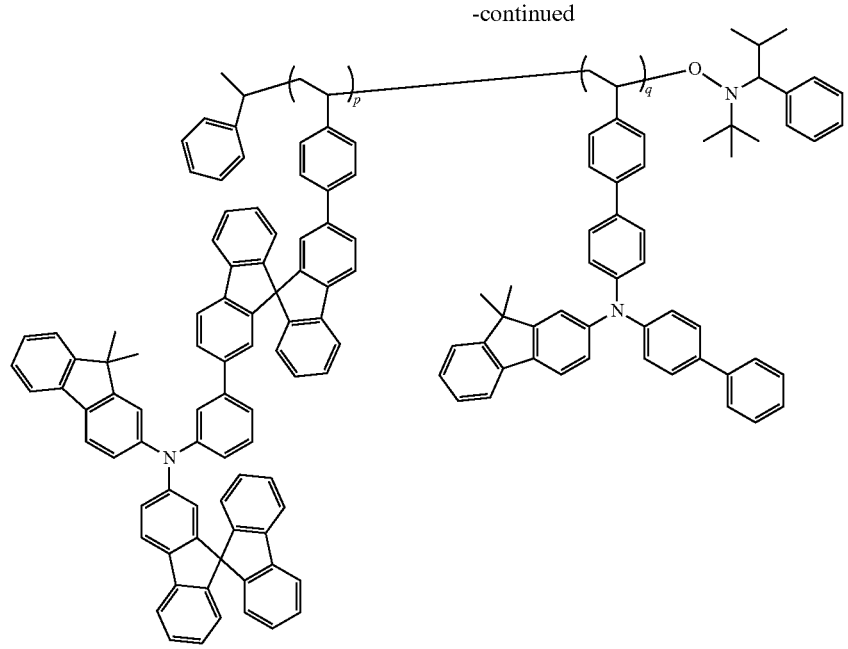
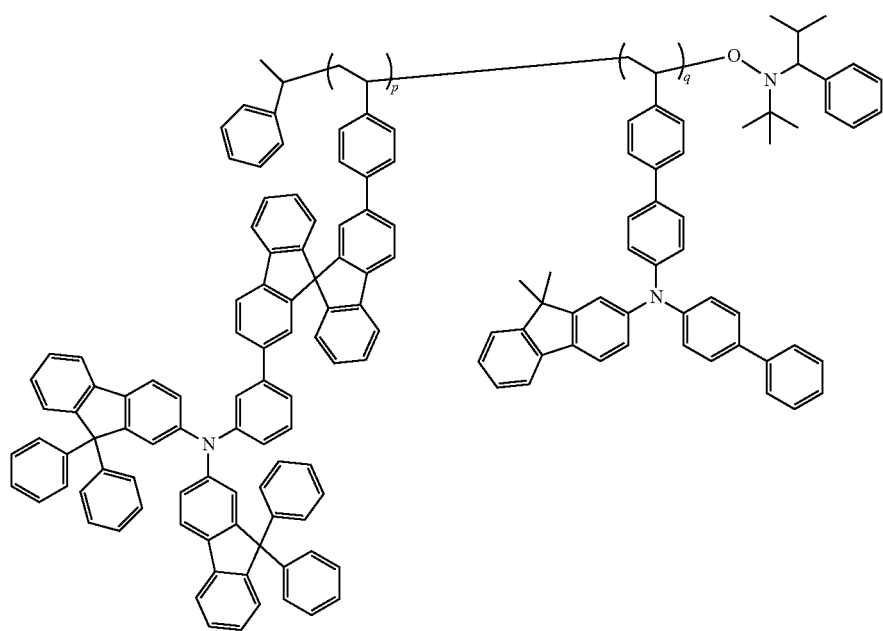

-continued
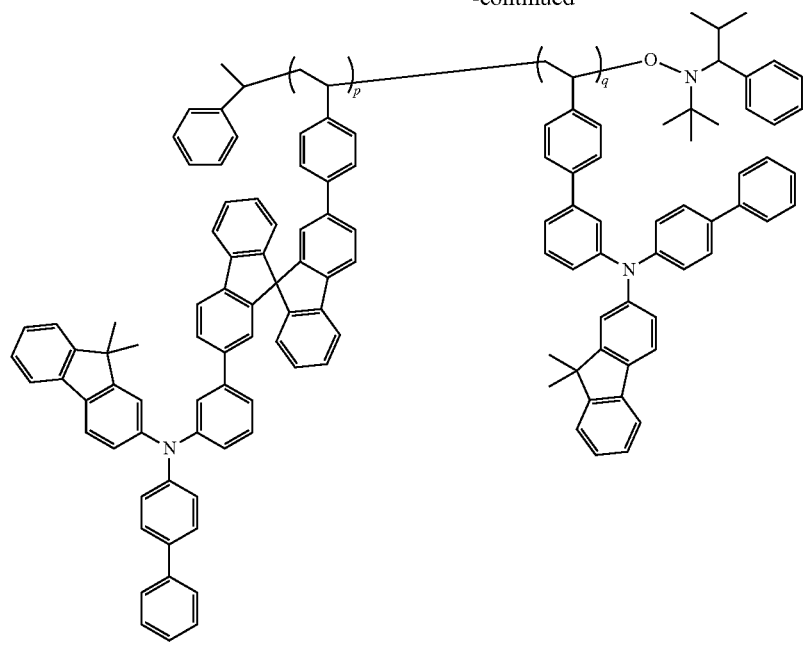
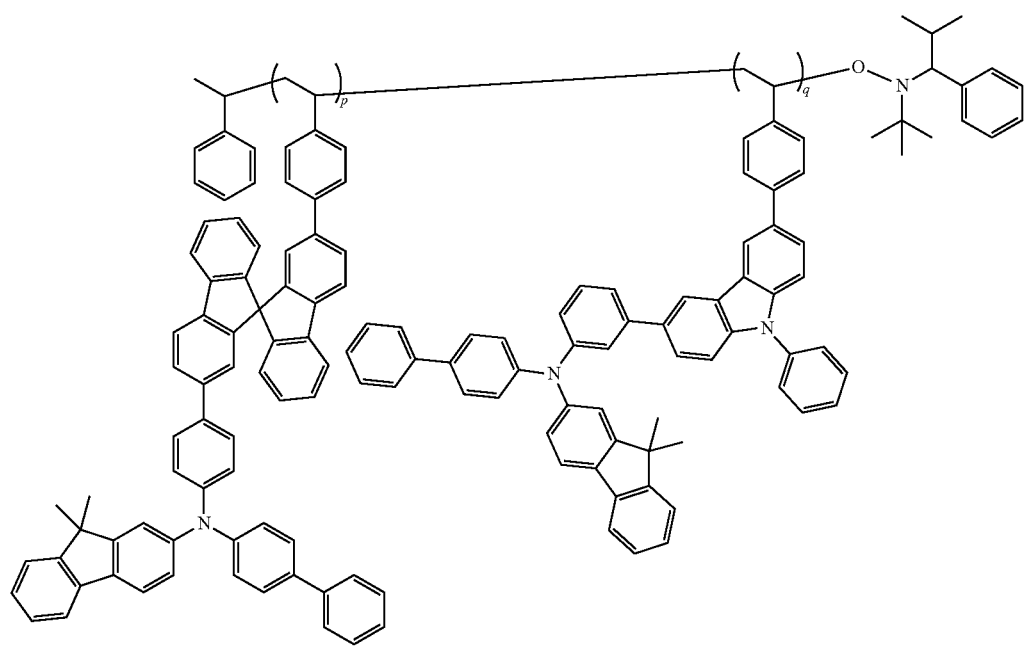

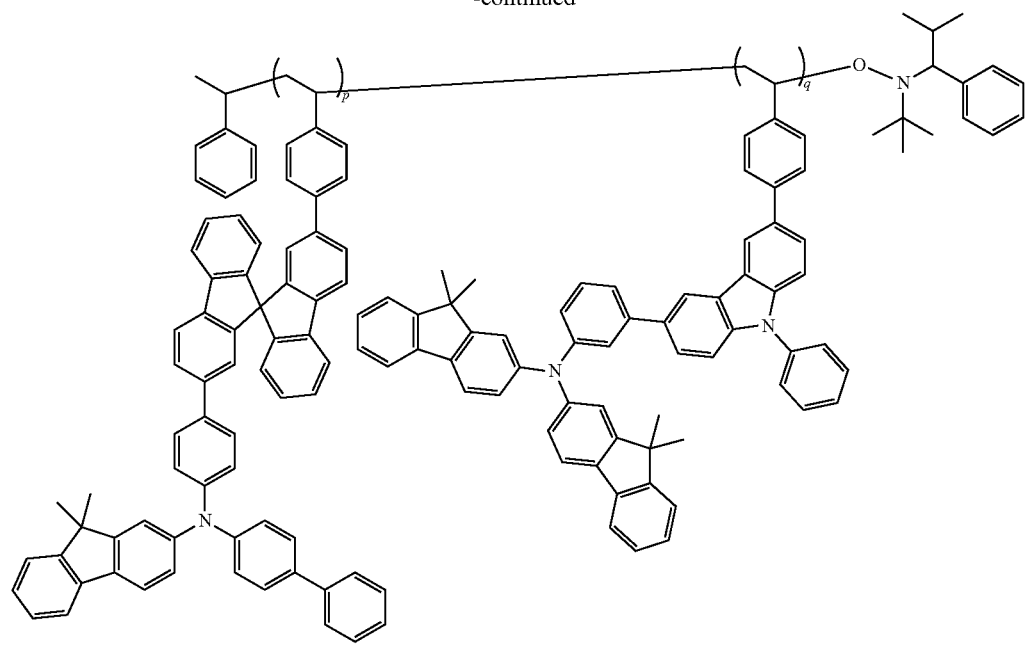
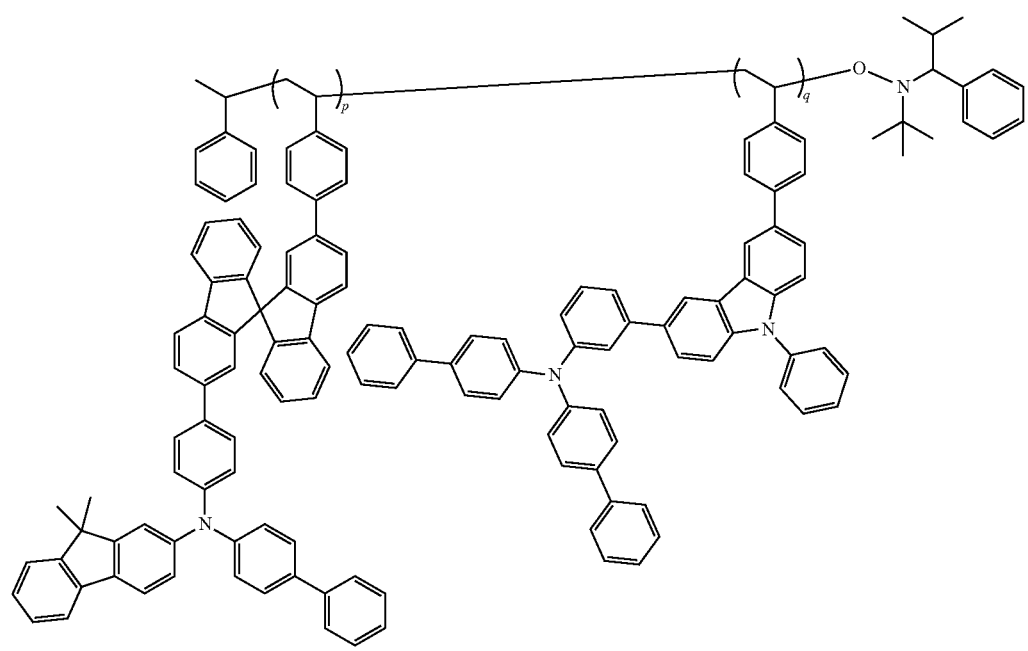

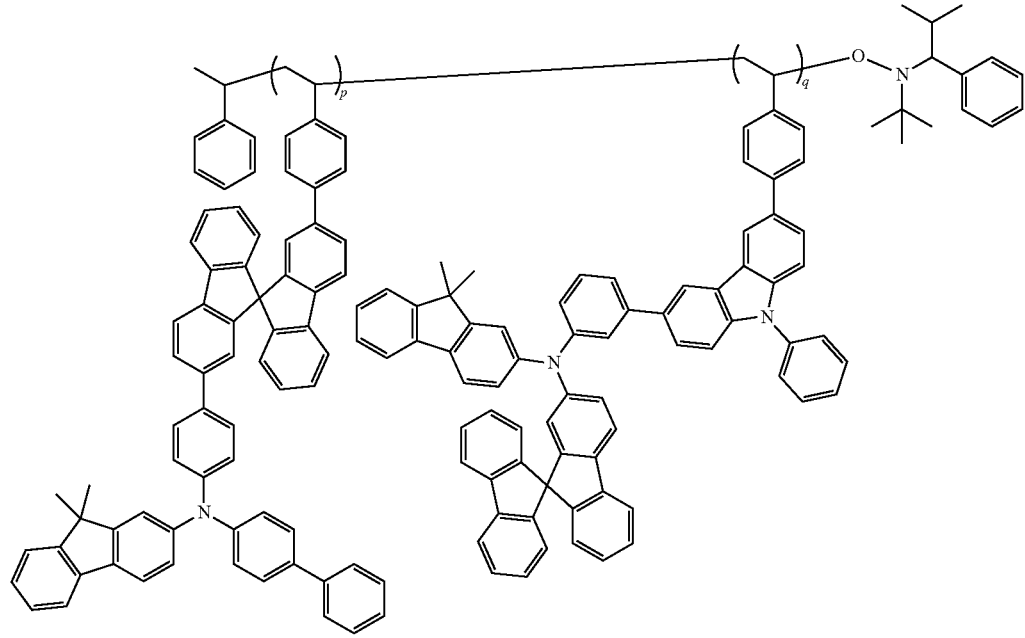
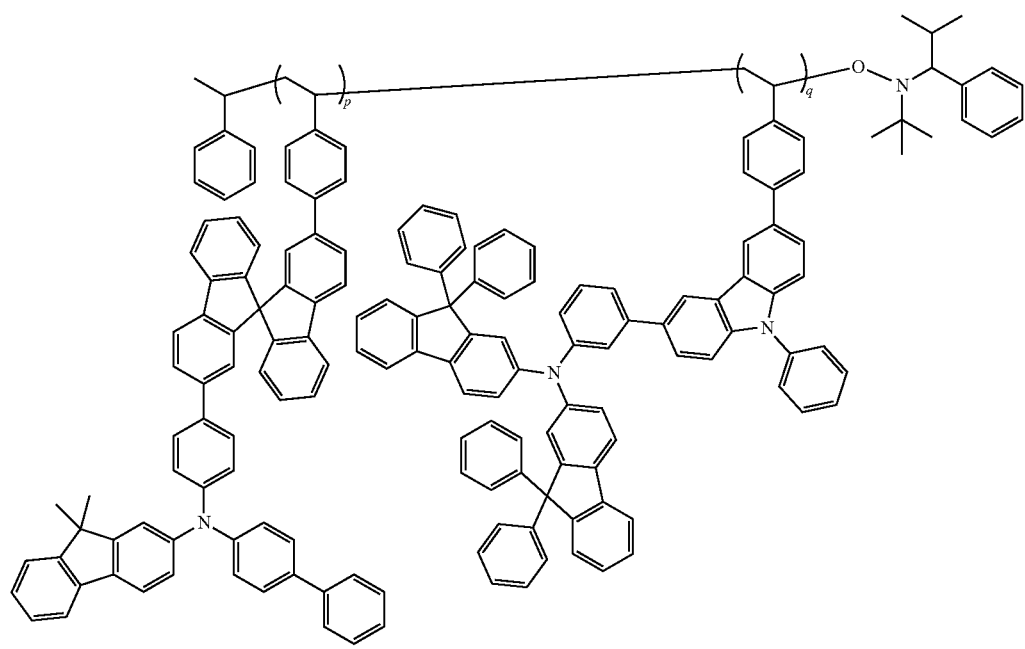

-continued
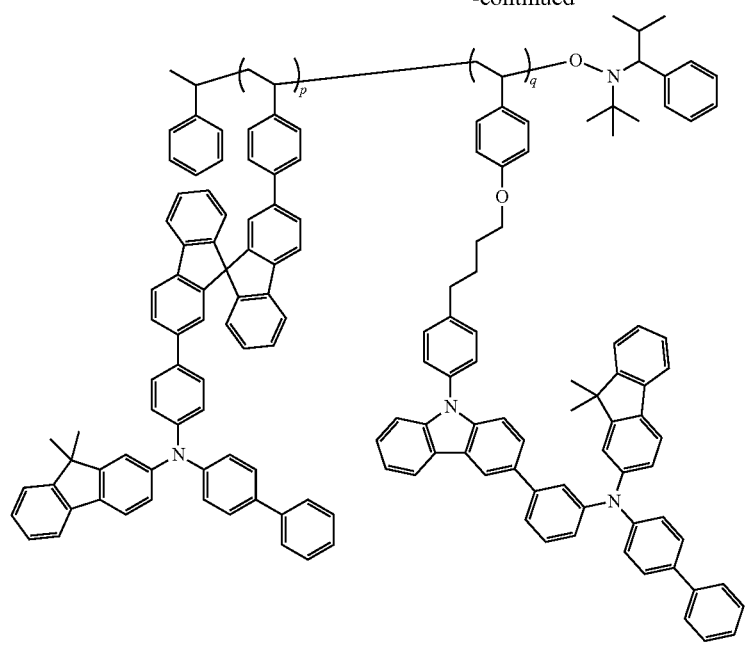
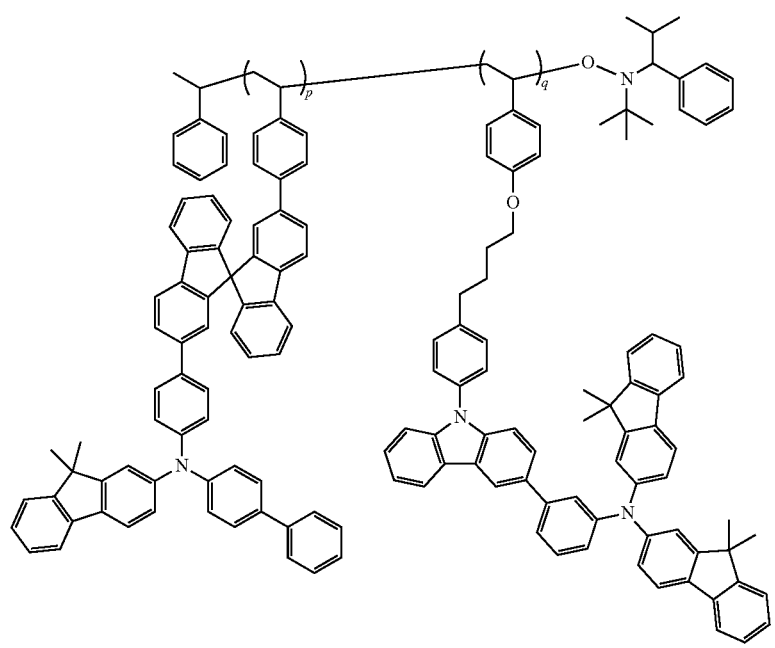

-continued
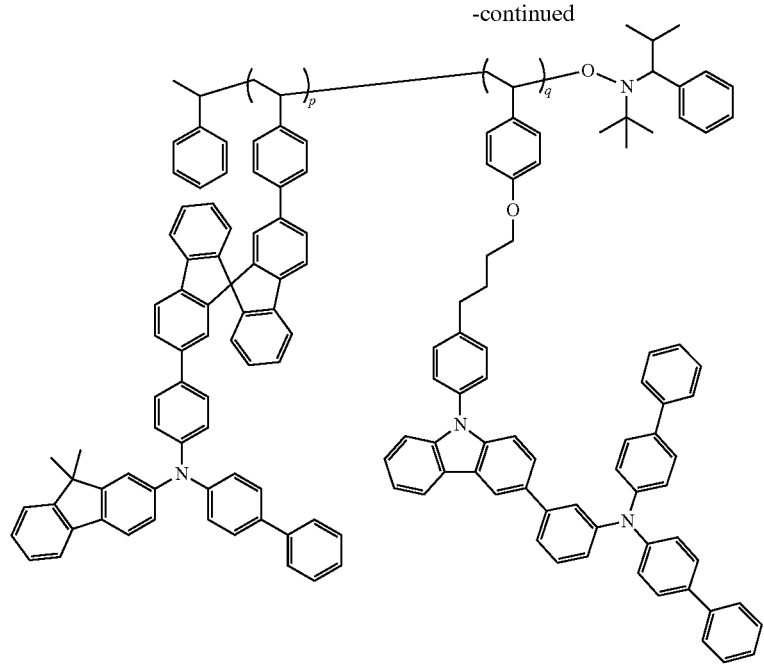
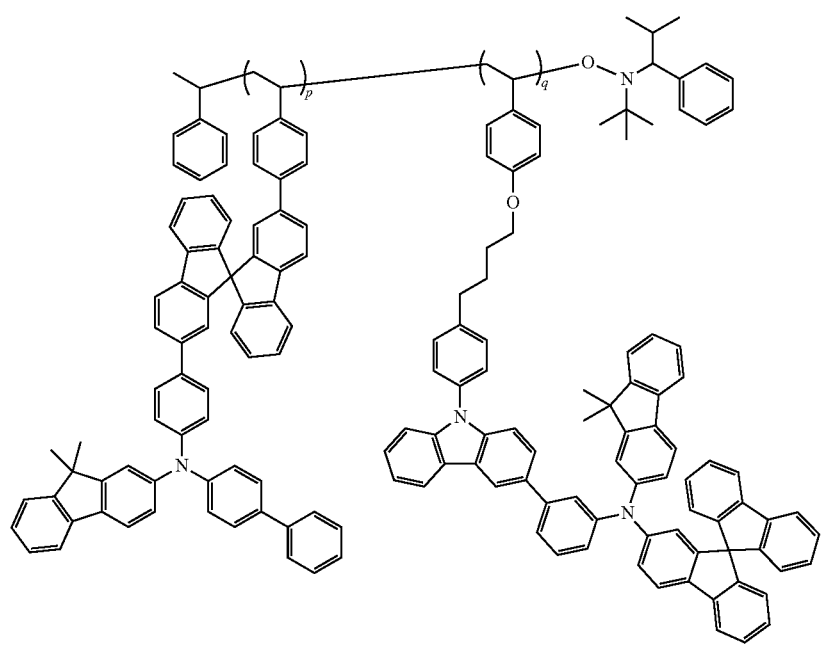

-continued
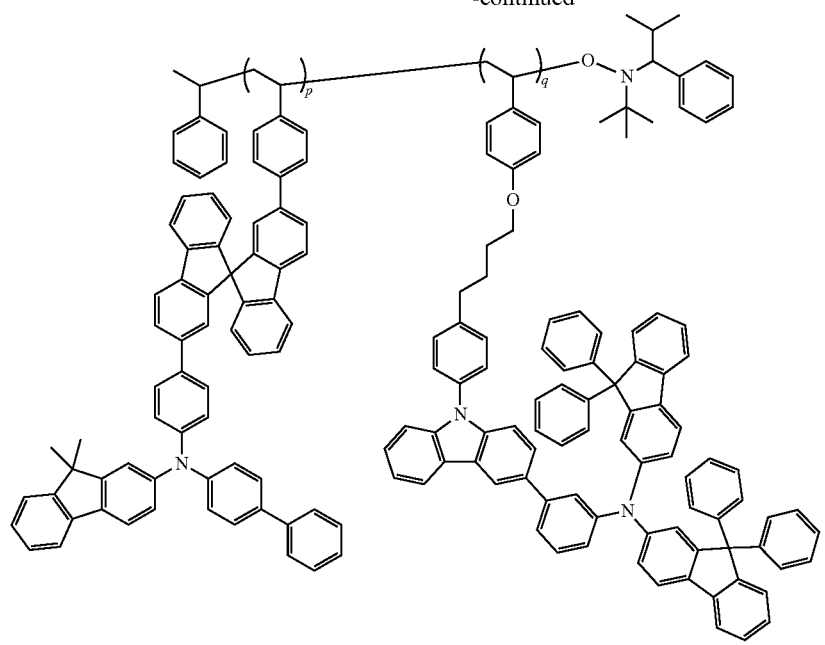
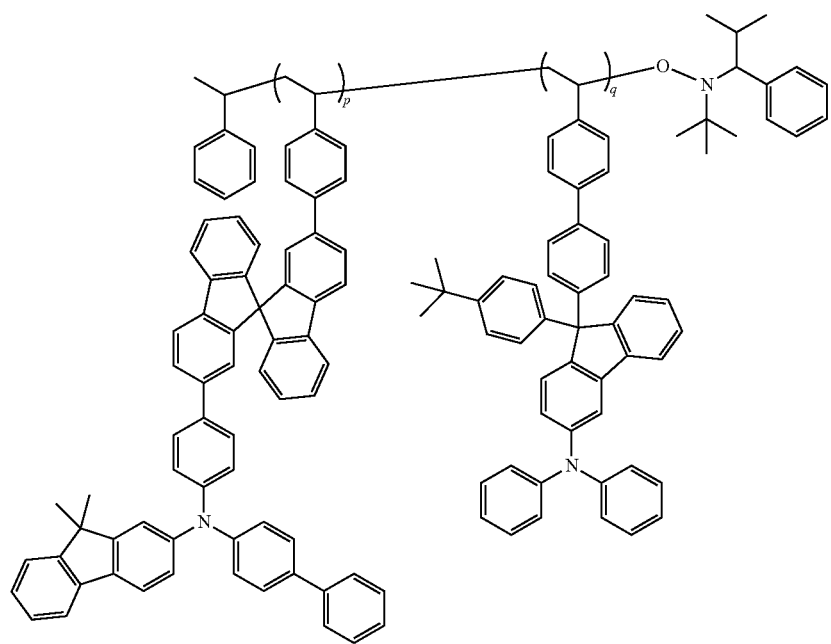

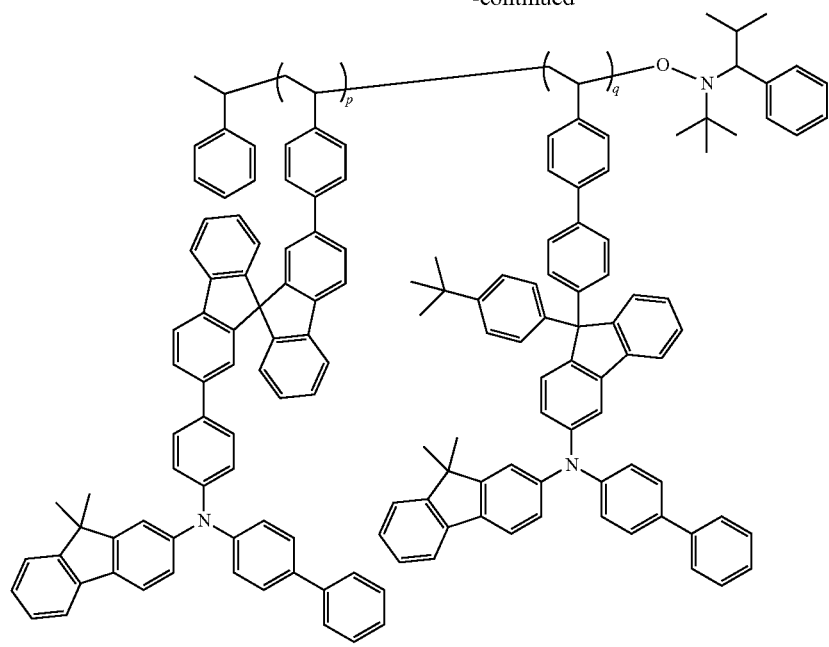
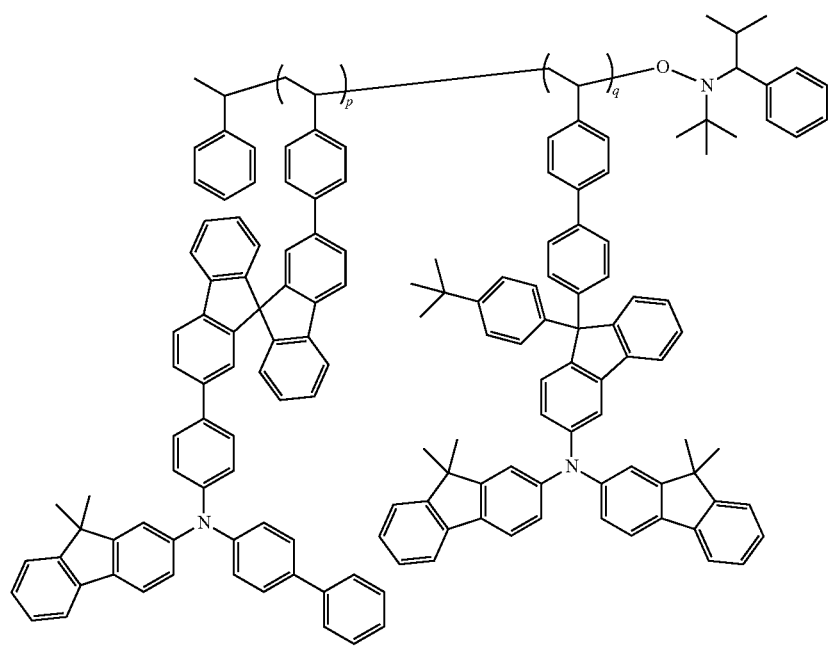

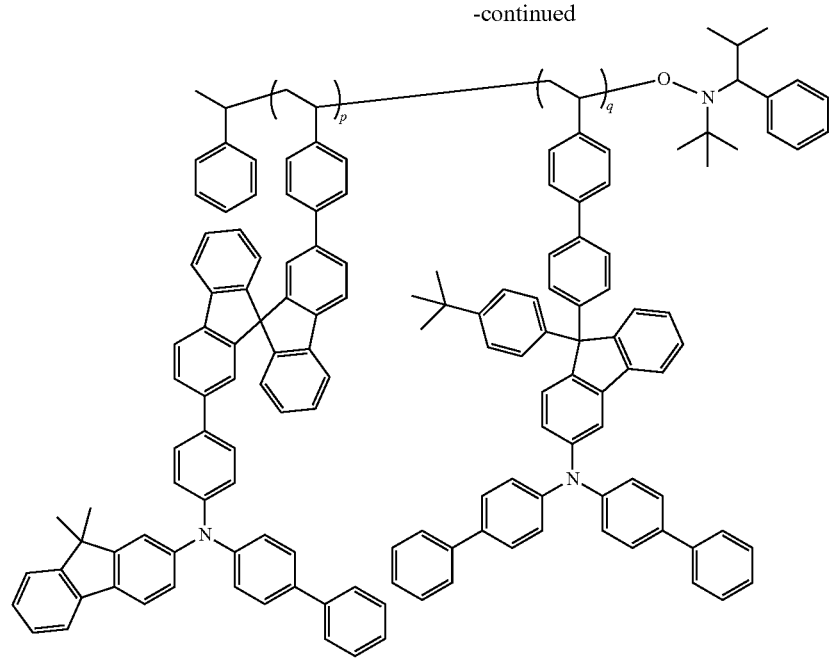
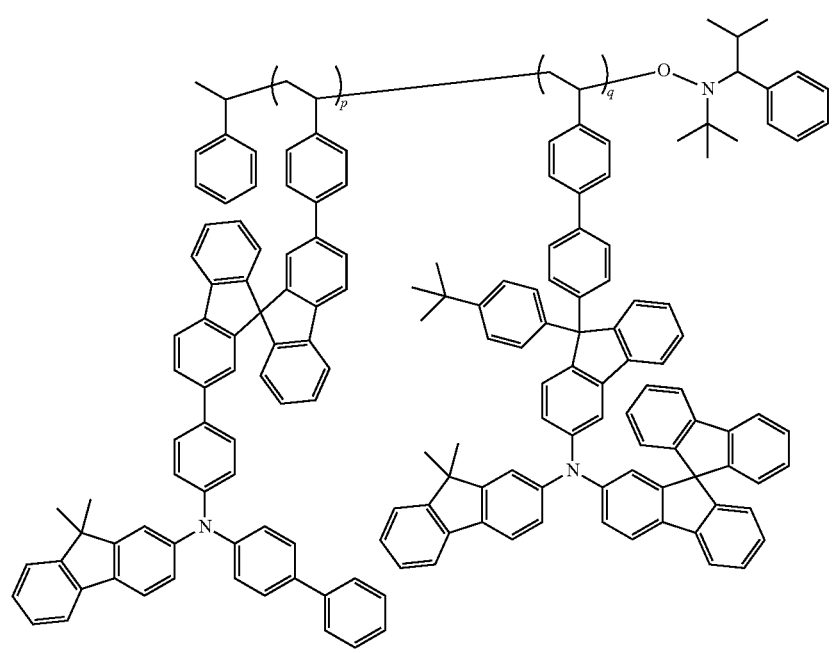

-continued
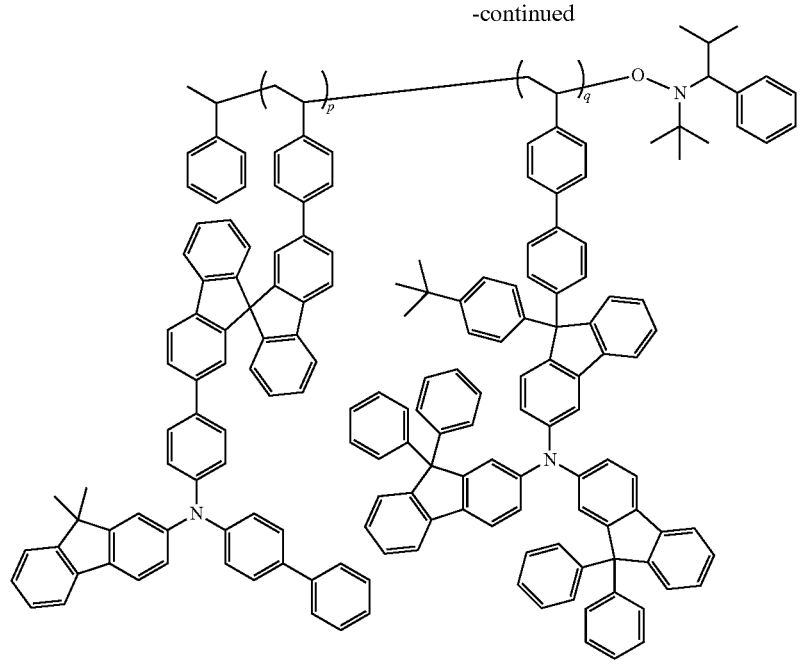
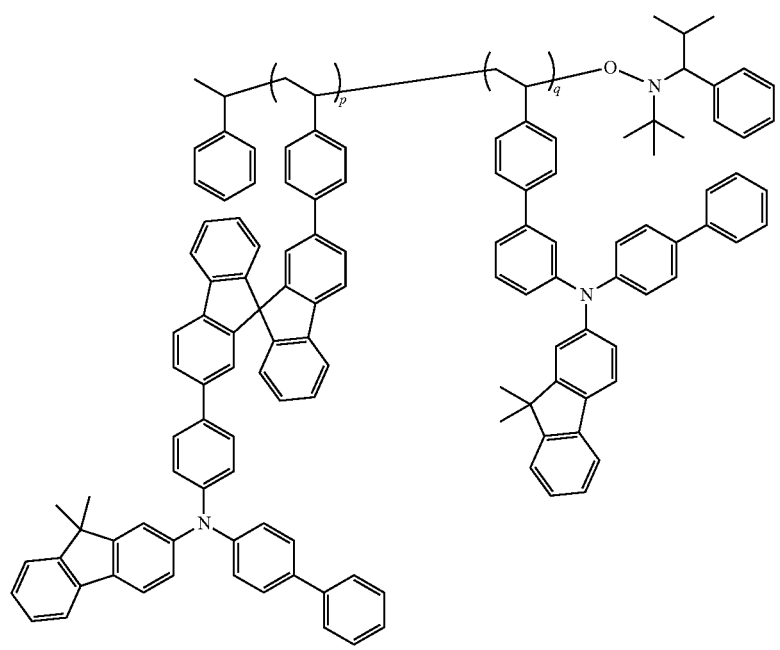

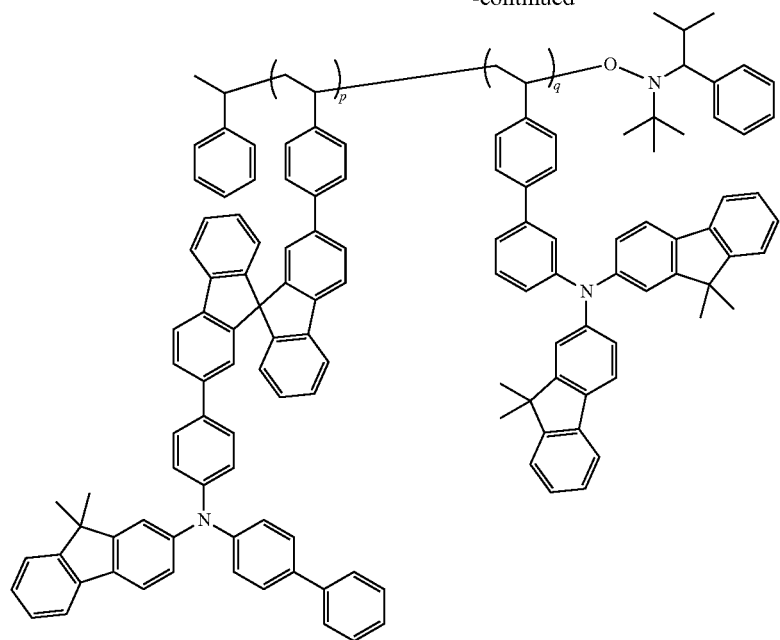
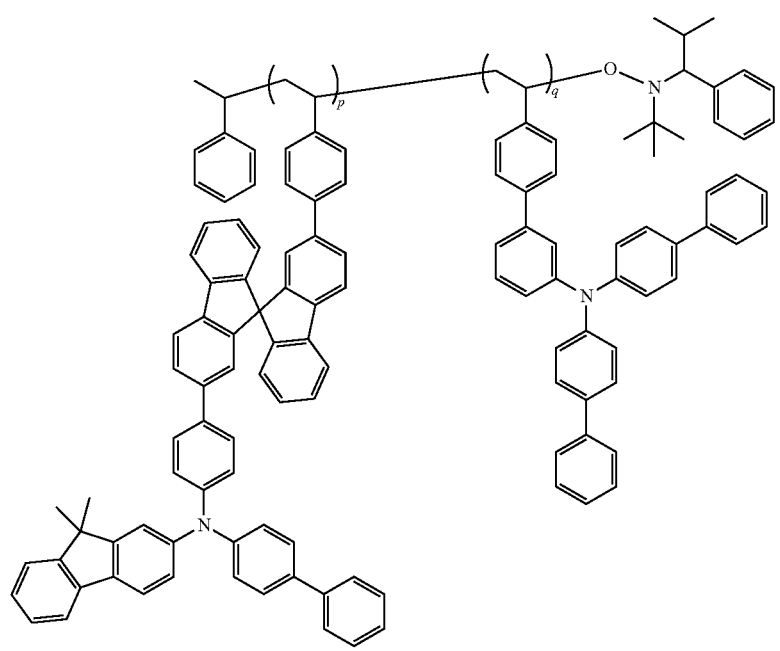

-continued

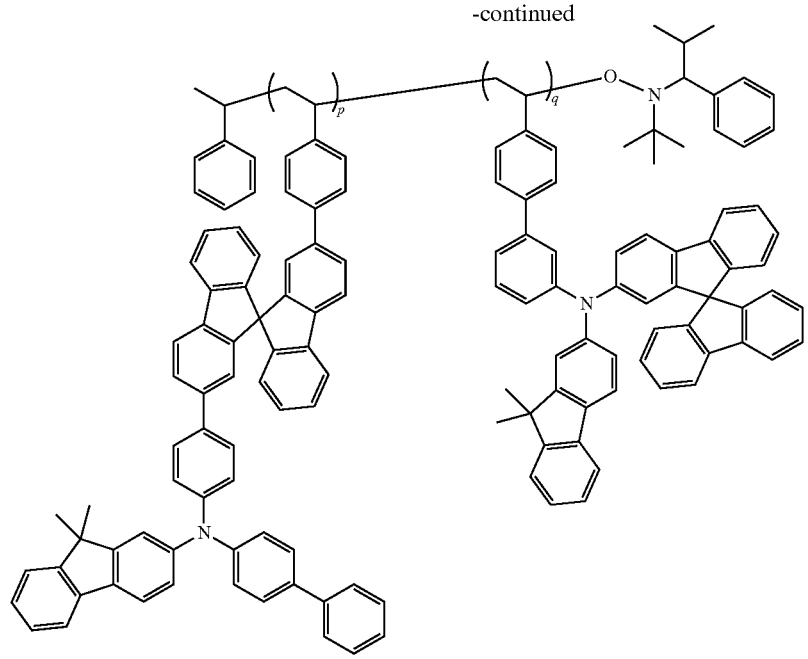

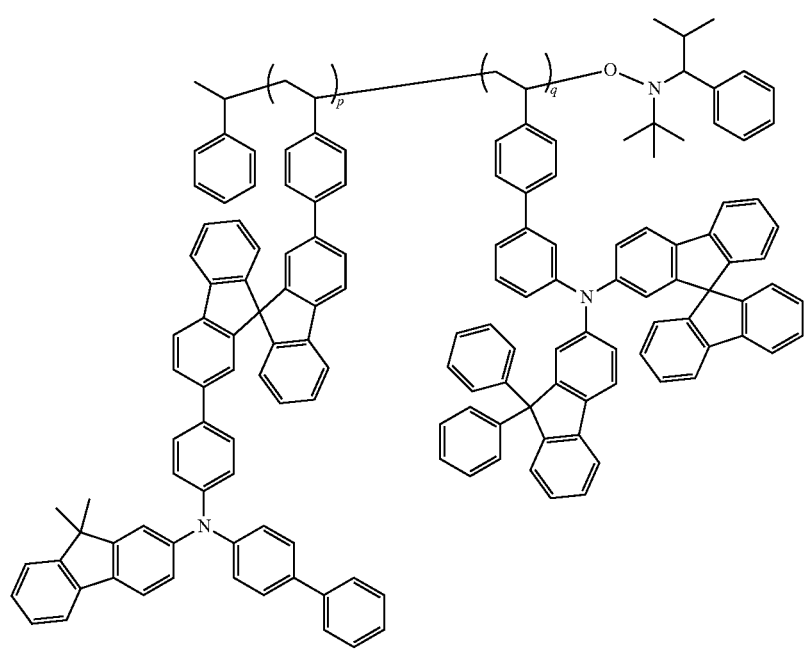

in the structures,
p is an integer from 1 to 100, and
q is an integer from 1 to 100.

7. The polymer of claim 1, wherein the polymer has a number average molecular weight of 5,000 g/mol to 100,000 g/mol.

8. The polymer of claim 1, wherein the polymer is a random polymer.

9. A coating composition comprising the polymer according to claim 1.

10. The coating composition of claim 9, further comprising a solvent.

11. A method for preparing the polymer according to claim 1, the method comprising:

dissolving a first monomer of the following Formula A, a second monomer of the following Formula B, and an initiator in a solvent, and then performing a living radical polymerization:

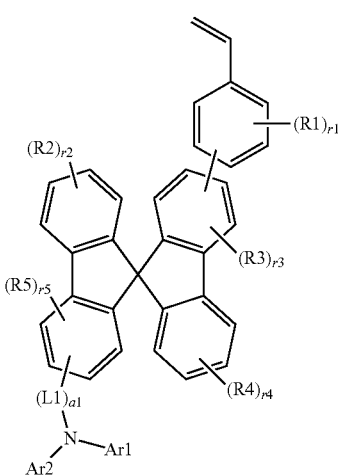

[Formula A]

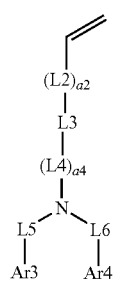

[Formula B]

in Formulae A and B,
L1, L2, and L4 to L6 are the same as or different from each other, and each independently a direct bond; —O—; a substituted or unsubstituted alkylene group; a substituted or unsubstituted arylene group; a substituted or unsubstituted divalent amine group; or a substituted or unsubstituted divalent heterocyclic group,
L3 is a substituted or unsubstituted divalent carbazole group; a substituted or unsubstituted divalent fluorenyl group; or a substituted or unsubstituted phenylene group,
a1, a2, and a3 are the same as or different from each other, and each independently an integer from 1 to 10,
when a1 is 2 or higher, each L1 is the same as or different from each other,
when a2 is 2 or higher, each L2 is the same as or different from each other,
when a3 is 2 or higher, each L4 is the same as or different from each other,
Ar1 to Ar4 are the same as or different from each other, and each independently a substituted or unsubstituted alkyl group; a substituted or unsubstituted alkoxy group; a substituted or unsubstituted aryloxy group; a substituted or unsubstituted aryl group; or a substituted or unsubstituted heterocyclic group,
R1 to R5 are the same as or different from each other, and each independently deuterium; a halogen group; a hydroxyl group; a cyano group; a substituted or unsubstituted alkyl group; a substituted or unsubstituted cycloalkyl group; a substituted or unsubstituted alkoxy group; a substituted or unsubstituted aryl group; or a substituted or unsubstituted heterocyclic group,
r1, r2, and r4 are the same as or different from each other, and each independently an integer from 1 to 4,
r3 and r5 are the same as or different from each other, and each independently an integer from 1 to 3,
when r1 is 2 or higher, each R1 is the same as or different from each other, and
when r2 is 2 or higher, each R2 is the same as or different from each other,
when r3 is 2 or higher, each R3 is the same as or different from each other,
when r4 is 2 or higher, each R4 is the same as or different from each other, and
when r5 is 2 or higher, each R5 is the same as or different from each other.

12. The method of claim 11, wherein the initiator is a compound of the following Compound C:

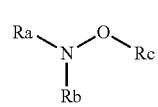

[Formula C]

in Formula C,
Ra to Rc are the same as or different from each other, and each independently a substituted or unsubstituted alkyl group; a substituted or unsubstituted cycloalkyl group; a substituted or unsubstituted aryl group; or a substituted or unsubstituted heterocyclic group.

13. An organic light emitting comprising:
a first electrode;
a second electrode provided to face the first electrode; and
an organic material layer having one or more layers provided between the first electrode and the second electrode,
wherein the one or more layers of the organic material layers comprise the compound of claim 1.

14. The organic light emitting device of claim 13, wherein the one or more layers of the organic material layer comprising the polymer is a hole transport layer, a hole injection layer, or a layer which transports and injects holes simultaneously.

15. A method for preparing an organic light emitting device, the method comprising:
preparing a first electrode;
forming an organic material layer comprising a hole transport layer on the first electrode; and
forming a second electrode on the organic material layer,
wherein the forming of the organic material layer comprises forming the hole transport layer using the coating composition of claim 9.

16. The polymer of claim 1, wherein the polymer has a terminal group represented by a formula of -ONY6Y7, and Y6 and Y7 are the same as or different from each other, and each independently hydrogen; a substituted or unsubstituted alkyl group; a substituted or unsubstituted aryl group; or a substituted or unsubstituted arylalkyl group.

17. The polymer of claim 1, further comprising a comonomer represented by the following Formula D,

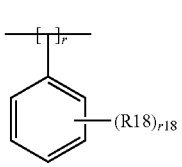

[Formula D]

in Formula D,
R18 is a substituted or unsubstituted aryl group.

* * * * *